(12) United States Patent
Nakamura

(10) Patent No.: US 7,055,932 B2
(45) Date of Patent: Jun. 6, 2006

(54) METHOD OF FILLING LIQUID INTO FUNCTION LIQUID DROPLET EJECTION HEAD, AND EJECTION APPARATUS; METHOD OF MANUFACTURING LCD DEVICE, ORGANIC EL DEVICE, ELECTRON EMISSION DEVICE, PDP DEVICE, ELECTROPHORETIC DISPLAY DEVICE, COLOR FILTER, AND ORGANIC EL; AND METHOD OF FORMING SPACER, METALLIC WIRING, LENS, RESIST, AND LIGHT DIFFUSION MEMBER

(75) Inventor: Shinichi Nakamura, Okaya (JP)

(73) Assignee: Seiko Epson Corporation, Tokyo (JP)

( * ) Notice: Subject to any disclaimer, the term of this patent is extended or adjusted under 35 U.S.C. 154(b) by 52 days.

(21) Appl. No.: 10/384,015

(22) Filed: Mar. 10, 2003

(65) Prior Publication Data

US 2003/0206210 A1 Nov. 6, 2003

(30) Foreign Application Priority Data

Mar. 19, 2002 (JP) .............................. 2002-076819

(51) Int. Cl.
*B41J 2/165* (2006.01)
(52) U.S. Cl. ....................................................... 347/30
(58) Field of Classification Search .................. 347/30, 347/29, 31, 36, 85, 86, 23–24, 82
See application file for complete search history.

(56) References Cited

U.S. PATENT DOCUMENTS 5,126,766 A * 6/1992 Terasawa et al. ............. 347/30

| 6,481,824 | B1 | 11/2002 | Hayakawa et al. |
| 6,494,560 | B1 | 12/2002 | Seshimo et al. |
| 6,501,527 | B1 | 12/2002 | Hirose et al. |
| 6,547,617 | B1 | 4/2003 | Kawamura et al. |
| 6,612,683 | B1 * | 9/2003 | Takahashi et al. ............. 347/30 |
| 6,793,317 | B1 * | 9/2004 | Shima .......................... 347/29 |
| 6,857,924 | B1 | 2/2005 | Fu et al. |
| 2002/0130918 | A1 | 9/2002 | Hayakawa et al. |
| 2003/0148694 | A1 | 8/2003 | Ghiam |

FOREIGN PATENT DOCUMENTS

| JP | 55146766 A | * 11/1980 |
| JP | A 03-132357 | 6/1991 |
| JP | A 04-308762 | 10/1992 |

(Continued)

*Primary Examiner*—K. Feggins
(74) *Attorney, Agent, or Firm*—Oliff & Berridge, PLC

(57) ABSTRACT

An ejection apparatus has a carriage which moves relative to a workpiece. A function liquid droplet ejection head is held by the carriage and is provided with an ejection nozzle formed in a nozzle forming surface of a head main body. A liquid supply tank is connected to the ejection head. A cap unit is disposed in a position away from the workpiece and is provided, in a position corresponding to the function liquid droplet ejection head, with a cap which is connected to the suction pump and which is brought into intimate contact with the nozzle forming surface of the function liquid droplet ejection head so that the liquid of the liquid supply tank is filled into a flow passage inside the ejection head by a suction force to be operated upon through the cap. A gate valve is interposed in the liquid supply passage between the ejection head and the liquid supply tank. The gate valve is temporarily closed in the course of filling the liquid into the flow passage inside the ejection head, while maintaining suction by the cap.

5 Claims, 65 Drawing Sheets

| | FOREIGN PATENT DOCUMENTS | | |
|---|---|---|---|
| JP | A 11-248927 | 9/1999 | |
| JP | A 11-348310 | 12/1999 | |
| JP | A 2000-015842 | 1/2000 | |
| JP | A 2000-075121 | 3/2000 | |
| JP | A 2000-141707 | 5/2000 | |
| JP | A 2001-038893 | 2/2001 | |
| JP | A 2001-117104 | 4/2001 | |
| JP | A 2001-188117 | 7/2001 | |
| JP | A 2002-022924 | 1/2002 | |
| JP | A 2002-056776 | 2/2002 | |

\* cited by examiner

F I G. 1
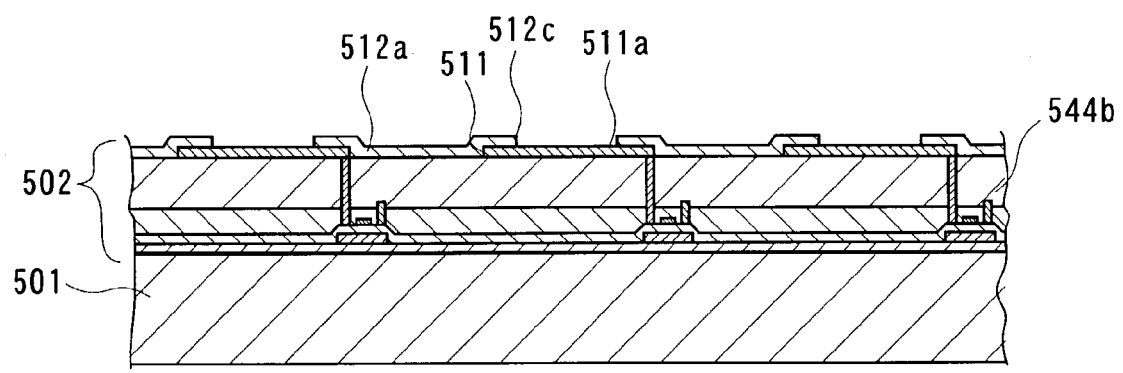

F I G. 4
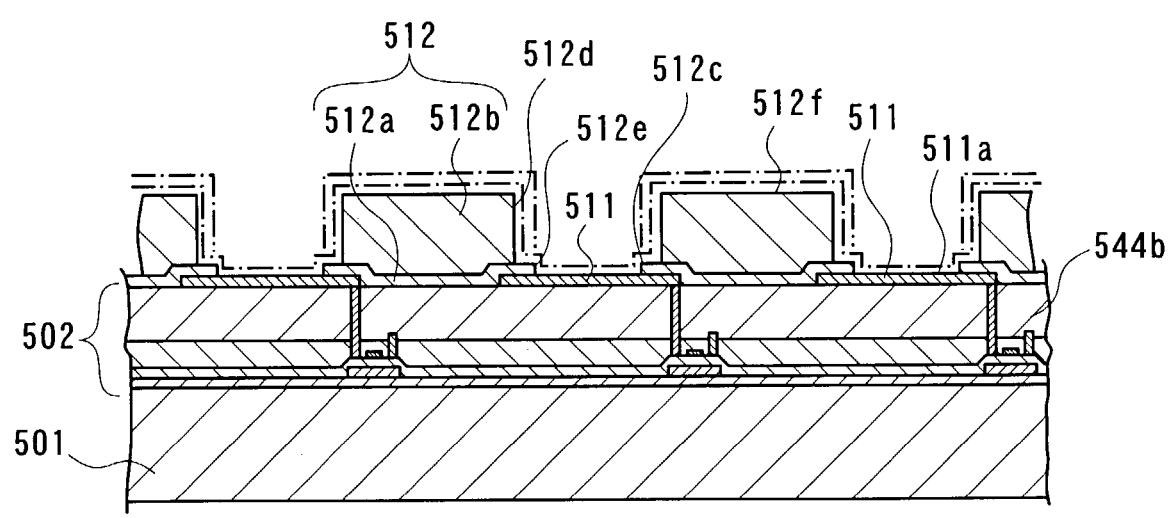

F I G. 1 7
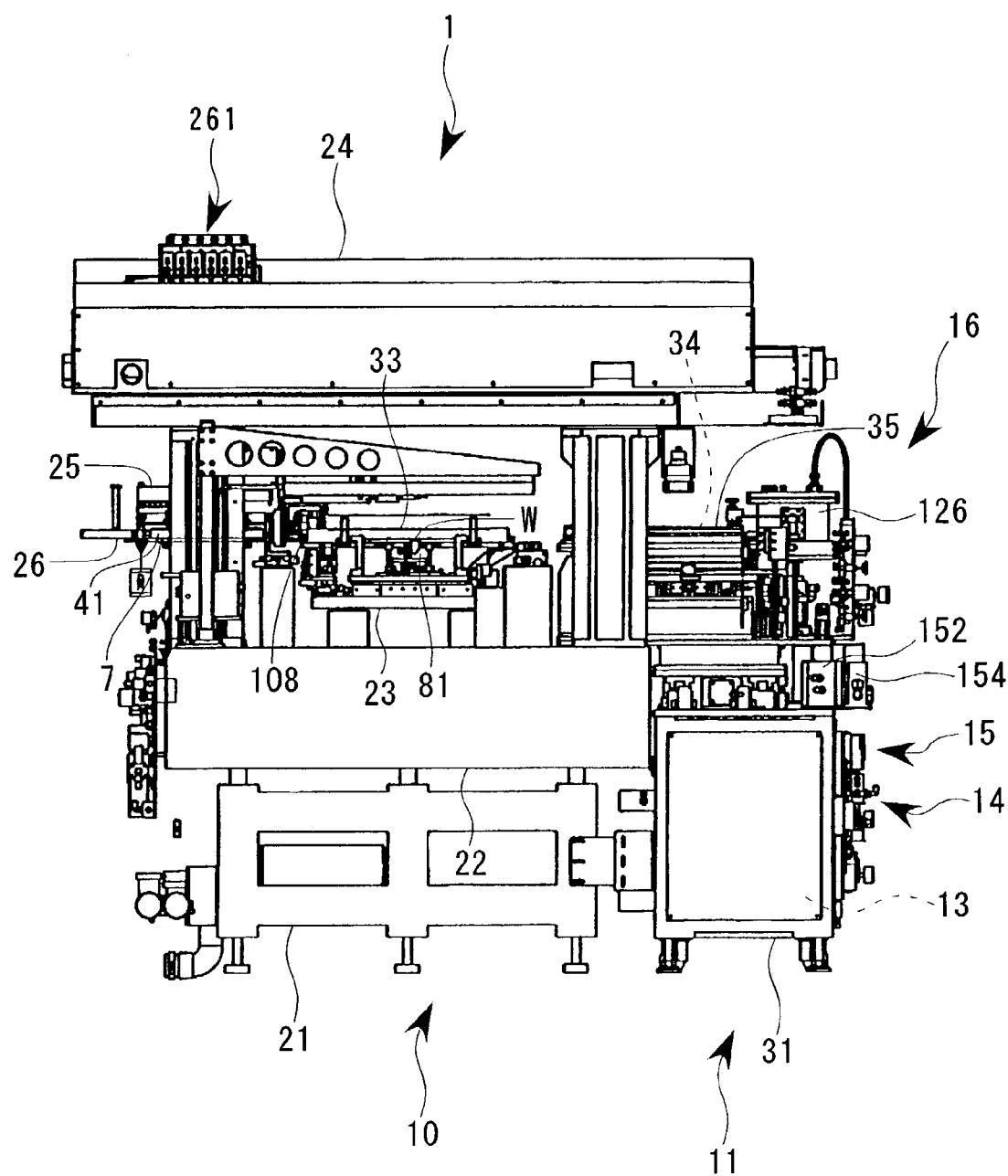

F I G. 2 6
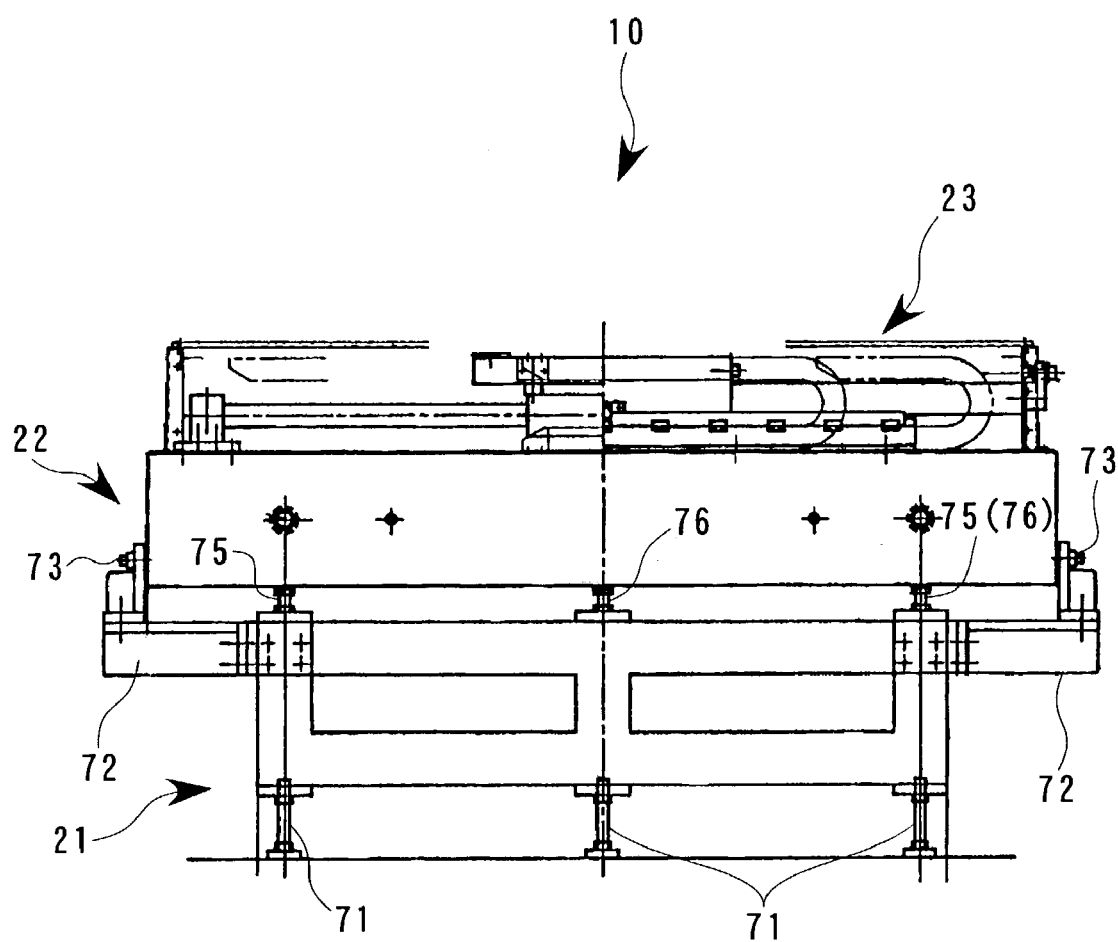

FORWARD MOVEMENT →
BACKWARD MOVEMENT ←   X-AXIS DIRECTION

F I G. 4 8
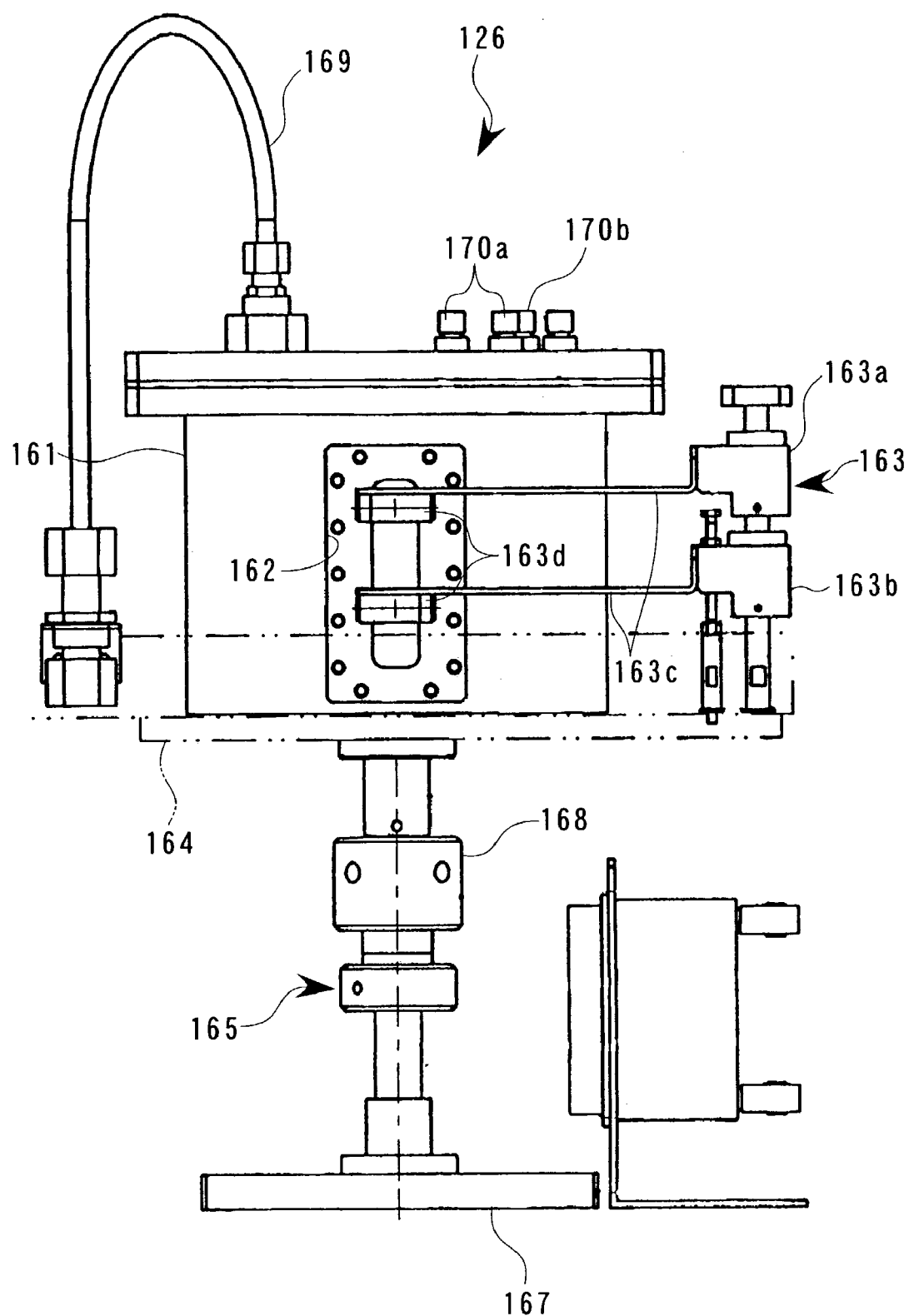

X-AXIS DIRECTION

METHOD OF FILLING LIQUID INTO FUNCTION LIQUID DROPLET EJECTION HEAD, AND EJECTION APPARATUS; METHOD OF MANUFACTURING LCD DEVICE, ORGANIC EL DEVICE, ELECTRON EMISSION DEVICE, PDP DEVICE, ELECTROPHORETIC DISPLAY DEVICE, COLOR FILTER, AND ORGANIC EL; AND METHOD OF FORMING SPACER, METALLIC WIRING, LENS, RESIST, AND LIGHT DIFFUSION MEMBER

BACKGROUND OF THE INVENTION

1. Field of the Invention

This invention relates to a method of filling a liquid into a flow passage inside a function liquid droplet ejection head, in which a liquid is filled into the flow passage inside the function liquid droplet ejection head as represented by an ink jet head. It also relates to an ejection apparatus using a function liquid droplet ejection apparatus which is capable of being filled with the liquid in the above-described method; and to a method of manufacturing a liquid crystal display (LCD) device, a method of manufacturing an organic electroluminescence (EL) device, a method of manufacturing an electron emission device, a method of manufacturing a plasma display panel (PDP) device, a method of manufacturing an electrophoretic display device, and a method of manufacturing a color filter, a method of manufacturing an organic EL; as well as to a method of forming a spacer, a method of forming a metallic wiring, a method of forming a lens, a method of forming a resist, and a method of forming a light diffusion body.

2. Description of Related Art

An ink jet head of an ink jet printer (a liquid droplet ejection head) is capable of ejecting very minute ink droplets (liquid droplets) in the form of dots at a high accuracy. Therefore, it is expected to apply the liquid droplet ejection head to the field of manufacturing various kinds of parts by using, as the liquid to be ejected, function liquids such as special inks, photosensitive resins, or the like.

For example, it is considered to carry out the following operations. Namely, an ejection apparatus equipped with a main carriage which moves relative to the workpiece such as a substrate of a color filter, or the like, is used. A head unit having mounted a plurality of function liquid droplet ejection heads on a subsidiary carriage which is detachably held by a main carriage of the ejection apparatus, is carried into the ejection apparatus. By the movement of the main carriage in this state, the head unit is relatively moved against the workpiece to thereby eject the liquid droplet from each of the ejection nozzles formed in a nozzle forming surface of each of the function liquid droplet ejection heads. The liquid crystal display device, organic EL display device, or the like, is thus manufactured.

This kind of ejection apparatus has the following arrangement. Namely, a liquid is supplied from a common tank to each of the function liquid droplet ejection heads by a slight (or small) head pressure so that the liquid droplet can be ejected at a higher accuracy by the operation of a pump part which is assembled into the liquid droplet ejection head. In a position which is away from the workpiece of the ejection apparatus, there is disposed a cap unit on which a plurality of caps to be connected to a suction pump are mounted so as to correspond to the plurality of function liquid droplet ejection heads of the head unit. When a new head unit has been carried into the ejection apparatus, each of the caps is brought into intimate contact with the nozzle forming surface of each of the function liquid droplet ejection heads in a state in which the head unit has been moved to a position facing the cap unit. The liquid inside the liquid supply tank is filled into the flow passage inside each of the function liquid droplet ejection heads by means of the suction force to be operated upon through each of the caps.

As described above, even if the suction is carried out by the caps, the flow speed of the liquid inside the flow passage inside the function liquid droplet ejection head lowers or drops. As a result, the air bubbles cannot be successfully removed out of the flow passage inside the function liquid droplet ejection head, thereby causing the poor ejection or failure in ejection of the liquid droplet under the influence of the remaining air bubbles. As a consequence, it becomes necessary to repeat the suction operations several times, resulting in the amount of liquid to be consumed at the time of filling, thereby causing a higher running cost.

In view of the above points, this invention provides a method of filling a liquid into a flow passage inside a function liquid droplet ejection head, in which air bubbles can be efficiently removed out of the flow passage inside the function liquid droplet ejection head. It also provides an ejection apparatus which is suitable for carrying out the above-described method, and a method of manufacturing an LCD device, a method of manufacturing an organic EL device, a method of manufacturing an electron emission device, a method of manufacturing a PDP device, a method of manufacturing an electrophoretic display device, a method of manufacturing a color filter, a method of manufacturing an organic EL, as well as a method of forming a spacer, a method of forming a metallic wiring, a method of forming a lens, a method of forming a resist, and a method of forming a light diffusion body.

SUMMARY OF THE INVENTION

According to one aspect of this invention, there is provided a method of filling a liquid into a flow passage inside a function liquid droplet ejection head having an ejection nozzle formed in a nozzle forming surface of a head main body. The method comprises: bringing a cap connected to a suction pump into intimate contact with the nozzle forming surface; and filling a liquid of a liquid supply tank connected to the function liquid ejection head into the flow passage inside the function liquid droplet ejection head. A liquid supply passage between the function liquid droplet ejection head and the liquid supply tank is temporarily closed in a course of filling the liquid into the flow passage inside the function liquid droplet ejection head while maintaining suction by the cap.

According to another aspect of this invention, there is provided an ejection apparatus having: a carriage which moves relative to a workpiece; a function liquid droplet ejection head which is held by the carriage and which is provided with an ejection nozzle formed in a nozzle forming surface of a head main body, the function liquid droplet ejection head ejecting droplets from the ejection nozzle to the workpiece while carrying out a relative movement between the carriage and the workpiece; a liquid supply tank which is connected to the function liquid droplet ejection head; a cap unit which is disposed in a position away from the workpiece and which is provided, in a position corresponding to the function liquid droplet ejection head, with a cap which is connected to a suction pump and is brought into intimate contact with the nozzle forming surface of the function liquid droplet ejection head, in a state in which the carriage is moved to a position facing the cap unit, so that the liquid of the liquid supply tank is filled into a flow passage inside the function liquid droplet ejection head by a suction force to be operated upon through the cap. The apparatus comprises: a gate valve interposed in the liquid supply passage between the function liquid droplet ejection head and the liquid supply tank, and the gate valve is temporarily closed in a course of filling the liquid into the flow passage inside the function liquid droplet ejection head while maintaining suction by the cap.

According to the above-described arrangement, at the time of closing the liquid supply passage (at the time of closing the gate valve), the flow passage inside the function droplet ejection head is reduced in pressure. As a result of subsequent opening of the liquid supply passage (at the time of opening the gate valve), the liquid suddenly flows and the flow speed of the liquid in the flow passage inside the function liquid droplet ejection head increases in speed, whereby the air bubbles inside the above-described flow passage are efficiently removed or discharged. Therefore, the number of times of suction can be kept to a minimum, the amount of consumption of the liquid can be reduced, and the working efficiency can be improved, resulting in the improvement in the workability.

The higher the ratio of liquid filling into the flow passage inside the function liquid droplet ejection head before closing the liquid supply passage, the higher the efficiency in the reduction of pressure in the flow passage inside function liquid droplet ejection head. Therefore, preferably, the closing of the liquid supply passage is carried into effect when the liquid inside the liquid supply tank has been sucked at least up to the cap. In this case, preferably, the ejection apparatus further comprises a liquid sensor interposed in a suction passage between the cap and the suction pump, and the temporary closing of the gate valve is carried out when, after starting the liquid filling into the flow passage inside the function liquid droplet ejection head, the liquid has been detected by the liquid sensor.

Preferably, the carriage further comprises a head unit which is made up of a sub-carriage and a plurality of function liquid droplet ejection heads mounted on the sub-carriage, and the cap is provided in a plurality of numbers to correspond to the plurality of function liquid droplet ejection heads. The gate valve is interposed in each of branch passages of the liquid supply passage, each of the branch passages being connected by branching to each of the function liquid droplet ejection heads. The liquid sensor is provided in each of the branch passages of the suction passages, each of the suction passages being connected to each of the caps. Each of the gate valves is closed when the liquid is detected by each of the liquid sensors.

According to this arrangement, even if the ratio of filling the liquid into the function liquid droplet ejection heads varies from head to head, the gate valve can be closed independently at an appropriate timing for each of the function liquid droplet ejection heads, resulting in a large improvement in the productivity.

The shorter the length of the flow passage between the gate valve and the function liquid droplet ejection head, the higher the efficiency of reduction in pressure after the gate valve has been closed and the smaller the amount of liquid consumption. Therefore, the gate valve is preferably mounted on a portion which moves integrally with the carriage. According to this arrangement, there is no need of securing, in a flow passage between the gate valve and the function liquid droplet ejection head, a slack (or sag) for the purpose of following the movement of the head unit that is held on the carriage. This arrangement is advantageous in that the length of the flow passage can be shortened.

According to this invention, there is provided a method of manufacturing an LCD device in which a filter element is formed on a substrate of a color filter by using the above-described ejection apparatus. The method comprises the steps of: introducing a filter material into the function liquid droplet ejection head; carrying out a relative scanning between the function liquid droplet ejection head and the substrate; and selectively ejecting the filter material to form the filter element.

According to this invention, there is provided a method of manufacturing an organic EL device in which an EL light emitting layer is formed on a pixel on a substrate by using the above-described ejection apparatus. The method comprises the steps of: introducing a light emitting material into the function liquid droplet ejection head; carrying out a relative scanning between the function liquid droplet ejection head and the substrate; and selectively ejecting the light emitting material to form the EL light emitting layer.

According to this invention, there is provided a method of manufacturing an electron emission device in which a fluorescent member is formed on an electrode by using the above-described ejection apparatus. The method comprises the steps of: introducing a fluorescent material into the function liquid droplet ejection head; carrying out a relative scanning between the function liquid droplet ejection head and the substrate; and selectively ejecting the fluorescent material to form the fluorescent member.

According to this invention, there is provided a method of manufacturing a PDP device in which a fluorescent member is formed on a recessed portion on a back substrate by using the above-described ejection apparatus. The method comprises the steps of: introducing a fluorescent material into the function liquid droplet ejection head; carrying out a relative scanning between the function liquid droplet ejection head and the substrate; and selectively ejecting the fluorescent material to form the fluorescent member.

According to this invention, there is provided a method of manufacturing an electrophoretic display device in which an electrophoretic member is formed on a recessed portion on an electrode by using the above-described ejection apparatus. The method comprises the steps of: introducing an electrophoretic material into the function liquid droplet ejection head; carrying out a relative scanning between the function liquid droplet ejection head and the substrate; and selectively ejecting the electrophoretic material to form the electrophoretic member.

As described above, by using the above-described ejection apparatus in the method of manufacturing an LCD device, the method of manufacturing an organic EL device, the method of manufacturing an electron emission device, the method of manufacturing a PDP device, and the method of manufacturing an electrophoretic display device, the work of initial filling (or charging) of the function liquid into the function liquid droplet ejection head to be used in each of the above-described methods can be carried out appropriately and smoothly. The scanning by the liquid droplet ejection head is generally main scanning and subsidiary scanning (sub-scanning). In the case of an arrangement in which one line is constituted by a single liquid droplet ejection head, there is carried out only the sub-scanning. In addition, the above-described electron emission device is a generic term to include the idea of field emission display (FED) device.

According to this invention, there is provided a method of manufacturing a color filter in which a filter element is arrayed on a substrate by using the above-described ejection apparatus. The method comprises the steps of: introducing a filter material into the function liquid droplet ejection head; carrying out a relative scanning between the function liquid droplet ejection head and the substrate; and selectively ejecting the filter material to form the filter element.

In this case, preferably, an overcoat layer is coated on the filter element, and the method further comprises the steps of: introducing a translucent coating material into the function liquid droplet ejection head after the filter element has been formed; carrying out a relative scanning between the function liquid droplet ejection head and the substrate; and selectively ejecting the coating material to form the overcoat layer.

According to this invention, there is provided a method of manufacturing an organic EL in which pixel inclusive of an EL light emitting layer is arrayed on a substrate by using the above-described ejection apparatus. The method comprises the steps of: introducing the light emitting material into the function liquid droplet ejection head; carrying out a relative scanning between the function liquid droplet ejection head and the substrate; and selectively ejecting the light emitting material to form the EL organic layer.

In this case, between the EL light emitting layer and the substrate, there is formed a pixel electrode corresponding to the EL light emitting layer. The method preferably further comprises the steps of introducing the liquid electrode material into the function liquid droplet ejection head; carrying out a relative scanning between the function liquid droplet ejection head and the substrate; and selectively ejecting the liquid electrode material to form the pixel electrode.

In this case, there is formed an opposite electrode so as to cover the EL light emitting layer. The method preferably further comprises the steps of: introducing the liquid electrode material into the function liquid droplet ejection head; carrying out a relative scanning between the function liquid droplet ejection head and the substrate; and selectively ejecting the liquid electrode material to form the opposite electrode.

According to this invention, there is provided a method of forming a spacer in which a particulate spacer is formed between two substrates so as to form a cell gap by using the above-described ejection apparatus. The method comprises the steps of: introducing a particulate material into the function liquid droplet ejection head; carrying out a relative scanning between the function liquid droplet ejection head and at least one of the two substrates; and selectively ejecting the particulate material to form the opposite electrode.

According to this invention, there is provided a method of forming a metallic wiring in which a metallic wiring is formed on a substrate by using the above-described ejection apparatus. The method comprises the steps of: introducing a metallic wiring material into the function liquid droplet ejection head; carrying out a relative scanning between the function liquid droplet ejection head and the substrate; and selectively ejecting the metallic wiring material to form the metallic wiring.

According to this invention, there is provided a method of forming a lens in which a microlens is formed on a substrate by using the above-described ejection apparatus. The method comprises the steps of: introducing a lens material into the function liquid droplet ejection head; carrying out a relative scanning between the function liquid droplet ejection head and the substrate; and selectively ejecting the lens material to form the microlens.

According to this invention, there is provided a method of forming a resist in which a resist of an arbitrary shape is formed on a substrate by using the above-described ejection apparatus. The method comprises the steps of: introducing a resist material into the function liquid droplet ejection head; carrying out a relative scanning between the function liquid droplet ejection head and the substrate; and selectively ejecting the resist material to form the resist.

According to this invention, there is provided a method of forming a light diffusion member in which a light diffusion member is formed on a substrate by using the above-described ejection apparatus. The method comprises the steps of: introducing a light diffusion material into the function liquid droplet ejection head; carrying out a relative scanning between the function liquid droplet ejection head and the substrate; and selectively ejecting the light diffusion material to form the light diffusion member.

As described above, by using the above-described ejection apparatus in the method of manufacturing a color filter, the method of manufacturing an organic EL, the method of manufacturing a metallic wiring, the method of forming a lens, the method of forming a resist, and the method of forming a light diffusion member, the work of initial filling (or charging) of the function liquid into the function liquid droplet ejection head to be used in each of the above-described methods can be carried out appropriately and smoothly.

BRIEF DESCRIPTION OF THE DRAWINGS

FIG. 1 is a sectional view showing the step of forming a bank portion (inorganic-matter bank) in manufacturing an organic EL device according to this invention;

FIG. 4 is a sectional view showing the step of plasma processing (water-repellency processing) in manufacturing the organic EL device according to this invention;

FIG. 17 is a front view showing an outside of the imaging apparatus according to this invention;

FIG. 26 is a side view around a stone base of the ejection apparatus according to this invention;

FIG. 48 is a side view of the liquid supply tank of the liquid supply and recovery apparatus according to this invention;

DETAILED DESCRIPTION OF THE PREFERRED EMBODIMENT

Figure 2:
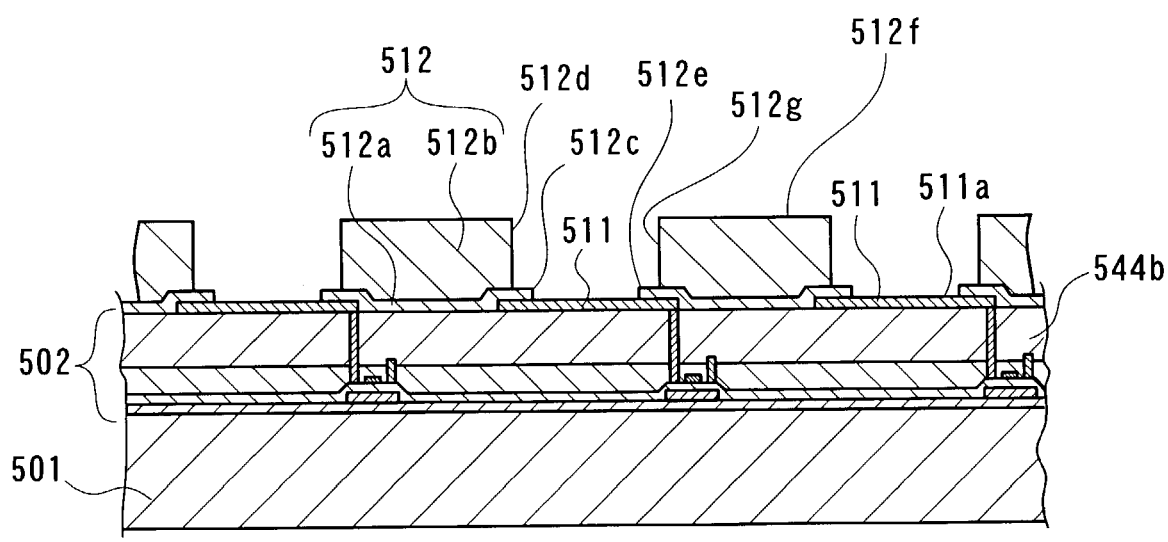
FIG. 2 is a sectional view showing the step of forming a bank portion (organic-matter bank) in manufacturing the organic EL device according to this invention.

With reference to the accompanied drawings, a detailed description will now be made about preferred embodiments of this invention. An ejection apparatus of this embodiment is to be built into a manufacturing line for manufacturing an organic EL device which is a kind of so-called flat display device. By using a plurality of function liquid ejection heads, a function liquid such as light emitting material, or the like, is ejected out of the ejection nozzles (ink jet method). There are thus formed an EL light emitting layer and hole injection layer which form the light emitting function of the organic EL device In this embodiment, a description will be made first about the structure of the organic EL device as well as about a method (or process) of manufacturing the organic EL device. Thereafter, a description will be made about an apparatus for manufacturing an organic EL device which is made up of an ejection apparatus for scanning a function droplet ejection head which is mounted thereon, as well as about a method of manufacturing the organic EL device.

FIGS. 1 through 13 show the process of manufacturing an organic EL device inclusive of an organic EL element, and also show the structure of the organic EL device. This process is made up of the following steps: i.e., a step of forming a bank portion (also referred to as a bank forming step); a step of plasma processing; a step of forming light emitting element which in turn is made up of a step of forming a hole injection/transport layer, and a step of forming a light emitting layer; a step of forming opposed (opposite or counter) electrodes; and a step of sealing.

In the step of forming a bank portion, a bank layer 512a made of an inorganic matter (hereinafter also called an inorganic-matter bank layer) and a bank layer 512b made of an organic matter (also called an organic-matter bank layer) are laminated in a predetermined position on a circuit element portion 502 and an electrode 511 (also called a pixel electrode) which are formed in advance on a substrate 501. As described, the step of forming a bank portion includes a step of forming the inorganic-matter bank layer 512a on a part of the electrode 511 as well as a step of forming the organic-matter bank layer 512b on the inorganic-matter bank layer 512a.

First, in the step of forming the inorganic-matter bank layer 512a, as shown in FIG. 1, a film of an inorganic matter such as $SiO_2$, $TiO_2$, or the like, is formed on an interlayer dielectric 544b of the circuit element portion 502 and on the pixel electrode 511 of the circuit element portion 502. This inorganic-matter bank layer 512a is formed by, e.g., a chemical vapor deposition (CVD) method, a coating method, a sputtering method, or the like, on an entire surface of the interlayer dielectric 544b and on the pixel electrode 511.

Thereafter, this inorganic-matter film is subjected to patterning by etching, or the like, to thereby form a lower opening portion 512c which corresponds to the position of forming an electrode surface 511a of the electrode 511. At this time, it is necessary to form the inorganic-matter bank layer 512a so as to overlap with the peripheral portion of the electrode 511. By thus forming the peripheral portion (only partly) of the electrode 511 in a manner to overlap with the inorganic-matter bank layer 512a, the light emitting region of the light emitting layer 510 (see FIGS. 10–13) can be controlled.

Then, in the step of forming the organic-matter bank layer 512b, as shown in FIG. 2, an organic-matter bank layer 512b is formed on the inorganic-matter bank layer 512a. The organic-matter bank layer 512b is etched by the art of photolithography, or the like, to thereby form an upper opening portion 512d of the organic-matter bank layer 512b. The upper opening portion 512d is formed in a position which corresponds to the electrode surface 511a and the lower opening portion 512c.

As shown in FIG. 2, the upper opening portion 512d shall preferably be formed larger than the lower opening portion 512c and smaller than the electrode surface 511a. According to this arrangement, the first laminated portion 512e enclosing or surrounding the lower opening portion 512c of the inorganic-matter bank layer 512a is arranged to extend toward the center of the electrode 511 beyond the organic-matter bank layer 512b. By thus bringing the upper opening portion 512d and the lower opening portion 512c into communication with each other, there is formed an opening portion 512g which passes or penetrates through the inorganic-matter bank layer 512a and the organic-matter bank layer 512b.

In the subsequent plasma processing step, there are formed a region showing an affinity with a liquid and a region showing a repellency against the liquid on the surface of the bank portion 512 and on the surface of the pixel electrode 511a. This plasma processing step is largely classified into: a preliminary heating step; a step of causing to have an affinity with liquid (a liquid-affinity step) in which an upper surface 512f of the bank portion 512, a wall surface of the opening portion 512g, and an electrode surface 511a of the pixel electrode 511 are made to have liquid-affinity (property to show an affinity with the liquid); a step of causing to have a repellency against liquid (a liquid-repellency step) in which an upper surface 512f of the organic-matter bank layer 512b and a wall surface of the upper opening portion 512d are made to have liquid repellency (property to show a repellency against the liquid); and a cooling step.

First, in the preliminary heating step, the substrate 501 inclusive of the bank portion 512 is heated to a predetermined temperature. In heating the substrate 501, a heater is attached to a stage on which the substrate 501 is mounted and the substrate 501 is heated by this heater together with the stage. In concrete, it is preferable to make the preliminary heating temperature to the range of, e.g., 70–80° C.

Figure 3:
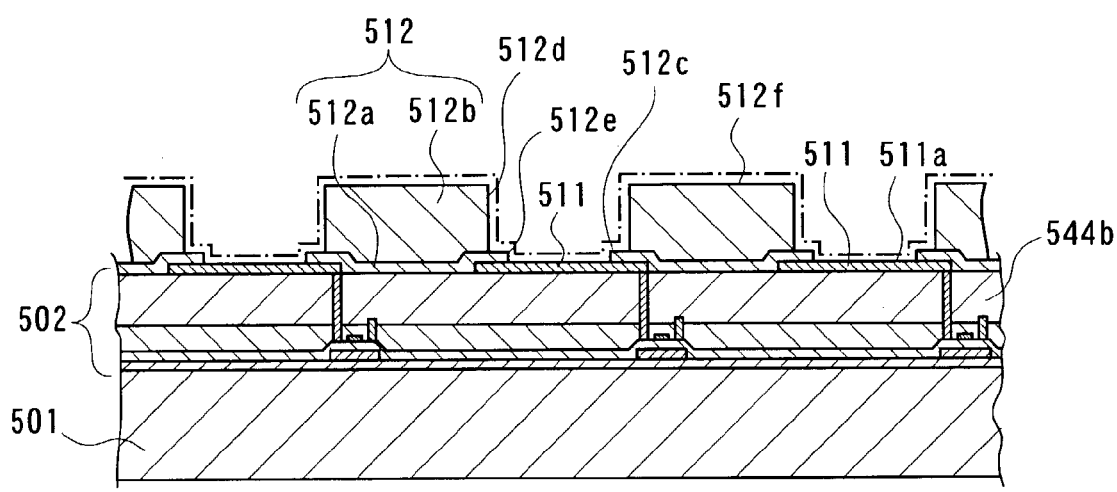
FIG. 3 is a sectional view showing the step of plasma processing (water-affinity processing) in manufacturing the organic EL device according to this invention.

Then, in the liquid-affinity step, plasma processing ($O_2$ plasma processing) is carried out in open air (outside air) with oxygen as a processing gas. As a result of this $O_2$ plasma processing, liquid-affinity processing is carried out, as shown in FIG. 3, on the electrode surface 511a of the pixel electrode 511, on the wall surfaces of the first laminated portion 512e of the inorganic-matter bank layer 512a and of the upper opening portion 512d of the organic-matter bank layer 512b, and on the upper surface 512f. As a result of this liquid-affinity processing, hydroxyl group is introduced into each of these surfaces to thereby give them liquid-affinity properties. Those portions which are subjected to the liquid-affinity processing are shown by a chain line.

In the subsequent liquid-repellency processing step, plasma processing is carried out in the atmosphere of open air with methane tetrafluoride ($CF_4$) as the processing gas ($CF_4$ plasma processing). As a result of $CF_4$ plasma processing, as shown in FIG. 4, the wall surface of the upper opening portion 512d and the upper surface 512f of the organic-matter bank layer are subjected to liquid-repellency processing. As a result of this liquid-repellency processing, fluorine group is introduced into each of the surfaces to thereby give them liquid-repellency properties. In FIG. 4, the regions showing the liquid-repellency properties are shown by a chain double-dashed line.

In the subsequent cooling step, the substrate 501 heated by the plasma processing is cooled down to room temperature or to the control temperature for the liquid droplet ejecting step. By thus cooling the plasma-processed substrate 501 down to the room temperature or to the predetermined temperature (e.g., to the control temperature at which the liquid droplet ejection step is carried out), the subsequent hole injection/transport layer forming step can be carried out at a given temperature.

Then, in the light emitting element forming step, the hole injection/transport layer and a light emitting layer are formed on the pixel electrode 511, thereby forming a light emitting element. The light emitting element forming step is made up of the following four steps: i.e., a first liquid droplet ejection step in which a first composition of matter for forming the hole injection/transport layer is ejected onto each of the pixel electrodes; a hole injection/transport layer forming step in which the ejected first composition of matter is dried to thereby form the hole injection/transport layer on the pixel electrodes; a second liquid droplet ejection step in which a second composition of matter for forming the light emitting layer is ejected onto the hole injection/transport layer; and a light emitting layer forming step in which the ejected second composition of matter is dried to thereby form a light emitting layer on the hole injection/transport layer.

First, in the first liquid droplet ejection step, the first composition of matter inclusive of the material for forming the hole injection/transport layer is ejected onto the electrode surface 511*a* by ink jet method (liquid droplet ejection method). This first liquid droplet ejection step and the subsequent steps shall preferably be carried out in an atmosphere of an inert gas such as argon gas, or the like, free from water and oxygen. In case the hole injection/transport layer is formed only on the pixel electrodes, the hole injection/transport layer to be formed adjacent to the organic-matter bank layer is not formed.

Figure 5:
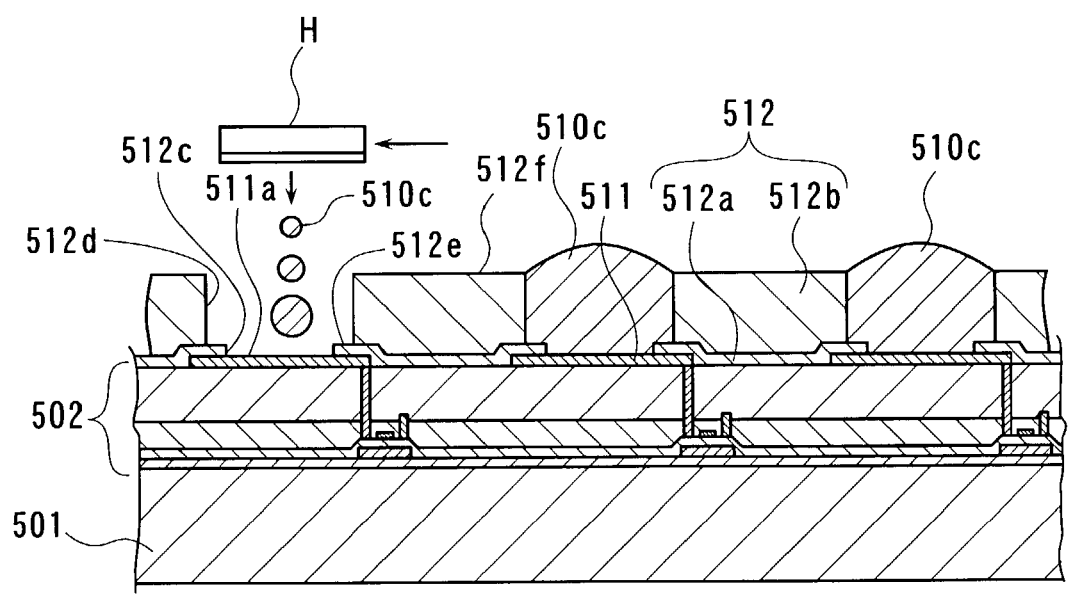
FIG. 5 is a sectional view showing the step of forming a hole injection layer (liquid droplet ejection) in the method of manufacturing the organic EL device according to this invention.

As shown in FIG. 5, the first composition of matter inclusive of the material for the hole injection/transport layer is filled into a function liquid droplet ejection head H. An ejection nozzle of the function liquid droplet ejection head H is caused to face the pixel electrode surface 511*a* which is positioned inside the lower opening portion 512*c*. While moving the function liquid droplet ejection head H and the substrate 501 relative to each other, the first composition of matter 510*c* whose amount of liquid per a droplet is kept under control is ejected from the ejection nozzle toward the electrode surface 511*a*.

As the first composition of matter to be used here, there may be employed a composition formed by dissolving a mixture of a polythiophene derivative, such as poly(ethylenedioxy)tiophene (PEDOT), and poly(tyrene sulphonicacid) (PSS), or the like, in a polar solvent. As the polar solvent, there may be mentioned glycol ethers, such as isopropyl alcohol (IPA), normal butanol, γ-utyrolactone, N-methyl-pyrrolidone (NMP), 1,3 dimethyl-2-imidazolidinone (DMI) and derivatives thereof, carbitol acetate, and butylcarbitol acetate. It should be noted that as the hole injection/transport layer-forming material, there may be used the same material for each of the light emitting layers 510*b* of red color (R), green color (G), and blue color (B), and also there may be used different materials for the respective light emitting layers.

As shown in FIG. 5, the ejected first composition of matter 510 spreads or extends over the liquid-affinity processed electrode surface 511*a* and over the first laminated portion 512*e* and is filled into the lower and upper opening portions 512*c*, 512*d*. The amount of the first composition of matter to be ejected onto the electrode surface 511*a* is determined by the size of the lower and upper opening portions 512*c*, 512*d*, the thickness of the hole injection/transport layer, the concentration of the material for forming the hole injection/transport layer in the first composition of matter, or the like. The first composition of matter 510*c* may be ejected toward the same electrode surface 511*a* not only in one time but also in several times.

Figure 6:
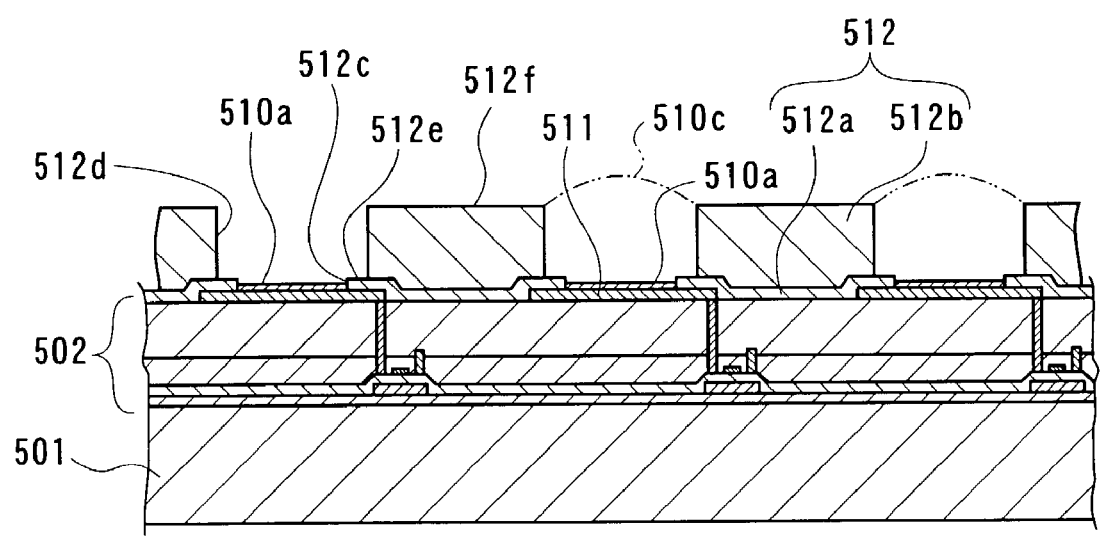
FIG. 6 is a sectional view showing the step of forming the hole injection layer (drying) in the method of manufacturing the organic EL device according to this invention.

As shown in FIG. 6, in the hole injection/transport layer forming step, the ejected first composition of matter is subjected to the processing of drying and heat treatment. The polar solvent contained in the first composition of matter is thus evaporated, and the hole injection/transport layer 510*a* is formed on the electrode surface 511*a*. By carrying out the drying processing, the evaporation of the polar solvent contained in the first composition of matter 510*c* occurs in portions which are close to the inorganic-matter bank layer 512*a* and the organic-matter bank layer 512*b* and, consequently, not only is the polar solvent evaporated but also is the hole injection/transport layer forming material condensed and deposited. As a result, the evaporation of the polar solvent occurs also on the electrode surface 511*a* by the drying processing. A flat portion 510*a* which is made up of the hole injection/transport layer forming material is thus formed on the electrode surface 511*a*. Since the speed of evaporation of the polar solvent on the electrode surface 511*a* is substantially uniform, the material to form the hole injection/transport layer 511*a* is uniformly condensed on the electrode surface 511*a*, whereby the flat portion 510*a* of a uniform thickness is formed.

In the subsequent second liquid droplet ejection step, the second composition of matter containing the light emitting layer forming material is ejected by the liquid droplet ejection method. In this second liquid droplet ejection step, non-polar solvent which is insoluble to the hole injection/transport layer 510*a* is used as a solvent for the second composition of matter which is used in forming the light emitting layer, in order to prevent the hole injection/transport layer 510*a* from getting dissolved again.

On the other hand, since the hole injection/transport layer 510*a* is low in affinity to the non-polar solvent, the hole injection/transport layer 510*a* and the light emitting layer 510*b* cannot be adhered to each other or the light emitting layer 510*b* cannot be uniformly coated even if the second composition of matter containing the non-polar solvent is ejected onto the hole injection/transport layer 510*a*. As a solution, in order to enhance the surface affinity of the hole injection/transport layer 510*a* to the non-polar solvent and the light emitting layer forming material, it is preferable to carry out the surface modification step before forming the light emitting layer.

Therefore, a description will first be made about the surface modification step. The surface modification step is carried out by coating the hole injection/transport layer 510*a* with a solvent that is the same as the non-polar solvent in the first composition of matter or with a solvent which is similar thereto, by liquid droplet ejection method, spin coating method, or dip coating method and, thereafter, drying it.

Figure 7:
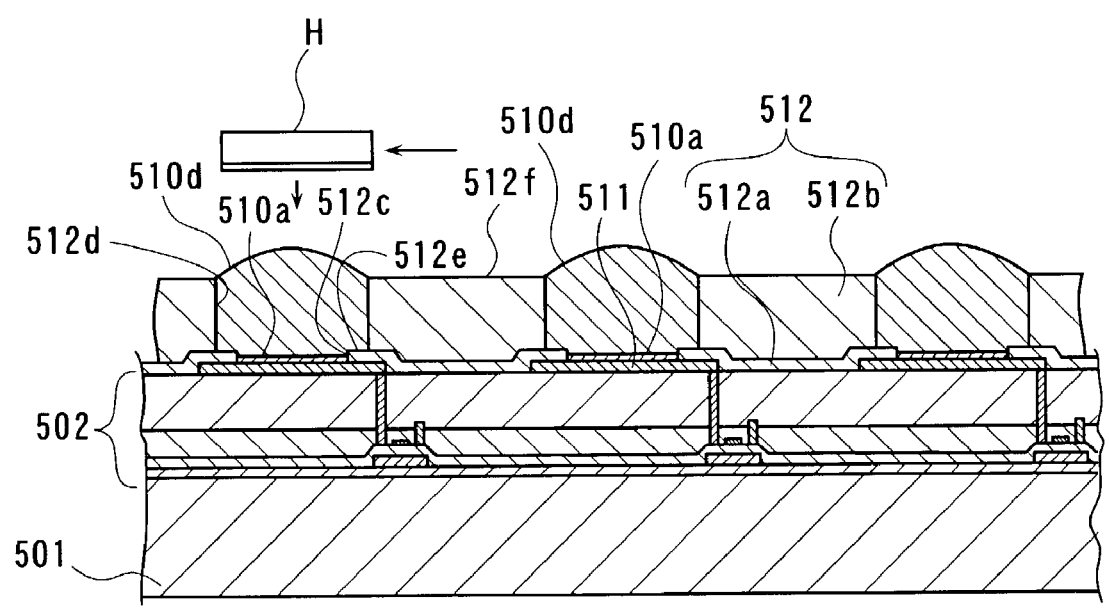
FIG. 7 is a sectional view showing the step of surface modification (droplet ejection) in the method of manufacturing the organic EL device according to this invention.
Figure 8:
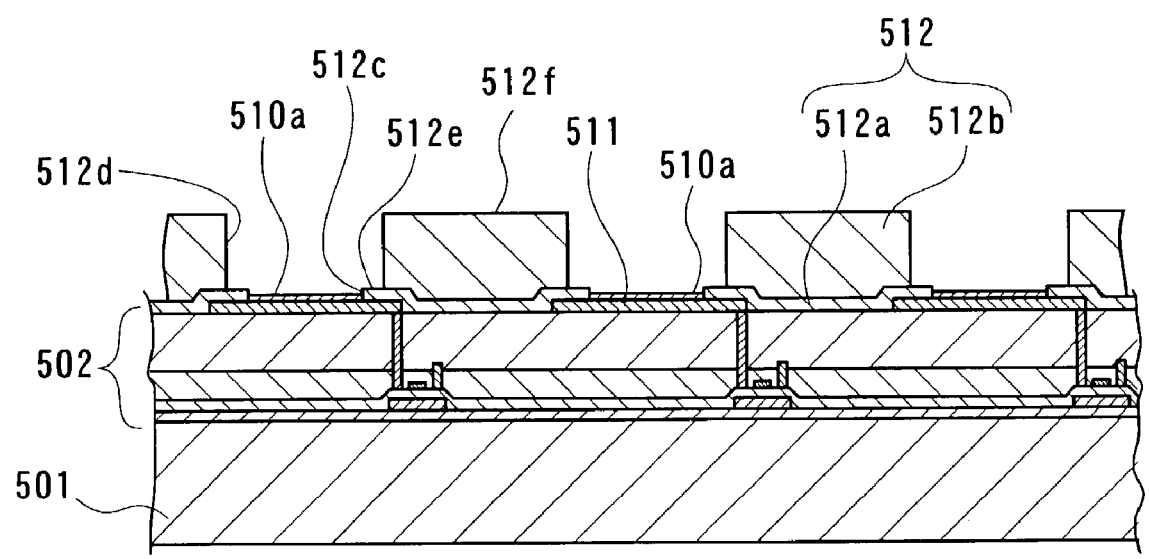
FIG. 8 is a sectional view showing the step of surface modification (drying) in the method of manufacturing the organic EL device according to this invention.

For example, the coating by the liquid droplet ejection method is carried out in the following manner as shown in FIG. 7. Namely, the function liquid droplet ejection head H is filled with a surface modification solvent. The ejection nozzle of the function liquid droplet ejection head H is caused to face the substrate (i.e., the substrate on which the hole injection/transport layer 510*a* has been formed). While moving the function liquid droplet ejection head H and the substrate 501 relative to each other, the surface modification solvent 510*d* is ejected from the ejection nozzle H. Then, as shown in FIG. 8, the surface modification solvent 510*d* is dried.

Figure 9:
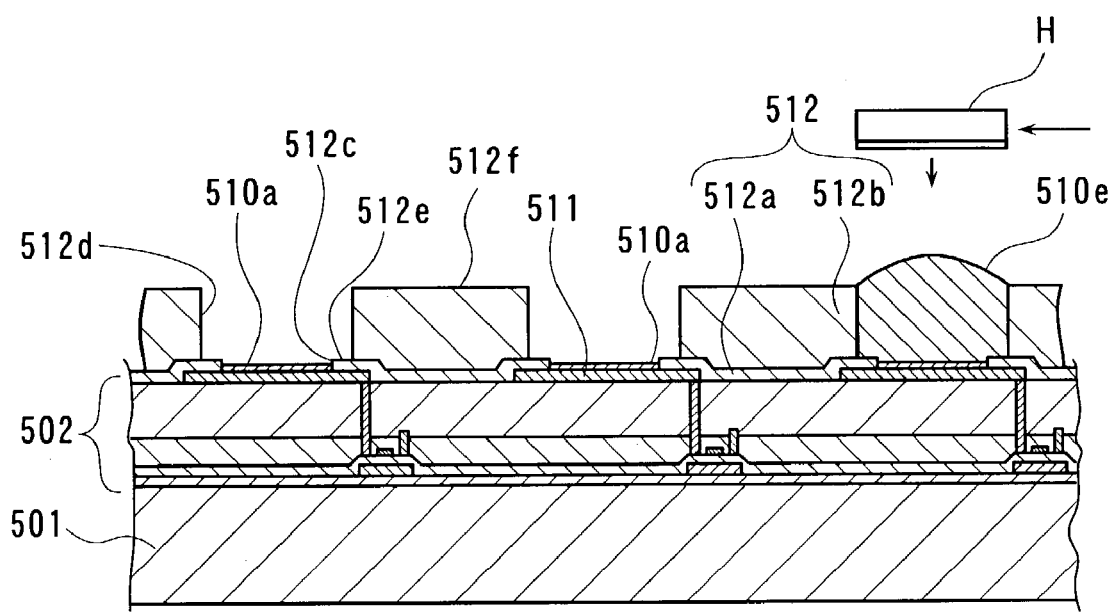
FIG. 9 is a sectional view showing the step of blue color (B) light emitting layer forming in the method of manufacturing the organic EL device according to this invention.

Then, in the second liquid droplet ejection step, the second composition of matter inclusive of the light emitting layer forming material is ejected by the liquid droplet ejection method onto the hole injection/transport layer 510a. As shown in FIG. 9, the function liquid droplet ejection head H is filled with the second composition of matter containing the blue color (B) light emitting layer forming material. The ejection nozzle of the function liquid droplet ejection head H is caused to face the hole injection/transport layer 510a which is positioned inside the lower and upper opening portions 512c, 512d. While moving the ink jet head H and the substrate 501 relative to each other, the second composition of matter 510e whose amount of flow per each droplet is controlled is ejected from the ejection nozzle onto the hole injection/transport layer 510a As the light emitting layer forming material, there may be used polyfluorene-based high polymer derivatives, (poly)paraphenylene vinylene derivatives, polyphenylene derivatives, polyvinylcarbazole, polythiophene derivatives, perylene-based dyes, coumarin-based dyes, and rhodamine-based dyes. Alternatively, it is possible to use one formed by doping any of the above-described high polymers with an organic EL element. For example, it is possible to use one doped with rubrene, peryene, 9,10-diophenylanthracene, tetraphenylbutadiene, Nile red, Coumarin-6, quinacridon, or the like.

As the non-polar solvent, solvents insoluble to the hole injection/transport layer 510a are preferable, and there may be used, e.g., cyclohexyl benzen, dihydrobenzofuran, trimethylbenzene, tetramethlbenzened, etc. By using such a non-polar solvent for the second composition of the light emitting layer 510b, it is possible to apply the second composition without causing the hole injection/transport layer 510a to be dissolved again.

As shown in FIG. 9, the ejected second composition of matter 510e is spread or extended over the hole injection/transport layer 510a and is filled into the lower and upper opening portions 512c, 512d. The second composition of matter 510e may be ejected onto the hole injection/transport layer 510a not only in one time but also in several times. In this case, the quantity of the second composition of matter in each time of ejection may be the same or may be changed from time to time.

Figure 10:
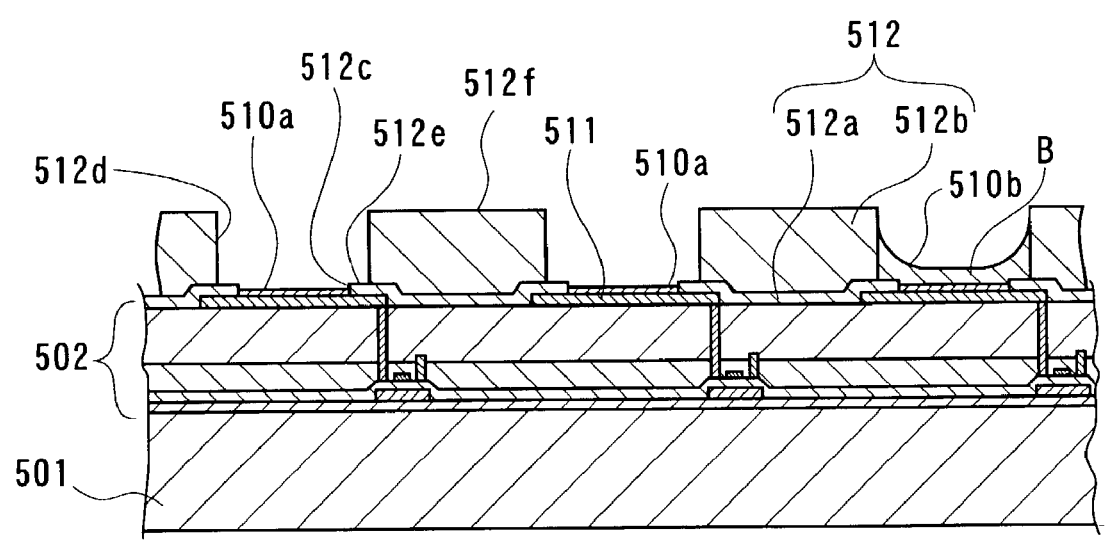
FIG. 10 is a sectional view showing the step of blue color (B) light emitting layer forming (drying) in the method of manufacturing the organic EL device according to this invention.

Then, in the light emitting layer forming step, drying processing and heat treating processing are carried out after the second composition of matter has been ejected, whereby a light emitting layer 510b is formed on the hole injection/transport layer 510a. In the drying processing, the ejected second composition of matter is subjected to drying processing to thereby evaporate the non-polar solvent contained in the second composition of matter. A blue color (B) light emitting layer 510b is thus formed as shown in FIG. 10.

Figure 11:
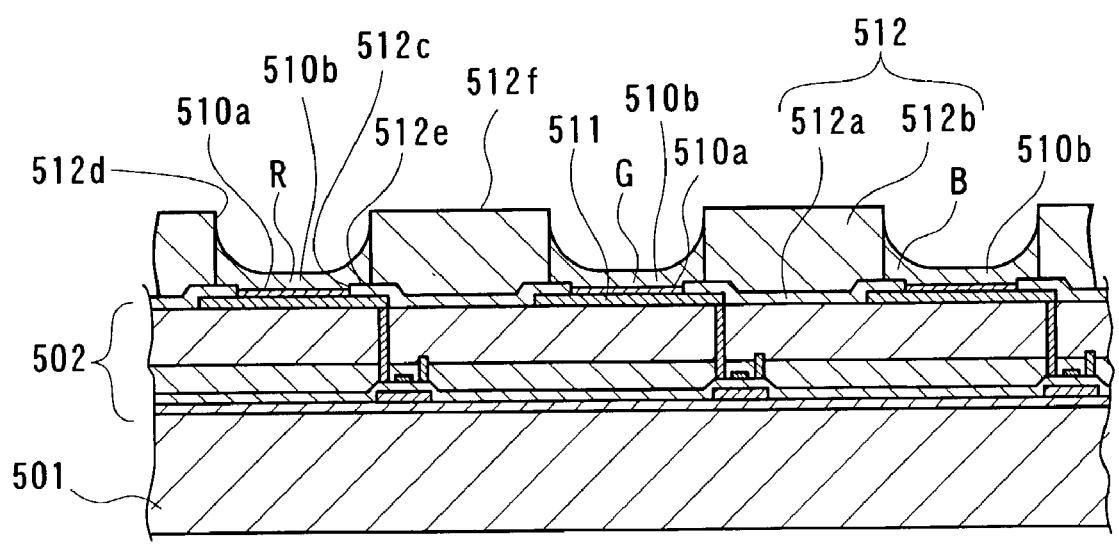
FIG. 11 is a sectional view showing the step of red color (R), green color (G), and blue color (B) light emitting layer forming in the method of manufacturing the organic EL device according to this invention.

Subsequently, as shown in FIG. 11, a red color (R) light emitting layer 510b is formed in the same way as in the case of the blue color (B) light emitting layer 510b. Finally, a green color (G) light emitting layer 510b is formed. It is to be noted that the order of forming the light emitting layers 510b is not limited to the above-described order, but may be arbitrarily determined. For example, it is possible to determine the order of forming the light emitting layers depending on the light emitting layer forming materials.

Figure 12:
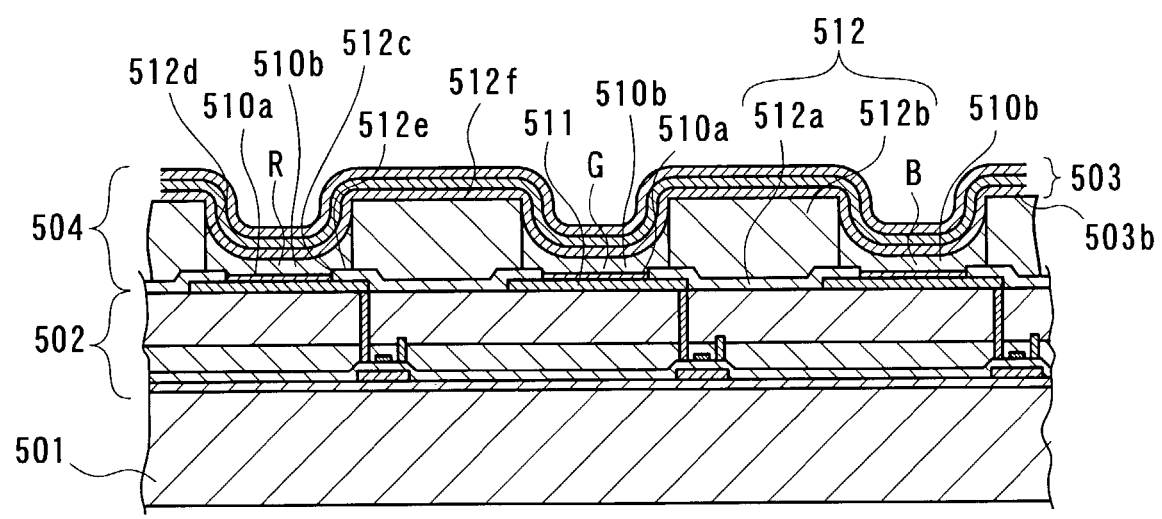
FIG. 12 is a sectional view showing the step of forming opposite electrodes in the method of manufacturing the organic EL device according to this invention.

Thereafter, in the opposed or opposite electrode forming step, a cathode 503 (an opposed electrode) is formed on the entire surface of the light emitting layer 510b and the organic-matter bank layer 512b as shown in FIG. 12. This cathode 503 may be formed by laminating a plurality of materials. For example, on the side close to the light emitting layer, it is preferable to form a material with a small work function. For example, it is possible to use Ca, Ba, or the like. Depending on the material, on some cases, it is better to thinly form LiF, or the like, on a lower layer. It is further preferable to use on the upper side (sealing side) a material with a higher work function than that on the lower layer. These cathodes (cathode layers) 503 are preferably formed by vapor deposition method, sputtering method, chemical vapor deposition (CVD) method, or the like. Particularly, it is preferable to resort to the vapor deposition method in order to prevent the light emitting layer 510b from being damaged by the heat.

Lithium fluoride may be formed only on the light emitting layers 510b, and only on the blue color (B) light emitting layer 510b. In this case, the other red color (R) light emitting layer and green color (G) light emitting layer 510b, 510b will contact the upper cathode layer 503b made from LiF. In addition, on an upper portion of the cathode layer 12, it is preferable to use Al film, Ag film, or the like, which is formed by vapor deposition method, sputtering method, CVD method, or the like. Further, on top of the cathode 503, a protection layer such as of $SiO_2$, SiN, or the like, may be provided for the purpose of prevention of oxidation.

Figure 13:
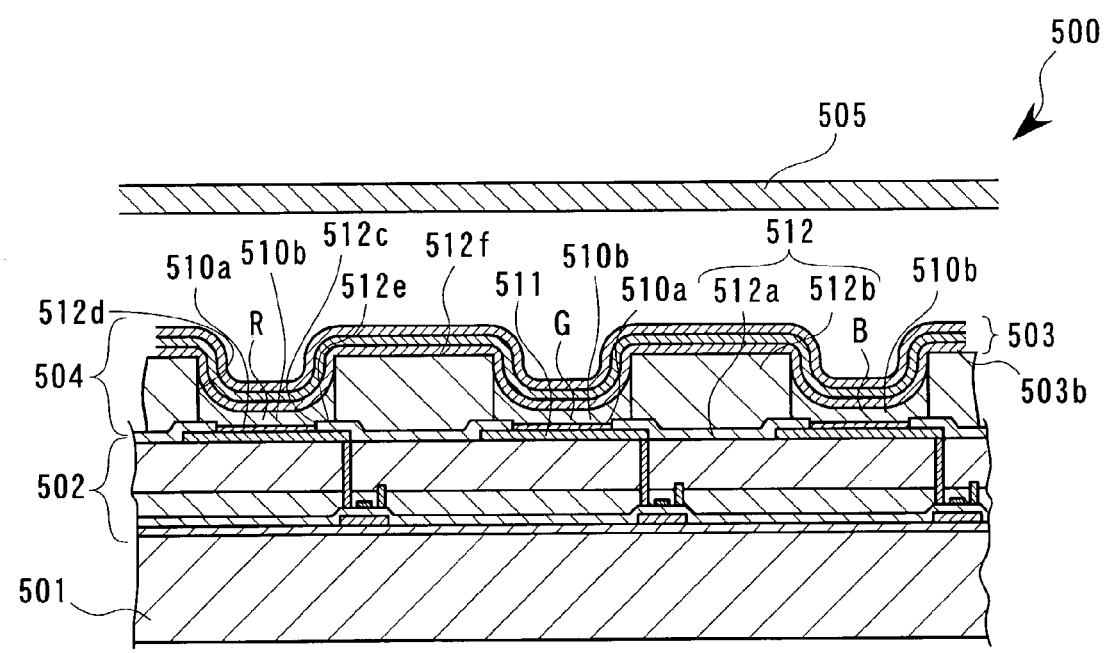
FIG. 13 is a sectional view showing the step of sealing in the method of manufacturing the organic EL device according to this invention.

In the sealing step as shown in FIG. 13, a sealing substrate 505 is laminated on top of the organic EL element 504 in the atmosphere of an inert gas such as of nitrogen, argon, helium, or the like. The sealing step is preferably carried out in the atmosphere of the inert gas of nitrogen, argon, helium, or the like. If the sealing step is carried out in the atmosphere of open air, there is a possibility of penetration of water, oxygen, or the like, into the defect portions if defects such as a pin hole, or the like, are present in the cathode 503. The cathode 503 is thus oxidized, which is not preferable. Finally, the cathode 503 is connected to the wiring of the flexible substrate and the wiring of the driving IC circuit element portion 502 is connected, whereby the organic EL device 500 according to this embodiment is obtained.

A liquid material may be used also in the liquid-repellency film, the cathode 503, the pixel electrode 511, or the like, so that they can be formed by the liquid droplet ejection method.

Description will now be made about the apparatus for manufacturing an organic EL device. As described hereinabove, in the process for manufacturing the organic EL device, the following steps are carried out by liquid droplet ejection method. Those steps in question are: the hole injection/transport layer forming step (first liquid droplet ejection step+drying step) for forming the hole injection/transport layer (hole injection layer); the surface modification step; and the light emitting layer forming step (second liquid droplet ejection step+drying step) for forming the light emitting layer. Corresponding to the above steps, the apparatus for manufacturing the organic EL device according to this embodiment employs an imaging apparatus (apparatus for making or plotting images or pictures) which carries out or performs scanning while ejecting light emitting function materials.

Figure 14:
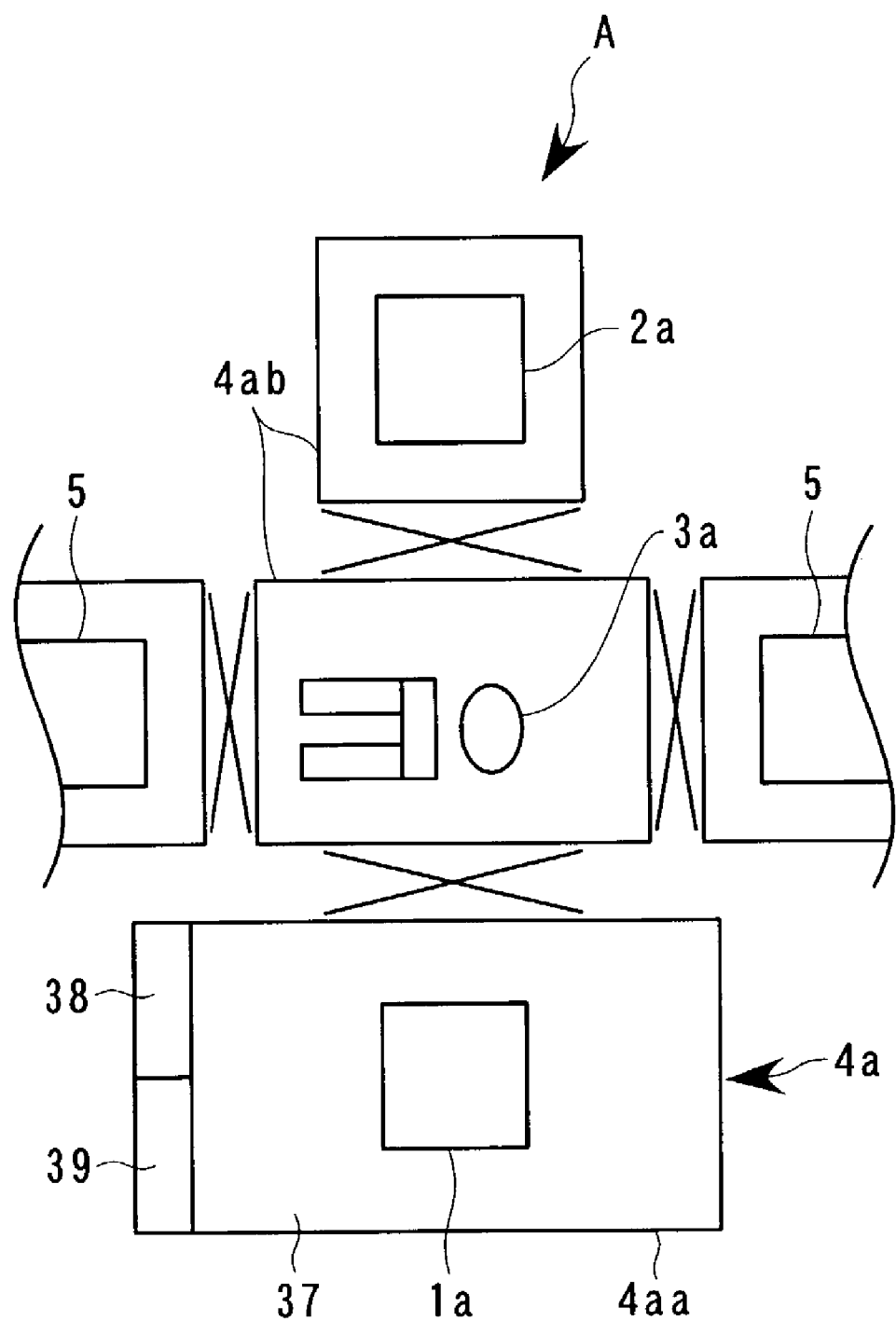
FIG. 14 is a schematic diagram of a hole injection layer forming apparatus according to this invention.

In concrete, as shown in FIG. 14, a hole injection layer forming apparatus A which carries out the hole injection/transport layer forming step (inclusive of the surface modification step, if necessary) is made up of: the above-described ejection apparatus 1a which has mounted thereon function liquid ejection heads for introducing the first liquid droplet (light emitting function material: hole injection layer material); a drying apparatus 2a; a substrate transportation apparatus 3a; as well as a chamber apparatus 4a which contains or houses therein the above apparatuses. As described above, it is preferable to carry out the hole injection/transport layer forming step in the atmosphere of an inert gas. This chamber apparatus 4a is used as a means for carrying out the step therein.

The chamber apparatus 4a is made up of: a main chamber 4aa which contains or houses therein the ejection apparatus 1a; and a subsidiary chamber (sub-chamber) 4ab which contains therein the drying apparatus 2a and the substrate transportation apparatus 3a and which also contains therein in a tunnel shape the connecting portions (transportation paths) for connecting together the above-described chambers/apparatuses. The main chamber 4aa employs a system in which an appropriate or favorable atmosphere is generated therein by causing an inert gas to flow therethrough continuously (details to be described hereinafter). The sub-chamber 4ab employs a system in which an appropriate or favorable atmosphere is generated therein by circulating an inert gas therethrough. In the figure, reference numeral 5 denotes a substrate transfer apparatus.

Figure 15:
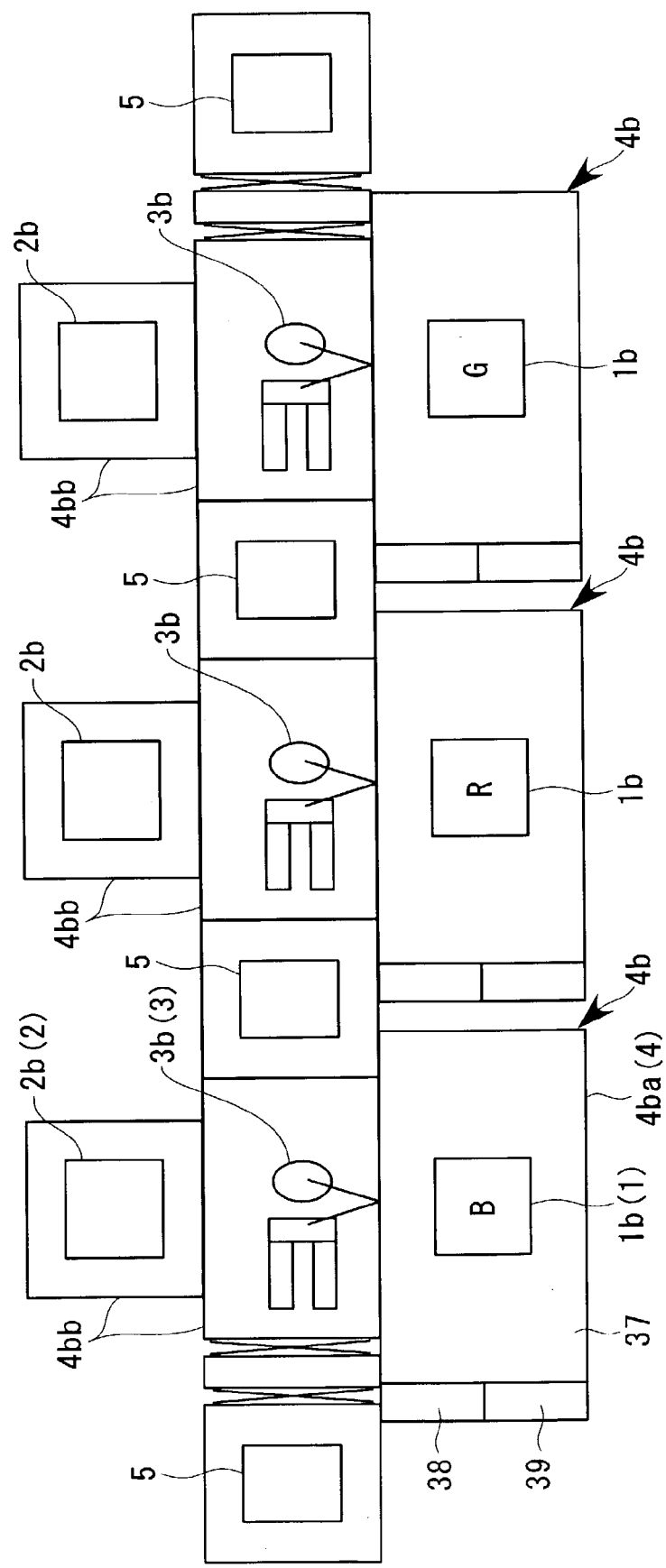
FIG. 15 is a schematic diagram of a light emitting layer forming apparatus according to this invention.

Similarly, as shown in FIG. 15, the light emitting layer forming apparatus B which carries out the light emitting layer forming step is made up of: the above-described ejection apparatus 1b having mounted thereon a function liquid droplet ejection head for introducing a second liquid droplet (light emitting function materials: red (R) • green (G) • blue (B) light emitting layer materials); a drying apparatus 2b; a substrate transportation apparatus 3b, the above-described apparatuses being provided in three sets, one for each of the above-described colors; as well as three sets of chamber apparatuses 4b for respectively containing therein the above-described apparatuses. In the same manner as above, it is preferable to carry out the light emitting layer forming step in the atmosphere of an inert gas. As a means for carrying it out, there is provided the chamber apparatuses 4b. These chamber apparatuses 4b are also made up of: three main chambers 4ba for containing therein respective ejection apparatuses 1b, and three sub-chambers 4bb for containing therein respective drying apparatuses 2b and respective substrate transportation apparatuses 3b and for containing therein the respective connecting portions (transportation paths) for connecting the above chambers/apparatuses.

It is to be noted that some parts or elements in the following embodiments are provided in plural numbers instead of only one. In the following detailed descriptions, they will sometimes be referred to in a singular form instead of in a plural form. It is partly for the sake of simplicity, or the like, and shall therefore be understood to include plural form, too, where applicable and appropriate.

The ejection apparatus 1a of the hole injection layer forming apparatus A and the ejection apparatus 1b of the light emitting layer forming apparatus B are different from each other in the liquid material to be introduced into the respective function liquid droplet ejection heads and have otherwise the same construction. In addition, the drying apparatuses 2a, 2b, the substrate transportation apparatuses 3a, 3b, and the chamber apparatuses 4a, 4b have respectively the construction that is the same as, or similar to, each other. If the time required for the exchanging of the function liquid ejection heads or the exchanging of the supply systems for the light emitting function materials is left out of consideration, it is thus possible to manufacture an organic EL device in an arbitrary set of apparatuses (ejection apparatus 1, drying apparatus 2, substrate transportation apparatus 3, and chamber apparatus 4).

Therefore, in this embodiment, description is made hereinbelow about the construction of one set of apparatuses on the left end in FIG. 15, i.e., the ejection apparatus 1b for forming a light emitting layer of blue color (B), the drying apparatus 2b, the substrate transportation apparatus 3b, and the chamber apparatus 4b, and the description about the other apparatuses is omitted.

A substrate that has been processed in the above-described bank forming step and the plasma processing step is transported from the substrate transfer apparatus 5 which is located at the left end in FIG. 15 to the substrate transportation apparatus 3 (3b) by means of an apparatus (not illustrated), and is changed therein in its direction and posture for being further transported to the ejection apparatus 1 (1b). The substrate that has been handed over from the substrate transportation apparatus 3 (3b) to the ejection apparatus 1 (1b) is set in position on the ejection apparatus 1 (1b). In the ejection apparatus 1 (1b) a light emitting material (liquid droplet) of blue color (B) is ejected by the function liquid droplet ejection head to a multiplicity of pixel regions (opening portions 512g) in the substrate (second liquid droplet ejection step).

Then, the substrate to which the light emitting material has been coated or adhered is handed over from the ejection apparatus 1 (1b) to the substrate transportation apparatus 3 (3b), and is introduced by the substrate transportation apparatus 3 (3b) into the drying apparatus 2 (2b). In the drying apparatus 2 (2b), the substrate is exposed to a high-temperature atmosphere of an inert gas for a predetermined period of time to thereby evaporate the solvent in the light emitting material (drying step). Here, the substrate is again introduced into the ejection apparatus 1 (1b) to carry out the second liquid droplet ejection step. In other words, the second liquid droplet ejection step and the drying step are repeated for a plurality of times. Once the light emitting layer has attained a desired thickness, the substrate is transported through the substrate transportation apparatus 3 (3b) to the central ejection apparatus 1 (1b) so as to form a light emitting layer of red color (R), and is finally transported to the right end ejection apparatus 1 (1b) to form therein a light emitting layer of green color (G). These steps are carried out in the atmosphere of an inert gas inside the above-described chamber apparatus 4 (4b). It is to be noted here that the order of forming each of the blue, red and green color light emitting layers may be arbitrarily selected.

Detailed descriptions about the drying apparatus 2 and the substrate transportation apparatus 3 are omitted. It is, however, to be noted that the drying apparatus 2, for example, shall preferably employ a system of using a hot plate or a lamp (infrared lamp), aside from a blow drying system in which an inert gas is blown, a vacuum drying system, or the like. The drying temperature shall preferably be set to 40° C. through 200° C.±2° C.

Detailed description will now be made about the ejection apparatus 1. The ejection apparatus 1 is made up, as shown in FIGS. 16 through 19, of a liquid droplet ejection apparatus (liquid droplet ejection means) 10 and an auxiliary apparatus 11. The auxiliary apparatus 11 is made up of: a liquid supply and recovery apparatus 13 which supplies the liquid droplet ejection apparatus 10 with a liquid material and which also recovers the liquid that has become useless (that has been put out of service); an air supply apparatus 14 which supplies each of the constituting parts with compressed air for use in driving/controlling, or the like; a vacuum suction apparatus 15 which sucks air; and a maintenance apparatus 16 which is used for maintenance of the function liquid droplet ejection head 7; or the like.

The liquid droplet ejection apparatus 10 is made up of: a supporting rack 21 disposed on a floor; a stone base 22 disposed on the supporting rack 21; an X-axis table 23 disposed on the stone base 22 and a Y-axis table 24 which crosses the X-axis table 23 at a right angle; a main carriage 25 disposed in a manner to be suspended from the Y-axis table 24; and a head unit 26 mounted on the main carriage 25. The head unit 26 has mounted thereon a plurality of function liquid droplet ejection heads 7 (details are given hereinafter). To correspond to these plurality of function liquid droplet ejection heads 7, a substrate (workpiece) W is set in position on a suction table 81 of the X-axis table 23.

The liquid droplet ejection apparatus 10 of this embodiment has a construction in which the substrate W is moved in a manner synchronized with the driving of the function liquid droplet ejection heads 7 (selective ejection of the function liquid droplet). The so-called main scanning of the function liquid droplet ejection heads 7 is carried out by the reciprocating (back and forth) movements of the X-axis table 23 in the X-axis direction. The so-called subsidiary scanning (sub-scanning) in correspondence to the main scanning is carried out by the reciprocating (back and forth) movements of the function liquid droplet ejection heads 7 in the Y-axis direction by the Y-axis table 24. It is of course possible to carry out the main scanning only by the forward movement (or by the backward movement) in the X-axis direction.

Figure 19:
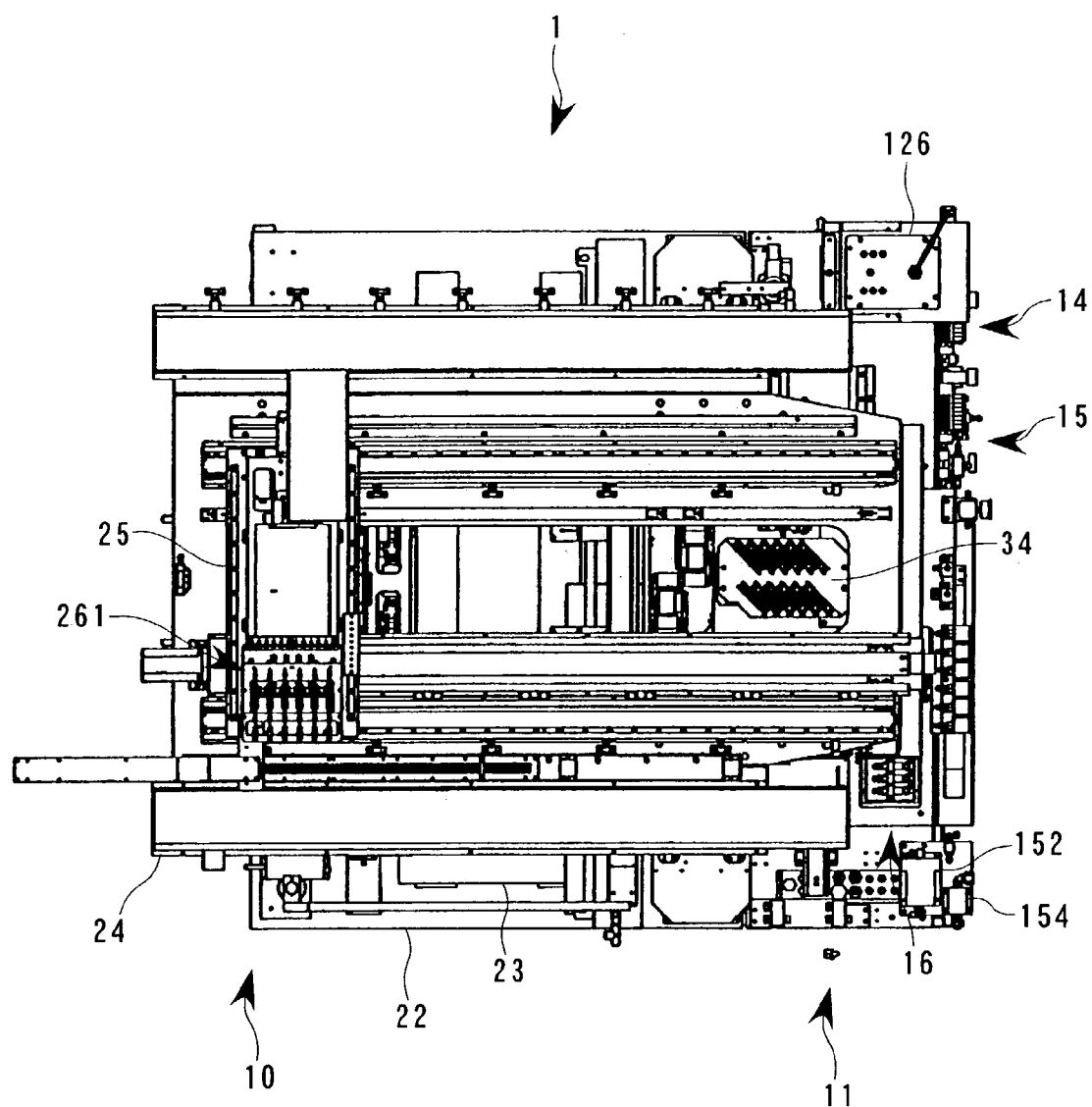
FIG. 19 is a plan view showing an outside of the imaging apparatus according to this invention.

On the other hand, the home position of the head unit 26 is defined to be in the left end position as seen in FIGS. 17 and 19. From the left side of this liquid droplet ejection head 10, the head unit 26 is brought into or replaced (details will be given hereinafter). To this side (i.e., to the side of the viewer) of the figure, the above-described substrate transportation apparatus 3 faces, and the substrate W is carried into, or brought out from, this side of the figure. To the right side, as seen in the figure, of the liquid droplet ejection apparatus 10, there are integrally disposed main constituting apparatuses of the above-described auxiliary apparatus 11.

The auxiliary apparatus 11 is made up of: a common machine base 31 of a cabinet style; the air supply apparatus 14 and the vacuum suction apparatus 15 which are contained or housed inside one half of the common machine base 31; the above-described function liquid supply and recovery apparatus 13 which is contained in the other one half of the common machine base 31; and the above-described maintenance apparatus 16 which contains the main constituting apparatuses on the common machine base 31.

The maintenance apparatus 16 is made up of: a flushing unit 33 in which the function liquid droplet ejection heads 7 are subjected to regular flushing operation (ejection work to discard the function liquid from all of the ejection nozzles); a cleaning unit 34 which carries out the suction and keeping of the function liquid from the function liquid droplet ejection heads 7; and a wiping unit 35 which wipes out the nozzle forming surfaces of the function liquid droplet ejection heads 7. The cleaning unit 34 and the wiping unit 35 are disposed on the common machine base 31.

The main chamber 4 is made in the form of a so-called clean room, as shown in FIGS. 14 and 15, which has disposed in a chamber room 37 an electrical room 38 and a mechanical room (or machine room) 39 in a side by side relationship. The chamber room 37 is filled with nitrogen gas which is an inert gas. The above-described liquid droplet ejection apparatus 10 and the auxiliary apparatus 11 are exposed to the atmosphere of nitrogen gas as a whole and are operated in the atmosphere of nitrogen gas.

Figure 20:
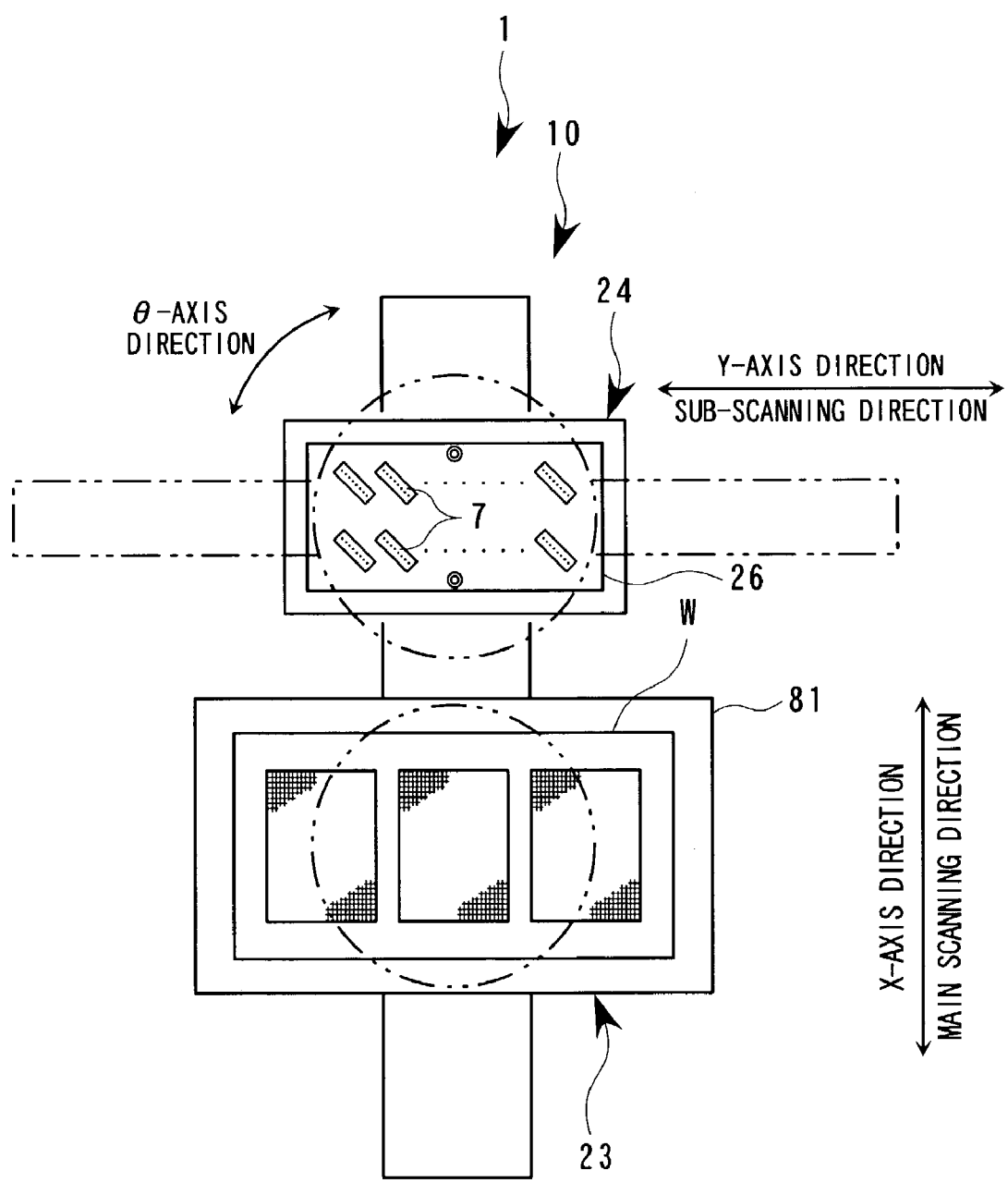
FIG. 20 is a schematic diagram showing a liquid droplet ejection apparatus of the imaging apparatus according to this invention.
Figure 21:
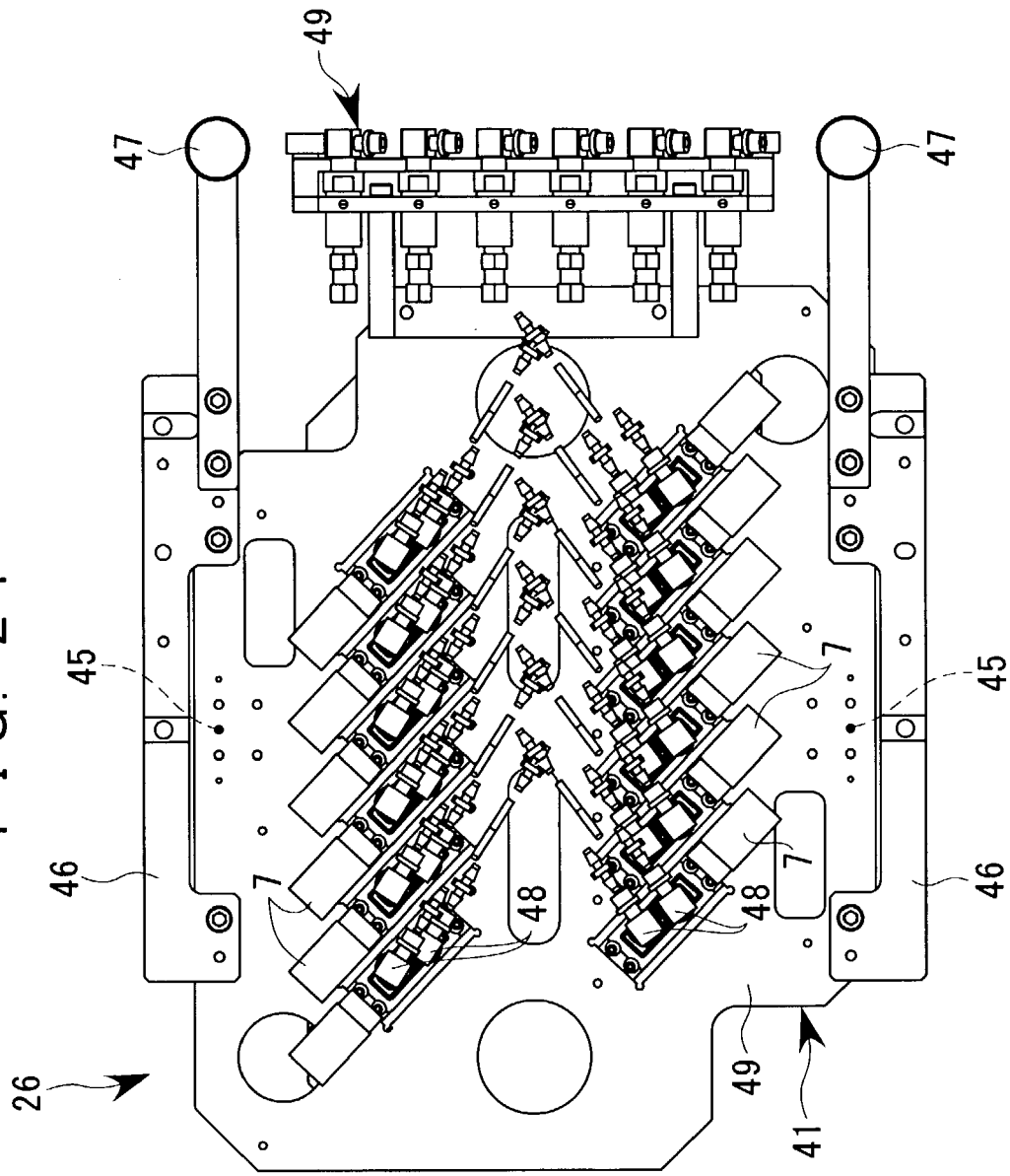
FIG. 21 is a plan view of a head unit according to this invention.
Figure 22:
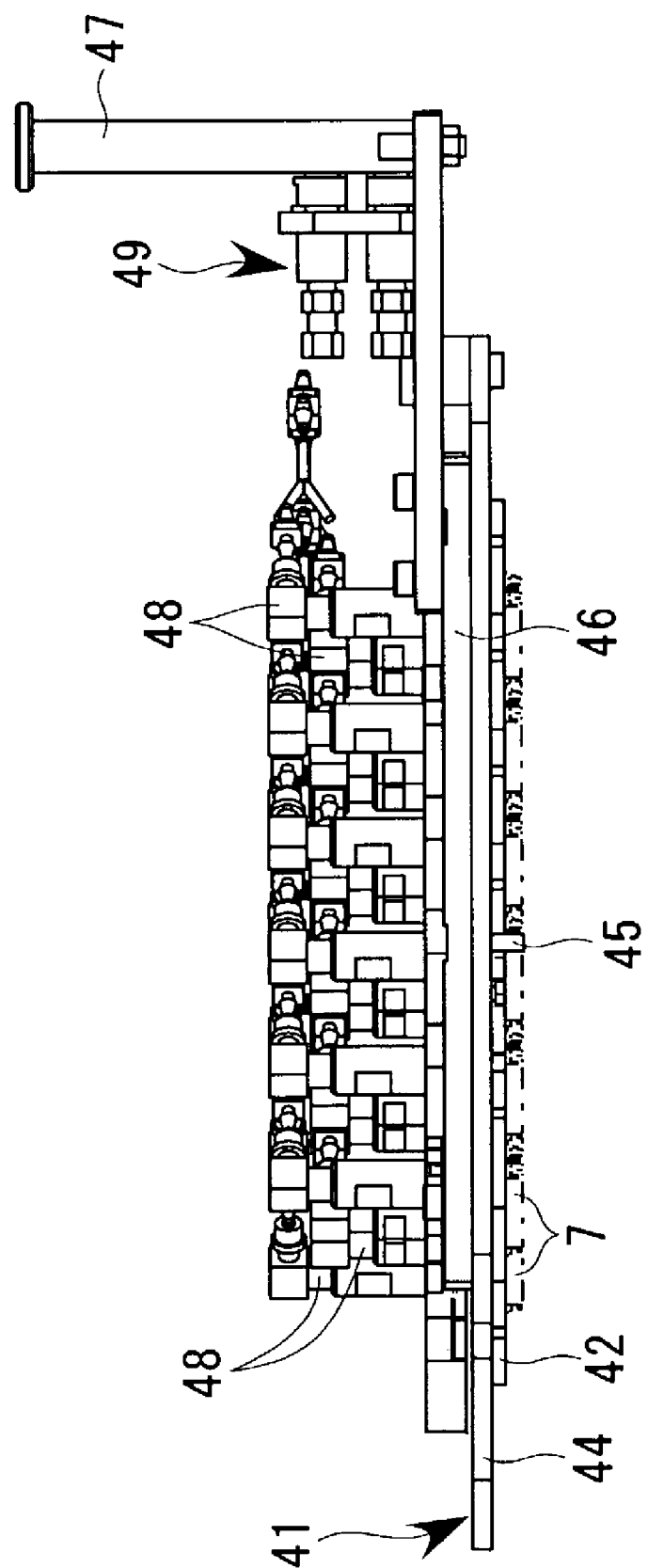
FIG. 22 is a side view of the head unit according to this invention.
Figure 23:
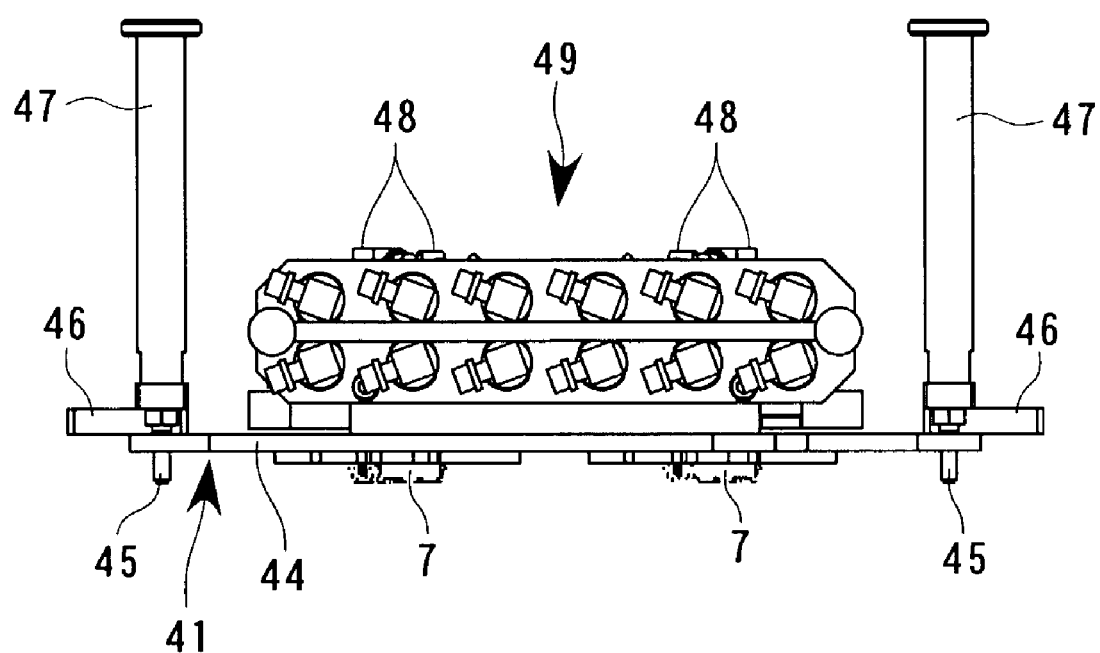
FIG. 23 is a front view of the head unit according to this invention.

Here, with reference to a schematic diagram in FIG. 20, a brief description will be made about the series of operations of the ejection apparatus 1 which operates in the atmosphere of nitrogen gas. First, as a preparatory step, the head unit 26 is brought into the liquid droplet ejection apparatus 10 and is set in position on the main carriage 25. Once the head unit 26 has been set in position on the main carriage 25, the Y-axis table 24 moves the head unit 26 to a position of a head recognition camera (not illustrated) to thereby recognize the position of the head unit 26 by means of a head recognition camera. Based on the result of this recognition, the head unit 26 is corrected in respect of a Θ axis, and the head unit 26 is subjected to a positional correction in respect of the X-axis direction and the Y-axis direction in terms of data. After the positional correction, the head unit 26 (main carriage 25) returns to the home position.

On the other hand, once the substrate W (in this case, each of the substrates to be introduced) is introduced into the suction table 81 of the X-axis table 23, a main substrate recognition camera 90 (to be described in detail hereinafter) recognizes the position of the substrate at that position (the position of handing over and receiving). Based on the result of this recognition, the substrate W is corrected in respect of the Θ axis, and a positional correction of the substrate W in respect of the X-axis direction and the Y-axis direction is carried out in terms of the data. After the positional correction, the substrate W (suction table 81) returns to the home position. At the time of an initial adjustment of the X-axis table 23 and the Y-axis table 24 (so-called center alignment), an alignment mask is introduced onto the suction table 81 to thereby carry out the initial adjustment by means of a subsidiary substrate recognition camera 108 which is described in detail hereinafter.

Once the preparations have been finished as described above, in the actual liquid droplet ejection operation, the X-axis table 23 is first driven to thereby move the substrate W back and forth in the main scanning direction. The plurality of function liquid droplet ejection heads 7 are also driven to thereby carry out the selective ejection operation of the function liquid droplets toward the substrate W. After the substrate W has returned, the Y-axis table 24 is then driven to thereby move the head unit 26 by one pitch in the subsidiary scanning direction. The back and forth movements of the substrate W and the driving of the function liquid droplet ejection heads are carried out again. By repeating these operations several times, the liquid droplets can be ejected from end to end over the entire region of the substrate W.

In this embodiment, the substrate W which is the object to which the function liquid droplet ejection is made is moved in the main scanning direction (X-axis direction) relative to the head unit 26. It may also be arranged that the head unit 26 is moved in the main scanning direction. Or else, there may be employed an arrangement in which the head unit 26 is fixed or stationary and in which the substrate W is moved in the main scanning direction and in the sub-scanning direction.

Then, a description will now be made about the arrangement of the liquid droplet ejection apparatus 10 and the auxiliary apparatus 11. Before proceeding further, in order to facilitate the understanding, a detailed description will be made about the head unit 26 which constitutes the main portion of the liquid droplet ejection apparatus 10.

FIGS. 21 through 24 are arrangement drawings of the head unit. As shown therein, the head unit 26 is made up of: a subsidiary carriage (sub-carriage) 41; a plurality of (twelve) function liquid droplet ejection heads 7 which are mounted on the sub-carriage 41; and a plurality of (twelve) head holding members 42 for mounting each of the function liquid droplet ejection heads 7 on the sub-carriage 41. Twelve function liquid droplet ejection heads 7 are divided into right and left groups of six each and are disposed at a predetermined angle to the main scanning direction.

The six function liquid droplet ejection heads 7 of one group are disposed at a positional deviation, in the sub-scanning direction, relative to the six function liquid droplet ejection heads 7 of the other group. In this manner, all of the ejection nozzles 68 (to be described in detail hereinafter) of the twelve function liquid droplet ejection heads 7 are continuous (partly overlapped) in the sub-scanning direction. In other words, the head arrangement in this embodiment is such that, on the sub-carriage 41, six function liquid droplet ejection heads 7 disposed at an angle in the same direction are provided in two rows and that the function liquid droplet ejection heads 7 in one of the head rows are disposed at 180° rotation relative to the other of the head rows of the function liquid droplet ejection heads 7.

The above-described arrangement pattern is only one example. The adjoining function liquid droplet ejection heads 7 within one head row may be disposed at an angle of 90° relative to each other, or else the function liquid droplet ejection heads 7 of one head row may be disposed at an angle of 90° relative to the function liquid droplet ejection heads of the other head row. Anyway, as long as the dots by all of the ejection heads 68 of the twelve function liquid droplet ejection heads 7 are continuous in the sub-scanning direction, they serve the purpose.

In addition, if the function liquid droplet ejection heads 7 are made to be parts for exclusive use by each kind of substrate W, it is not necessary to take the trouble of setting the function liquid droplet ejection heads 7 at an inclination. Instead, it is sufficient to arrange them in a staggered or stepped manner. In more detail, as long as a nozzle array (dot array) of a predetermined length can be constituted, they may be constituted by a single function liquid droplet ejection head 7 or by a plurality of function liquid droplet ejection heads 7. It follows that the number of the function liquid droplet ejection heads 7 and the number of the rows, as well as the arrangement pattern may be arbitrarily selected.

The sub-carriage 41 is made up of: a main body plate 44 which is substantially square in shape and partly notched; a pair of left and right standard or reference pins 45, 45 which are provided in an intermediate position as seen in the long side of the main body plate 44; a pair of left and right supporting members 46, 46 which are attached to both the long sides of the main body plate 44; and a pair of left and right handles 47, 47 which are provided at an end of each of the supporting members 46. The left and right handles 47, 47 serve as members for holding the head unit 26 when an assembled head unit 26, for example, is mounted onto the above-described liquid droplet ejection apparatus 10. The left and right supporting members 46, 46 serve as members for fixing the sub-carriage 41 to the setting portion of the liquid droplet ejection apparatus 10 (details thereof will be described hereinafter). Further, the pair of the standard pins 45, 45 serve as the standard for positioning (positionally recognizing) the sub-carriage (head unit 26), based on the image recognition, in the X-axis, Y-axis, and the Θ-axis directions.

The sub-carriage 41 is further provided with a piping joint 49 at a position away from each of the function liquid droplet ejection heads, e.g., at an end portion on the side of the handle 47 of the sub-carriage 41. The piping joint 49 serves the purpose of detachably connecting: that piping material 48*a* on the side of the head (head-side piping material 48*a*) which is communicated with each of the function liquid droplet ejection heads through a piping adapter 48; and that piping material on the side of the apparatus (apparatus-side piping material) which is communicated with a liquid supply tank 126 (to be described hereinafter) for the liquid supply and recovery apparatus 13.

Figure 24A:
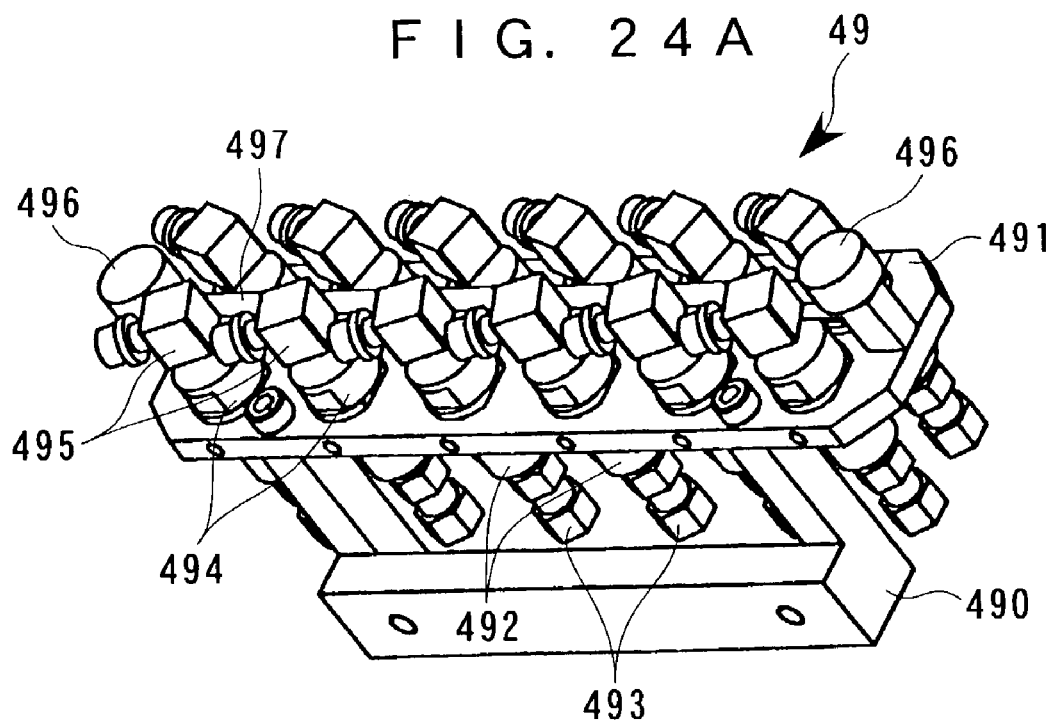
FIG. 24A is an outside perspective view of a piping joint and FIG. 24B is a sectional view of the piping joint according to this invention.
Figure 24B:
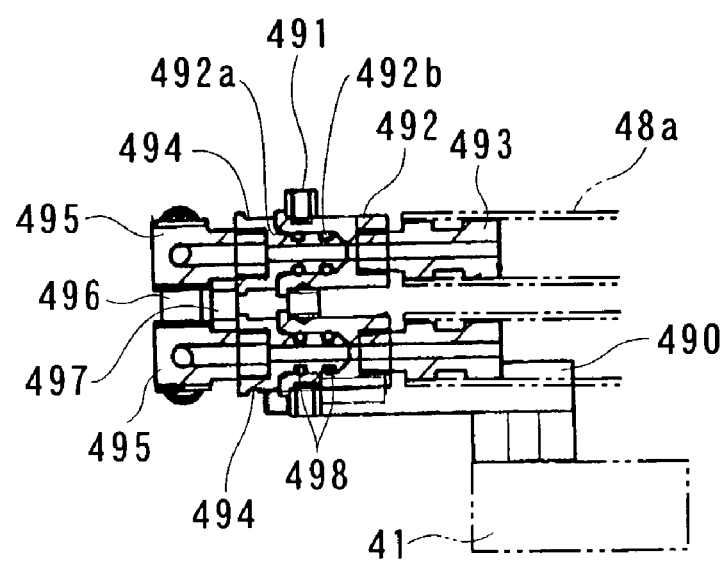

As shown in FIGS. 24A and 24B, the piping joint 49 is provided with an oblong plate 491 which is fixed to an end on the side of the handle 47 in the sub-carriage 41 through a bracket 490. Twelve sockets 492 in total in the upper and lower rows are fixed by fitting to the plate 491. One end of each of the sockets 492 has connected thereto each of the head-side piping material 48*a* through a piping coupling 493. The other end of each of the sockets 492 has formed therein a plug hole 492*a* into which a plug 494 is detachably fitted (i.e., fitted in a manner capable of being plugged into and plugged out of position).

The apparatus-side piping material is connected to the plugs 494 through elbow pipes 495. In this manner, by simply plugging each of the plugs 494 into, and out of, each of the sockets 492, the apparatus-side piping material can be connected to, or detached from, the head-side piping material 48*a*. Even if there occurs a liquid run (running or flowing or dripping of the liquid) at the time of separating the piping material, there is no possibility of the running liquid's getting adhered to the connectors 66 (see FIG. 25A) of the function liquid droplet ejection heads 7 because the piping joint 49 is away from the function liquid droplet ejection heads 7. The plugs 494 are prevented from being inadvertently pulled out of position due to a stay bar 497 which is detachably mounted on the plate 491 through screws 496 on both ends thereof.

In case there occurs a clearance (or gap) to the plug 494 within the plug hole 492*a*, the air bubbles through the clearance penetrate into the function liquid droplet ejection heads 7, resulting in a failure in ejection (or wrong ejection) of the liquid droplet. As a solution, in this embodiment, the hole bottom surface 492*b* of the plug hole 492*a* is formed into a tapered surface to suit the taper of the front end of the plug 494 to thereby prevent the clearance from occurring. A clearance may occur to a smaller degree between the hole bottom surface 492*b* and the front end of the plug 494 through a dimensional tolerance in the depth of the plug hole 492*a* and the length of the plug 494. However, since this clearance is directed in a tapered shape in the direction of flow of the liquid that flows out of the plug 494, the air bubbles can be easily removed by suction out of the clearance at the step of liquid filling which is carried out when the head unit 26 is placed in position in the ejection apparatus 1. Therefore, there is no possibility of the air bubbles' getting into the function liquid droplet ejection heads 7 through the clearance during operation of the ejection apparatus 1.

In this embodiment, a plurality of, e.g., two O-rings 498 for the purpose of sealing the plug holes 492*a* are attached to the perimeter of the plug 494 at an axial distance from each other. The sealing property between the plug 494 and the socket 492 is thus improved.

Though not illustrated, the sub-carriage 41 is provided, on an upper side of the two rows of the left and right function liquid droplet ejection head groups, with a pair of left and right wiring (or cable) connection assemblies to be connected to the function liquid droplet ejection heads 7. Each of the wiring connection assemblies is arranged to be connected by wires (or cables) to the a control apparatus (head driving unit, not illustrated) of the ejection apparatus 1.

Figure 25A:
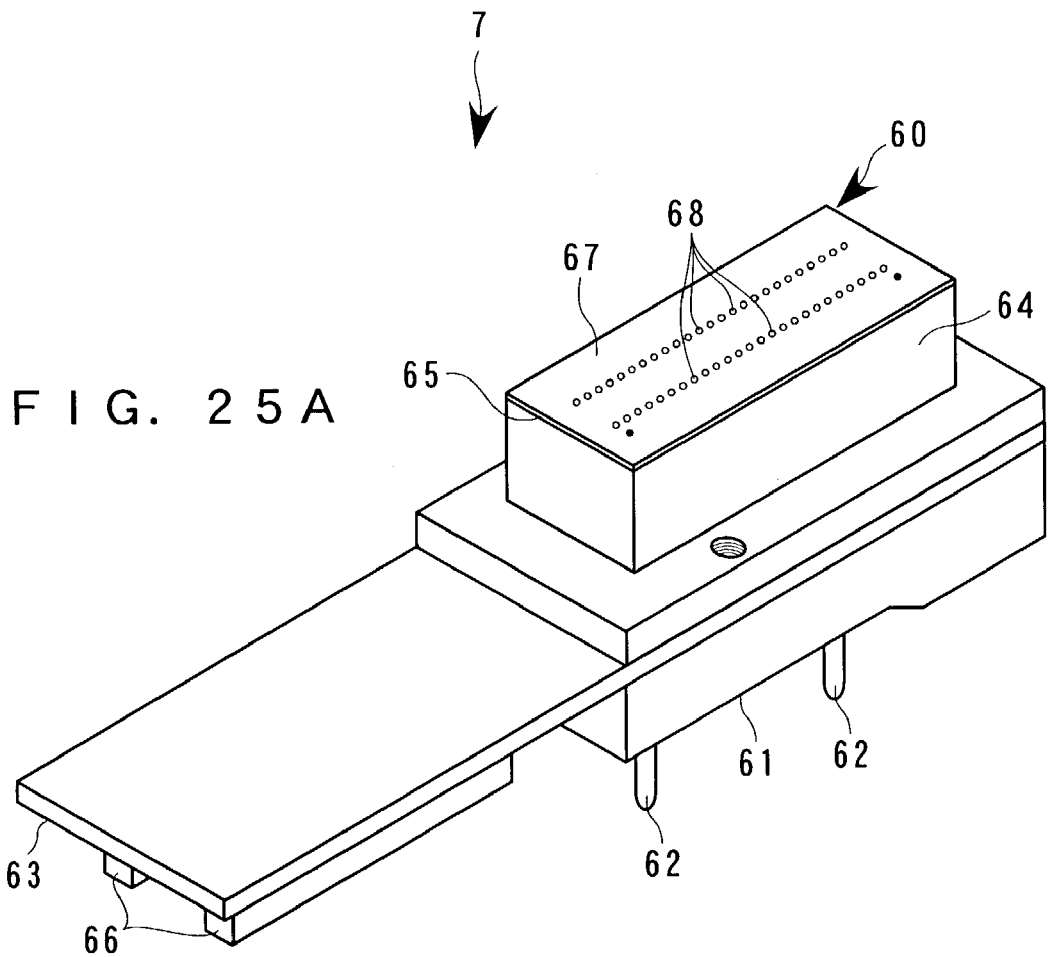
FIG. 25A is an outside perspective view of a function liquid droplet ejection head and FIG. 25B is a sectional view of the function liquid droplet ejection head according to this invention.
Figure 25B:
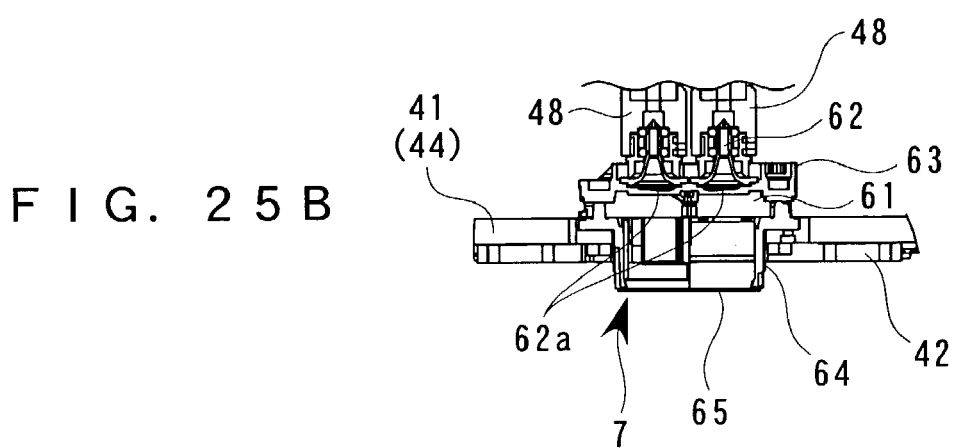

As shown in FIGS. 25A and 25B, the function liquid droplet ejection head 7 is of a so-called dual (twin) construction and is made up of: a liquid introduction part 61 having dual connection needles 62, 62; a dual head substrate 63 which is in communication with a side of the liquid introduction part 61; a dual pump part 64 which is in communication with a lower portion of the liquid introduction part 61; and a nozzle forming plate 65 which is in communication with the pump part 64. Each of the connection needles 62 has connected thereto the above-described piping adapter 48. To the base portion of each of the connection needles 62 there is mounted a filter 62a for preventing foreign substances from getting into the pump part 64. Flexible flat cables (not illustrated) to be drawn (or pulled out) from the wiring connection assemblies are connected to the connectors 66, 66 of the head substrate 63.

A rectangular head main body 60 which projects toward the back side of the sub-carriage 41 is constituted by the pump part 64 and the nozzle forming plate 65. A nozzle forming surface 67 of the nozzle forming plate 65 has parallelly disposed therein two rows of nozzle arrays 69, 69, each row having a multiplicity of ejection nozzles 68. The piping adapters 48 are arranged such that two of them are respectively disposed for each of the function liquid droplet discharge heads 7 in correspondence to the dual connection needles 62, 62. Therefore, the head-side piping material 48a to be connected to each of the sockets 492 of the piping joint 49 is connected to the two piping adapters 48, 48 through a Y-shaped coupling 49.

A description will now be made in sequence about the other constituting apparatuses of the liquid droplet ejection apparatus 10 and the auxiliary apparatus 11.

FIGS. 26 through 29 show the supporting rack 21 and the stone base 22 on which is mounted the X-axis table. As shown in these figures, the supporting rack 21 is constituted by assembling L-shaped structural members, or the like, into a rectangle, and has a plurality of (nine) supporting legs 71 with adjusting bolts which are distributed in a lower part thereof. On an upper part of the supporting rack 21 there are provided, in a manner extending sidewise and two in number for each side, a plurality of (eight) fixing members 72 for fixing the stone base 22 at the time of movement such as transportation, or the like. Each of the fixing members 72 is formed into an L shape like a bracket and is fixed, at its base end, to the upper side face of the supporting rack 21 and is brought, at its front end, into contact with the lower side face of the stone base 22 through the adjusting bolts 73. The stone base 22 is placed in position on the supporting rack 21 in an untied state. When the stone base 22 is transported, it is fixed by the fixing members 72 to the supporting rack 21 in a manner immovable in the X-axis direction and in the Y-axis direction (i.e., back-and-forth and sidewise directions) relative to the supporting rack 21.

The stone base 22 is to support the X-axis table 23 and the Y-axis table 24, both being for moving the function liquid droplet ejection heads 7 at a high accuracy, so as not to give rise to deviations in accuracy (especially in respect of the degree of flatness) due to environmental conditions, vibrations, or the like. It is constituted by a solid stone material which is rectangular in plan view. The stone base 22 is provided at its lower part with three main supporting legs 75 and six auxiliary legs 76, all with adjusting bolts, for supporting the stone base 22 on the supporting rack 21. The three main supporting legs 75 support the stone base 22 at three points to thereby secure the degree of parallelism of the surface (also to secure the degree of horizontalness). The six auxiliary legs 76 are to support the portions away from the three main supporting legs 75 of the stone base 22 to thereby keep the stone base 22 from deflecting.

Figure 16:
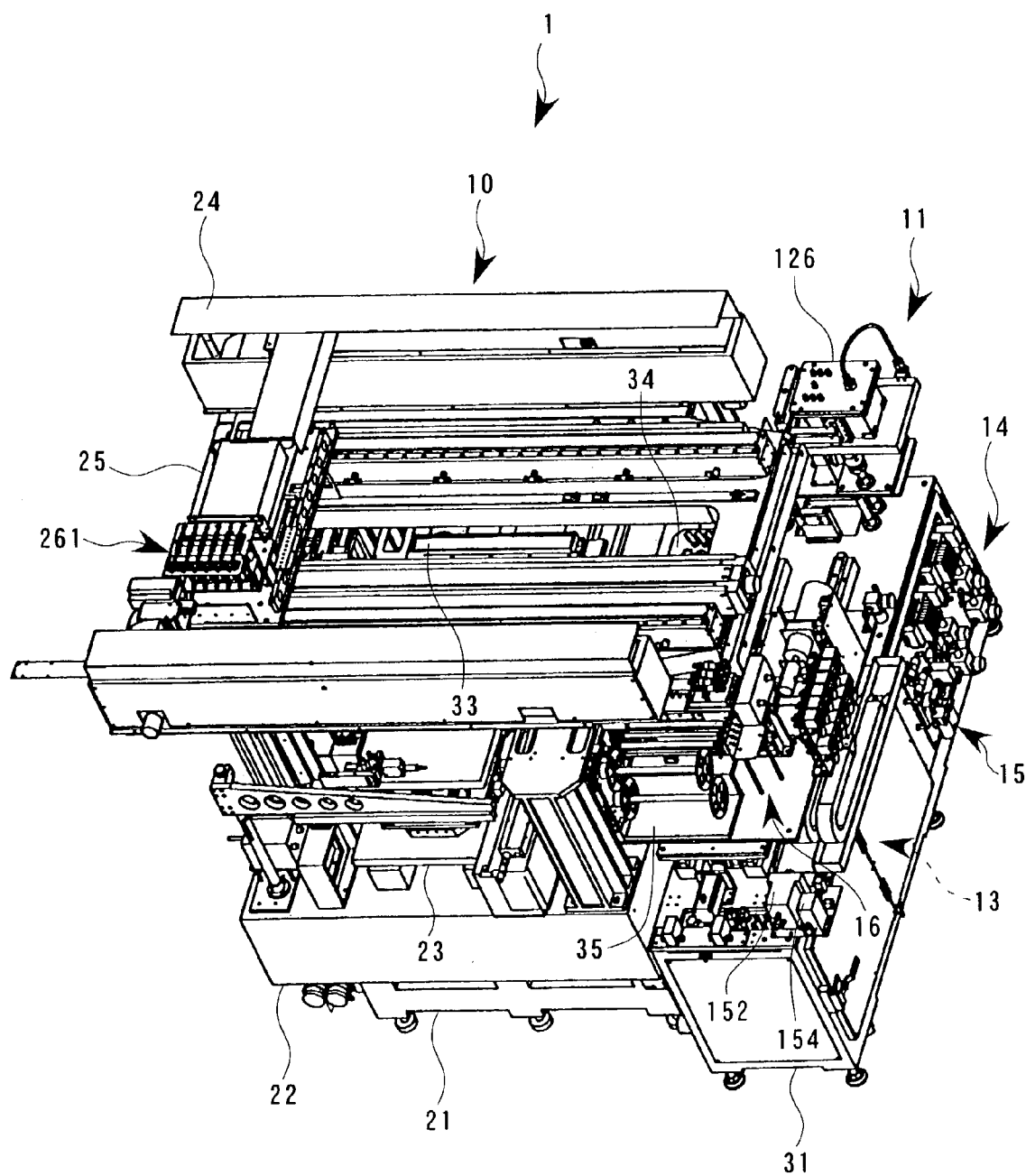
FIG. 16 is an outer perspective view of an imaging apparatus according to this invention.
Figure 18:
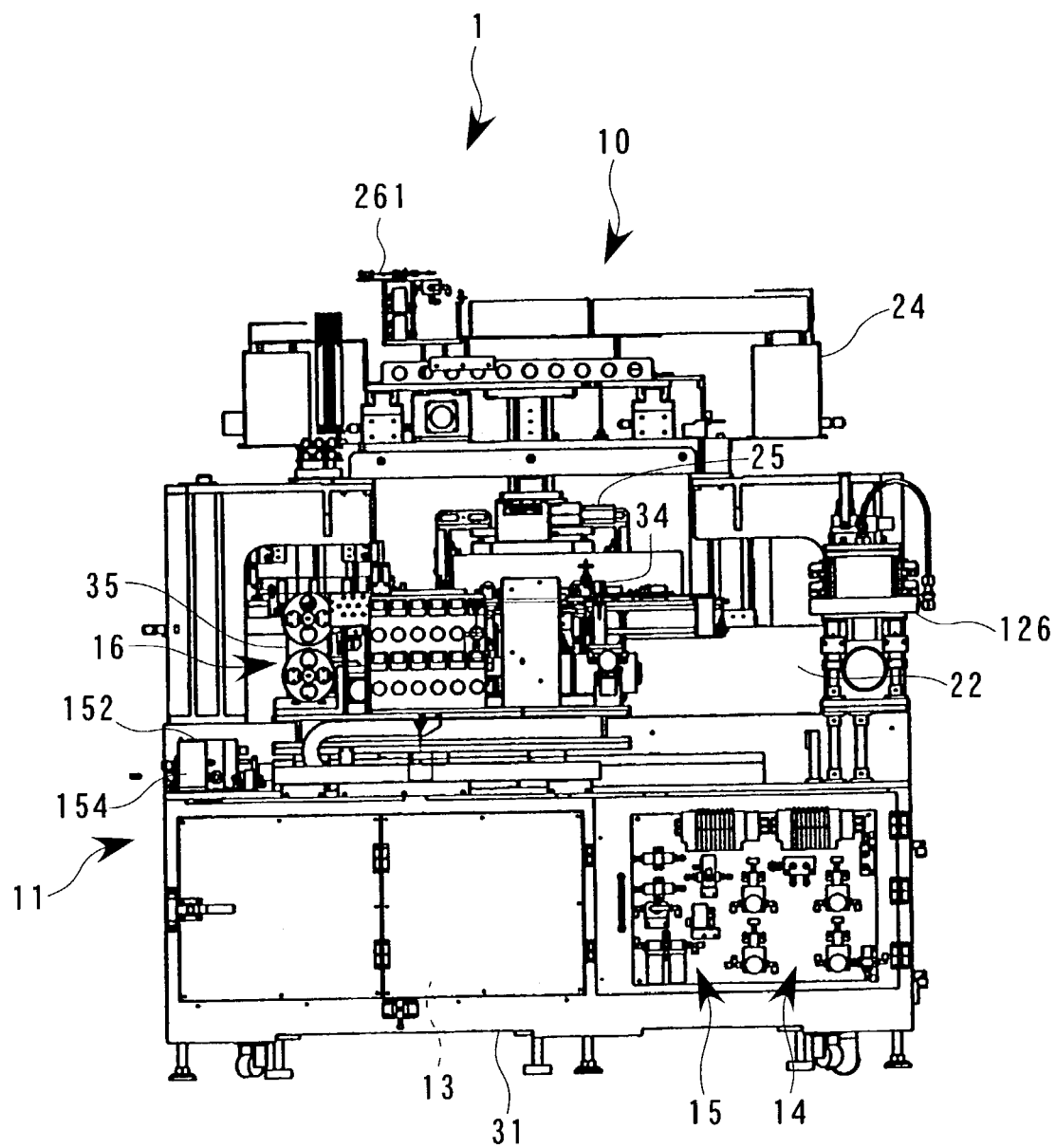
FIG. 18 is a side view showing an outside of the imaging apparatus according to this invention.
Figure 29:
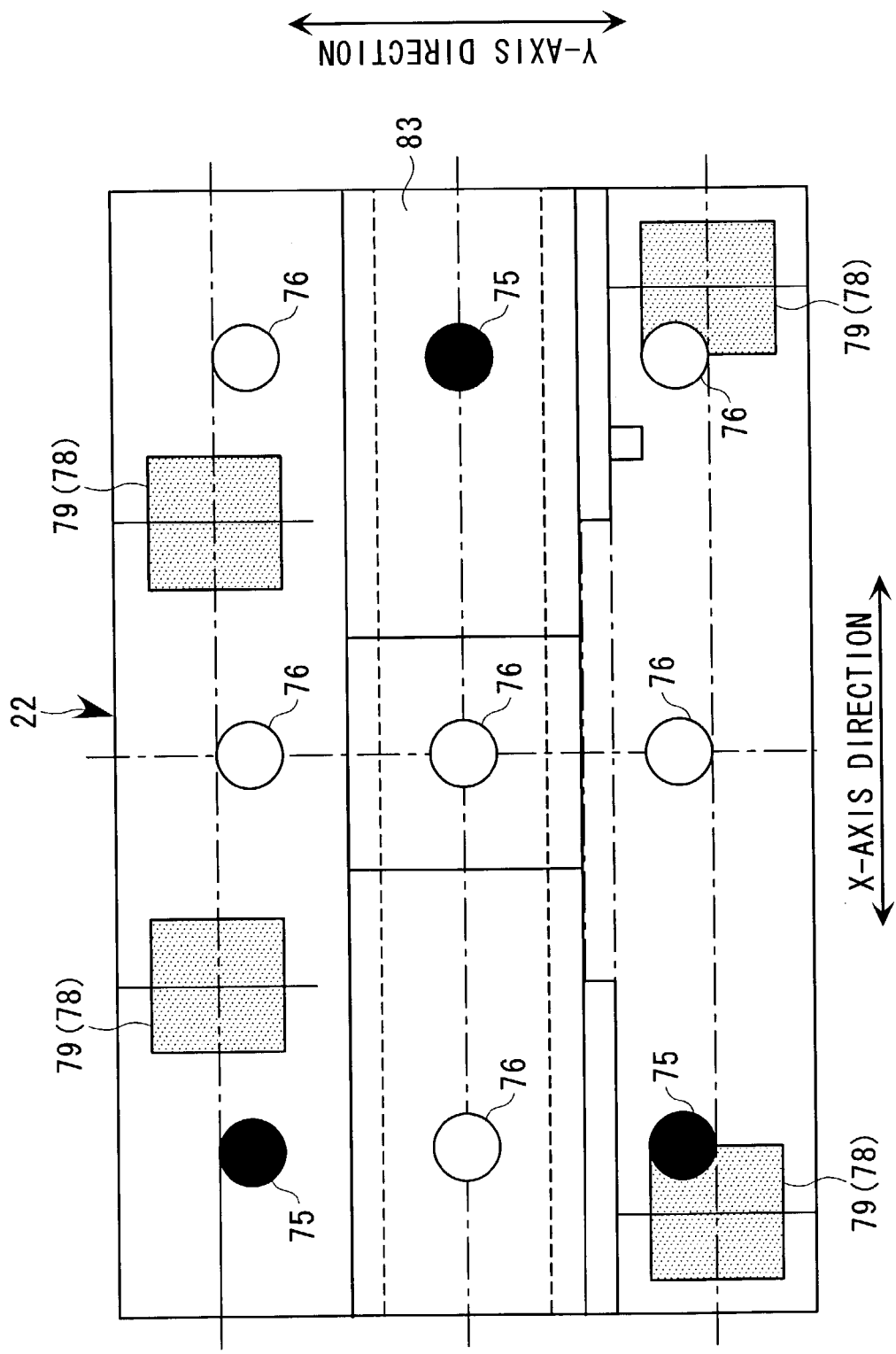
FIG. 29 is a schematic view showing the supporting mode of the stone base of the ejection apparatus according to this invention.

For this purpose, as schematically shown in FIG. 29, the three main supporting legs 75, 75, 75 are disposed in a manner to form an isosceles triangle with the two main legs 75 forming the base being positioned on that side of the stone base 22 from which the substrate is transported (i.e., on the left side in FIG. 29 and on this side, i.e., on the side of the viewer of the figure, in FIG. 16). The six auxiliary legs 76, 76, 76, 76, 76, 76 are evenly distributed in such a manner that they constitute 3×3 in the longitudinal and lateral directions inclusive of the above-described three main supporting legs 75, 75, 75.

In this arrangement, the X-axis table 23 is disposed such that the axial line thereof coincides with the center line along the long sides of the stone base 22, and the Y-axis table 24 is disposed such that the axial line thereof coincides with the center line along the short sides of the stone base 22. Therefore, the X-axis table 23 is fixed directly to the stone base 22 and the Y-axis table 24 is fixed to the stone base 22 by four supporting columns 78 through respective spacer blocks 79. As a result, the Y-axis table 24 is disposed so as to lie above the X-axis table 23 at right angles thereto. Reference numeral 80 in FIG. 27 denotes four small blocks for fixing thereto main substrate recognition cameras which are described in detail hereinafter. The main substrate recognition cameras are also fixed to the stone base 22.

Figure 27:
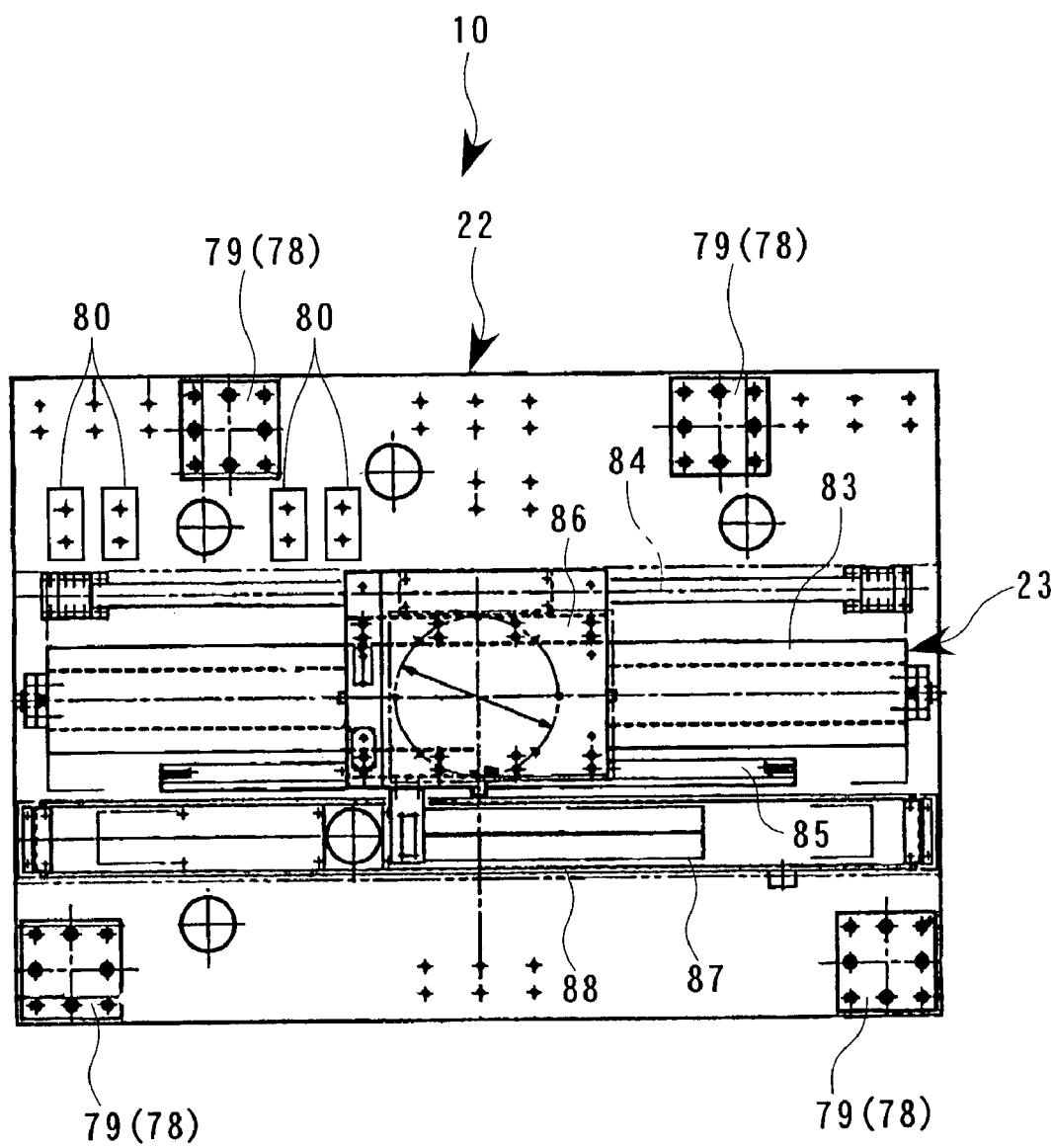
FIG. 27 is a plan view around the stone base of the ejection apparatus according to this invention.
Figure 28:
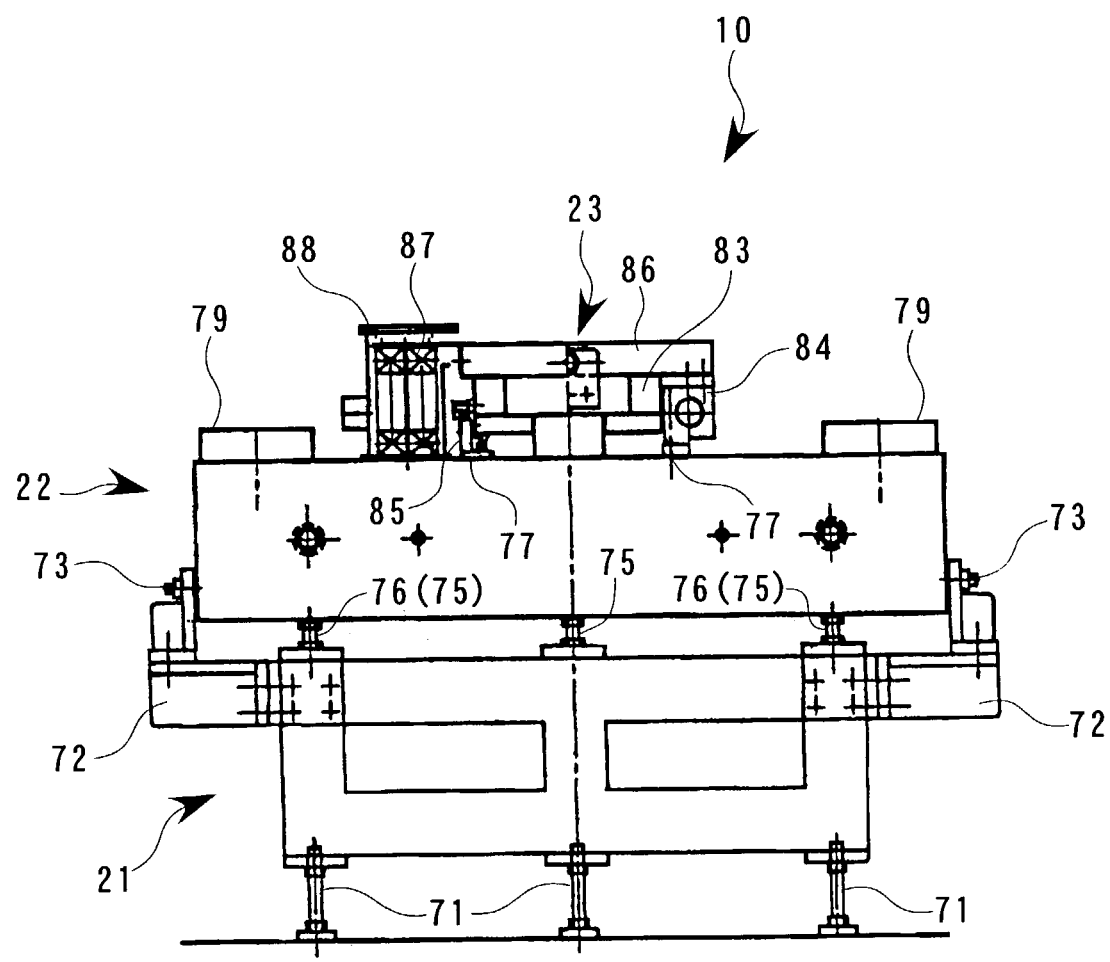
FIG. 28 is a front view around the stone base of the ejection apparatus according to this invention.
Figure 30:
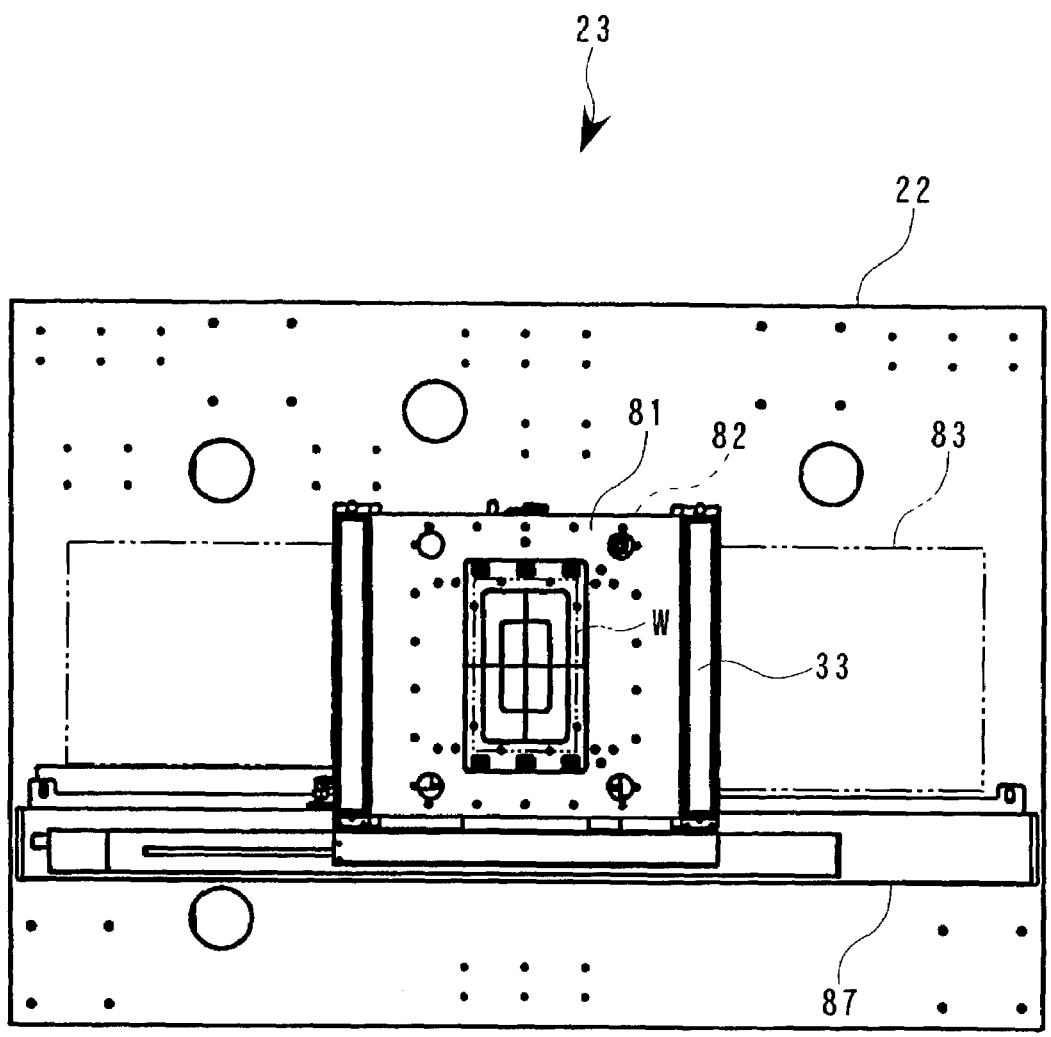
FIG. 30 is a plan view of an X-axis table of the ejection apparatus according to this invention.
Figure 31:
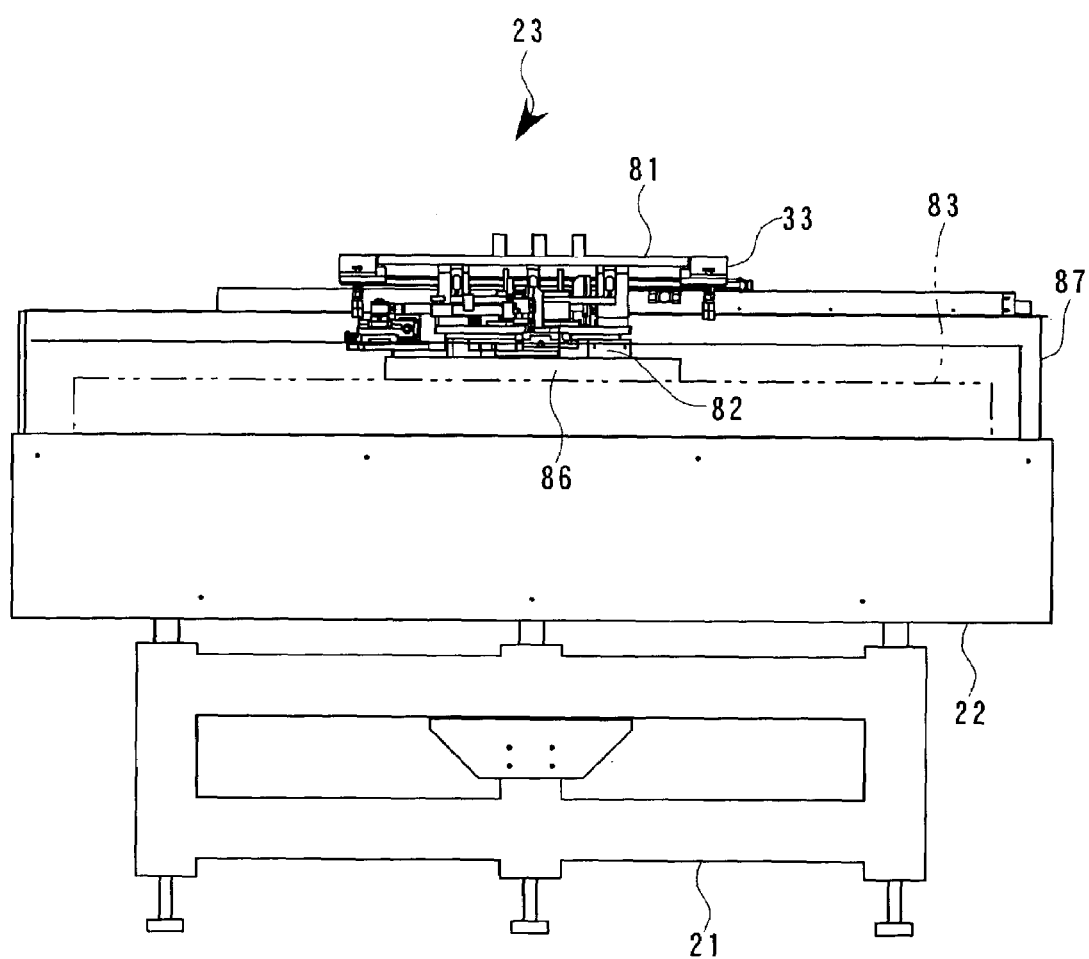
FIG. 31 is a side view of the X-axis table of the ejection apparatus according to this invention.
Figure 32:
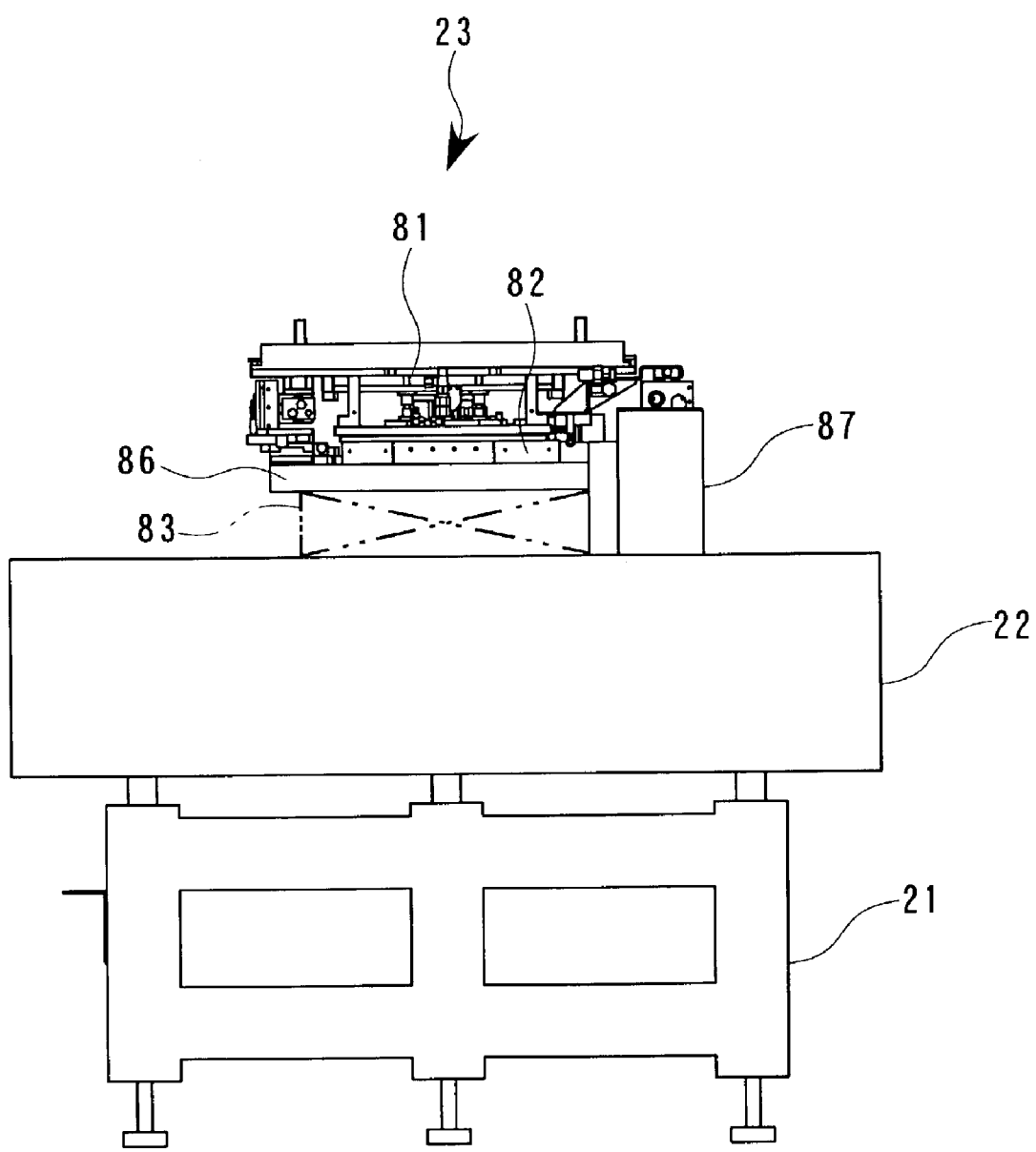
FIG. 32 is a front view of the X-axis table of the ejection apparatus according to this invention.

As shown in the X-axis moving system in FIGS. 26 through 28 and in the Θ-axis moving system in FIGS. 30 through 32, the X-axis table 23 extends along the long sides of the stone base 22 and is made up of: a suction table 81 which sucks the substrate W in position by air suction; a Θ-axis table 82 which supports the suction table 81 (see FIGS. 30 through 32); an X-axis air slider 83 which supports the Θ-axis table 82 in a manner slidable in the X-axis direction; an X-axis linear motor 84 which moves the substrate W on the suction table 81 in the X-axis direction through the Θ-axis table 82; and an X-axis linear scale 85 which is provided in line with the X-axis air slider 83 (see FIGS. 26 through 29).

The X-axis linear motor 84 is positioned on that side of the X-axis air slider 83 from which the head unit 26 is transported, and the X-axis linear scale 85 is positioned on that side of the X-axis air slider 83 on which the auxiliary apparatus 11 is disposed, and the X-axis air slider 83 and the X-axis linear scale 85 are disposed in parallel with each other. The X-axis linear motor 84, the X-axis air slider 83 and the X-axis linear scale 85 are directly supported on the stone base 22. The suction table 81 has connected thereto a vacuum pipe (not illustrated) which is in communication with the above-described vacuum suction apparatus 15. The substrate W which is set in position by the air suction is held by suction in order to maintain its flatness.

The X-axis linear scale 85 has, on the side of the auxiliary apparatus 11, an X-axis flexible cable bundler 87 in parallel with the linear scale 84 in a state in which it is contained in a box 88 on the stone base 22. The X-axis flexible cable bundler 87 contains therein vacuum pipes for the suction table 81, cables for the Θ-axis table 82, or the like, so that they follow the movement of the suction table 81 and the Θ-axis table 82 (see FIGS. 27 and 28).

The X-axis table 23 constituted as described above is operated by the driving of the X-axis linear motor 84 such that the suction table 81 having sucked thereto the substrate W and the Θ-axis table 82 are moved in the X-axis direction guided by the X-axis air slider 83. In the reciprocating movements in the X-axis direction, the relative main scanning of the function liquid droplet ejection heads 7 is carried out by the forward movement from the side of transportation of the substrate toward the inner side. In addition, based on the result of recognition by the main substrate recognition camera 90 (to be described in detail hereinafter), the Θ-axis correction (angular correction within the horizontal plane) of the substrate W is carried out by the Θ-axis table 82.

Figure 33:
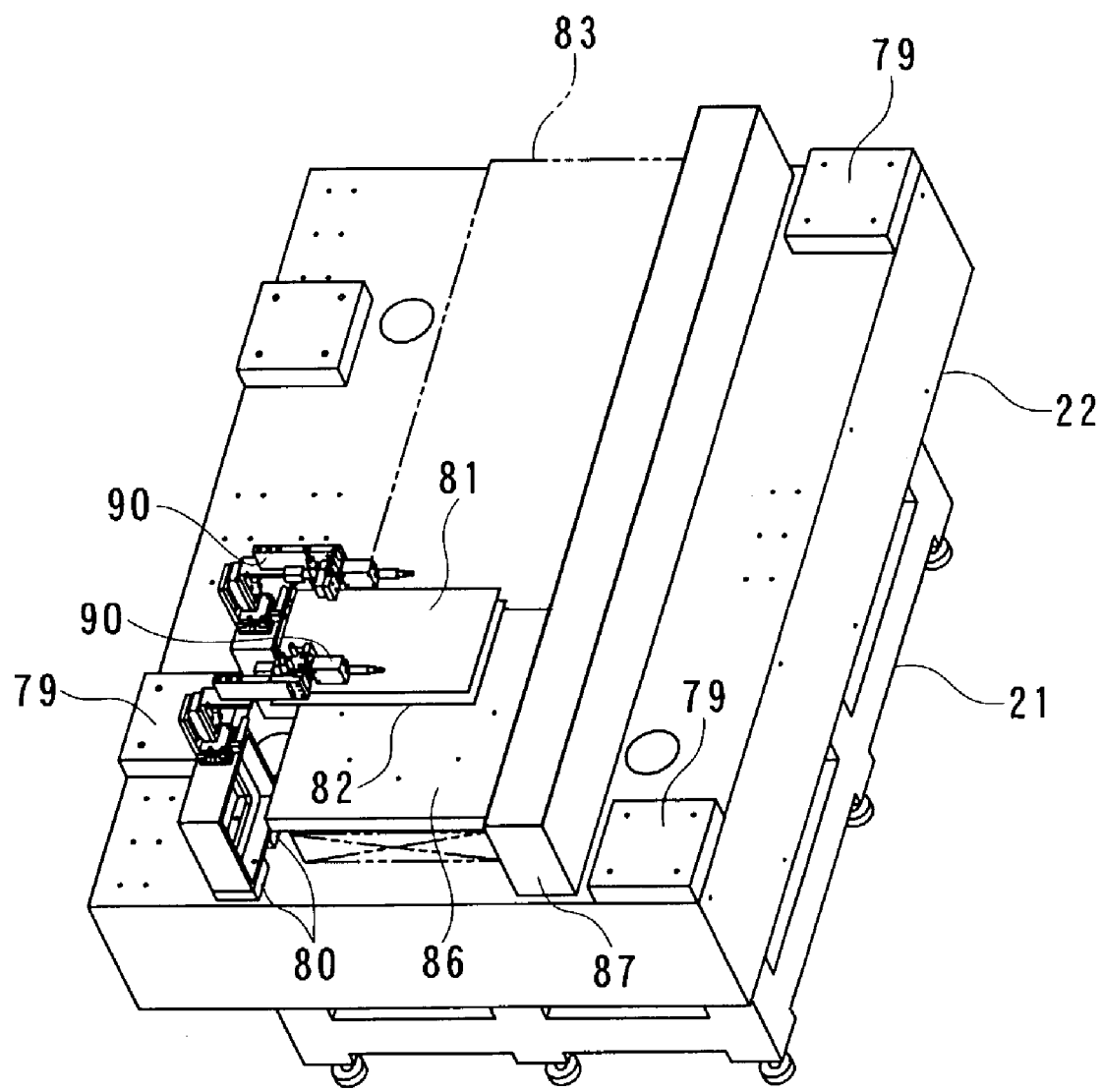
FIG. 33 is a perspective view around a main substrate recognition camera of the ejection apparatus according to this invention.

FIG. 33 shows the main substrate recognition camera. As shown therein, there are disposed a pair of main substrate recognition cameras 90, 90 right above the suction table 81 so as to face the position in which the substrate is transported (receiving and handover position). The pair of main substrate recognition cameras 90, 90 are arranged to simultaneously carry out the image-wise recognition (recognition by means of an image) of the two reference positions of the substrate.

Figure 34:
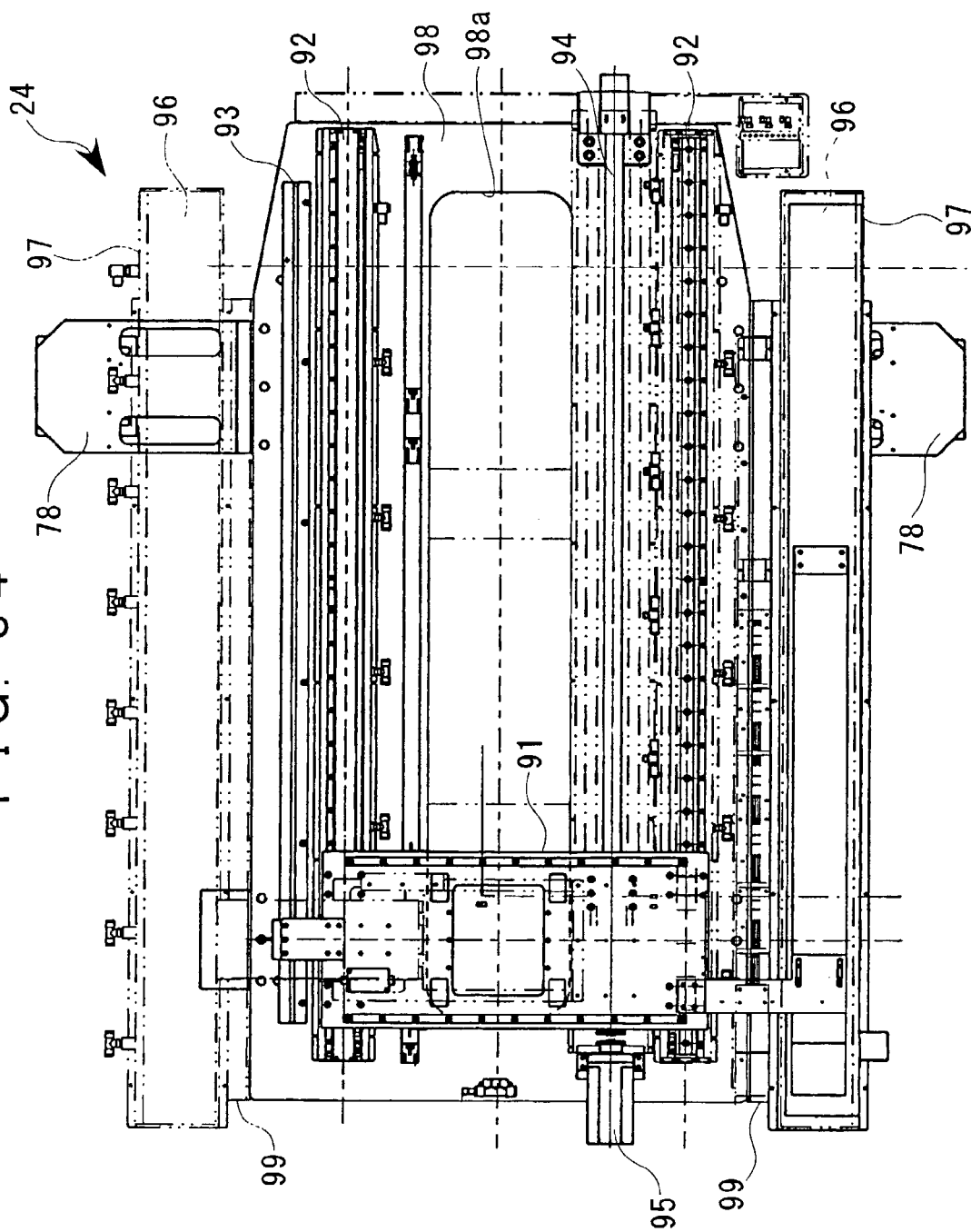
FIG. 34 is a plan view of a Y-axis table of the ejection apparatus according to this invention.
Figure 35:
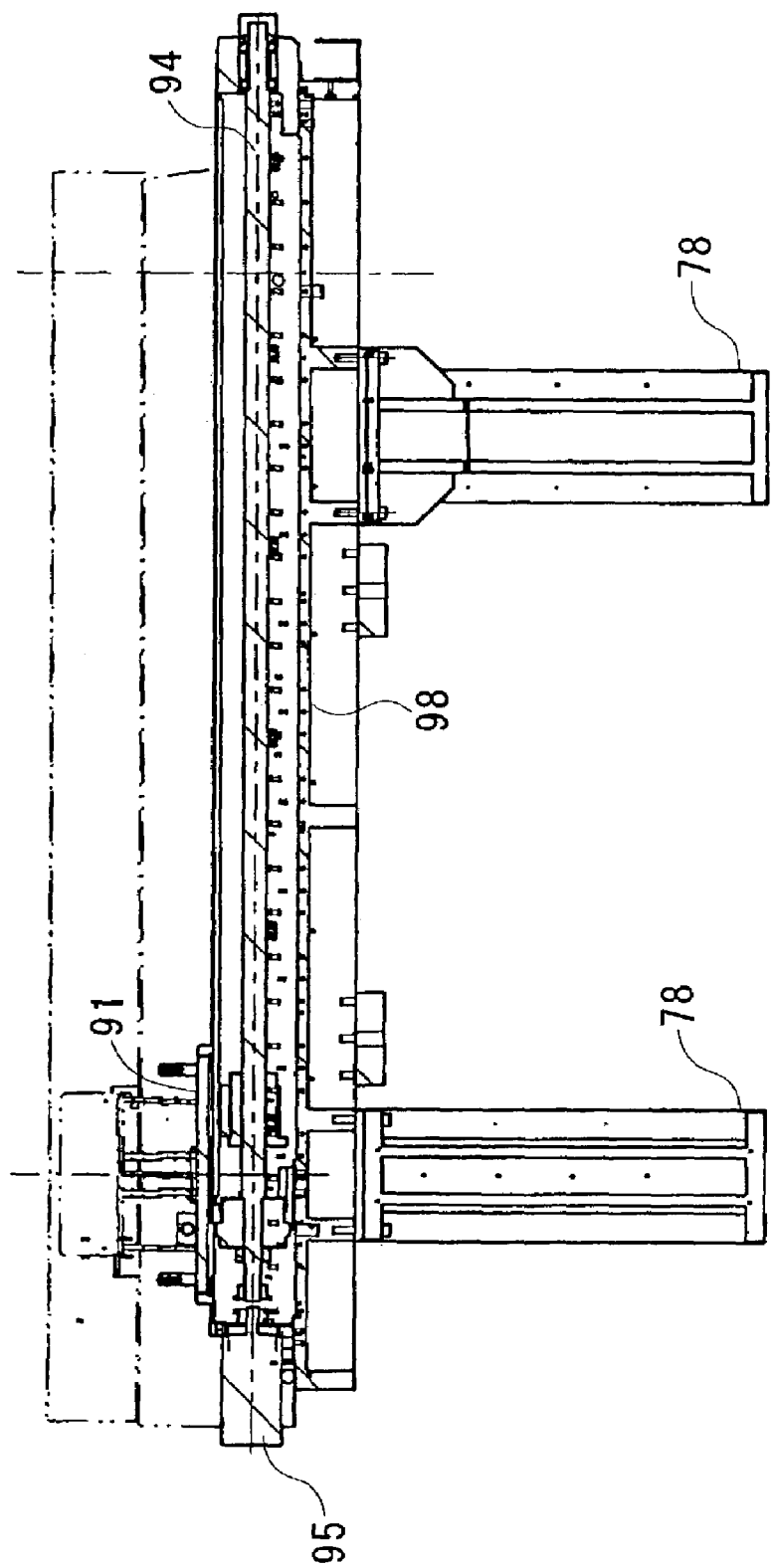
FIG. 35 is a side view of the Y-axis table of the ejection apparatus according to this invention.
Figure 36:
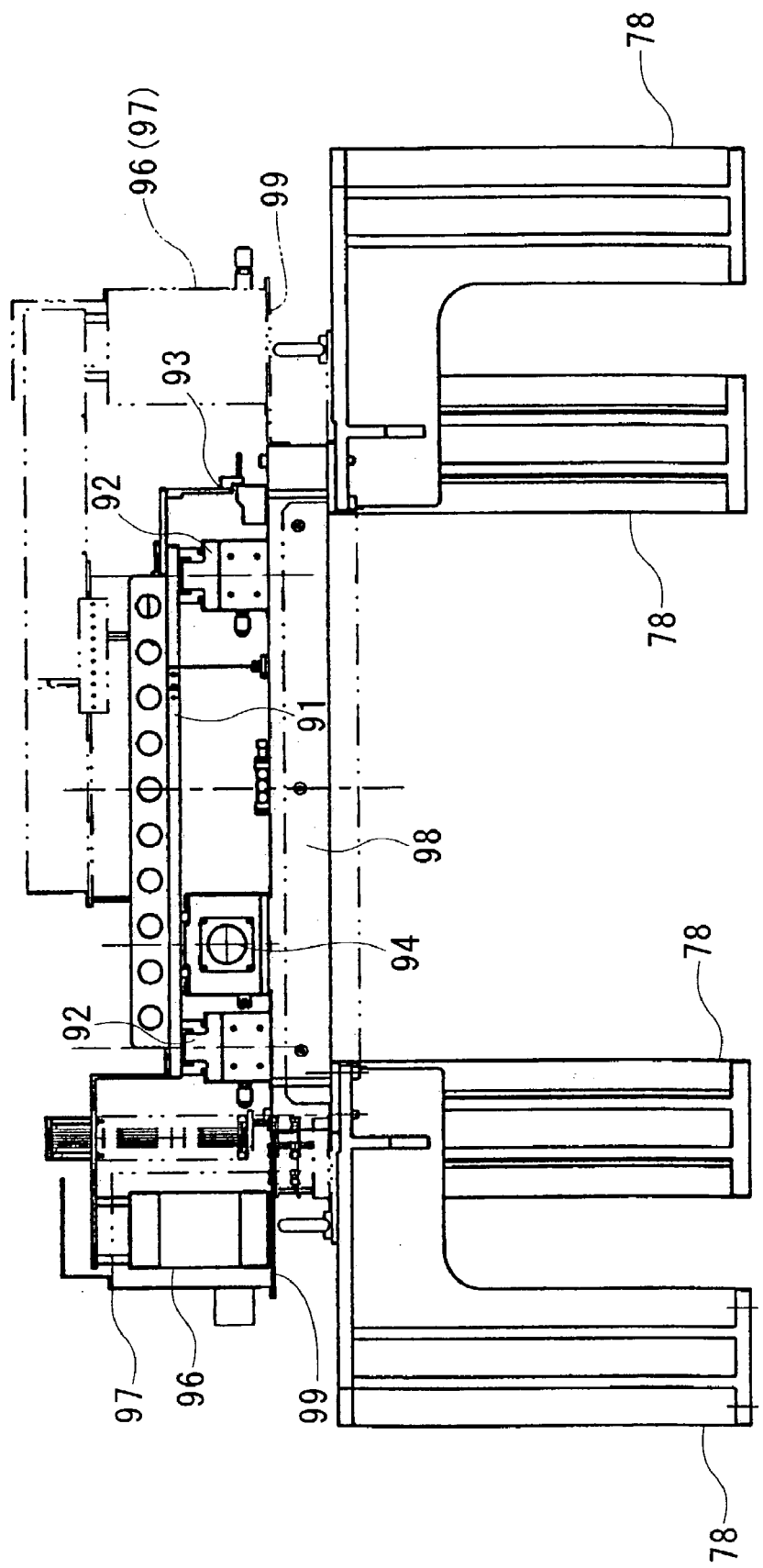
FIG. 36 is a front view of the Y-axis table of the ejection apparatus according to this invention.

As shown in FIGS. 34, 35 and 36, the Y-axis table 24 extends along the short sides of the stone base 22 and is made up of: a bridge plate 91 which suspends the main carriage 25; a pair of Y-axis sliders 92, 92 which support the bridge plate 91 on both ends so as to be slidable in the Y-axis direction; a Y-axis linear scale 93 which is provided in parallel with the Y-axis slider 92; a Y-axis ball screw 94 which moves the bridge plate 92 in the Y-axis direction guided by the pair of Y-axis sliders 92, 92; and a Y-axis motor 95 which rotates the Y-axis ball screw in one direction and in the opposite direction of rotation. A pair of Y-axis flexible cable bundlers 96, 96 are disposed in a manner respectively housed in boxes 97, 97.

The Y-axis motor 95 is constituted by a servo motor. When the Y-axis motor 95 rotates in one direction and in the opposite direction of rotation, the bridge plate 91 which is in screwed engagement therewith through the Y-axis ball screw 94 moves in the Y-axis direction with the pair of the Y-axis sliders 92, 92 serving as the guides. In other words, accompanied by the movement of the bridge plate 91 in the Y-axis direction, the main carriage 25 moves in the Y-axis direction. In the back and forth movements of the main carriage 25 (head unit 26) in the Y-axis direction, the sub-scanning by the function liquid droplet ejection heads 7 is carried out in the forward movement from the home position toward the auxiliary apparatus 11.

On the four supporting columns 78 there are supported thereon a mounting-base plate 98 with the moving path portion of the main carriage 25 forming a rectangular opening 98a. On the mounting-base plate 98 there are disposed the pair of Y-axis sliders 92, 92 to stand clear of the rectangular opening 98a, and the Y-axis ball screw 94 in parallel with each other. On a pair of supporting plates 99, 99 which extend outward from the mounting-base plate 98, there are placed the above-described pair of Y-axis flexible cable bundlers 96, 96 together with the boxes 97, 97 therefor.

The Y-axis flexible cable bundler 96 on the side of transporting the substrate houses therein the cables which are mainly connected to the head unit 26. The Y-axis flexible cable bundler on the opposite side houses therein those pipes for the function liquid droplet which are mainly connected to the head unit 26 (both not illustrated). These cables and pipes are connected to the plurality of function liquid droplet ejection heads 7 in the head unit 26 through the bridge plate 91.

Figure 37:
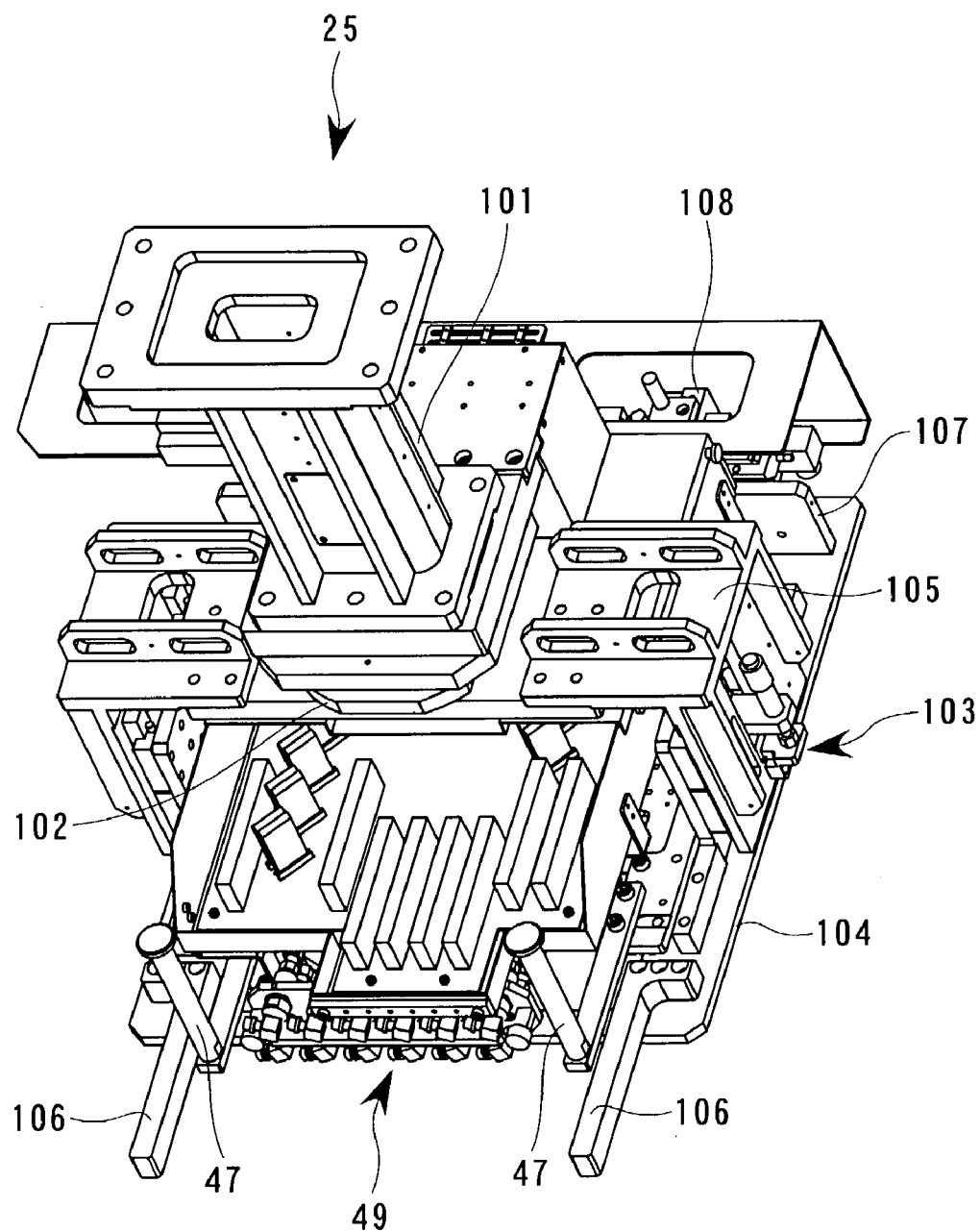
FIG. 37 is a perspective view of a main carriage of the Y-axis table according to this invention.
Figure 38:
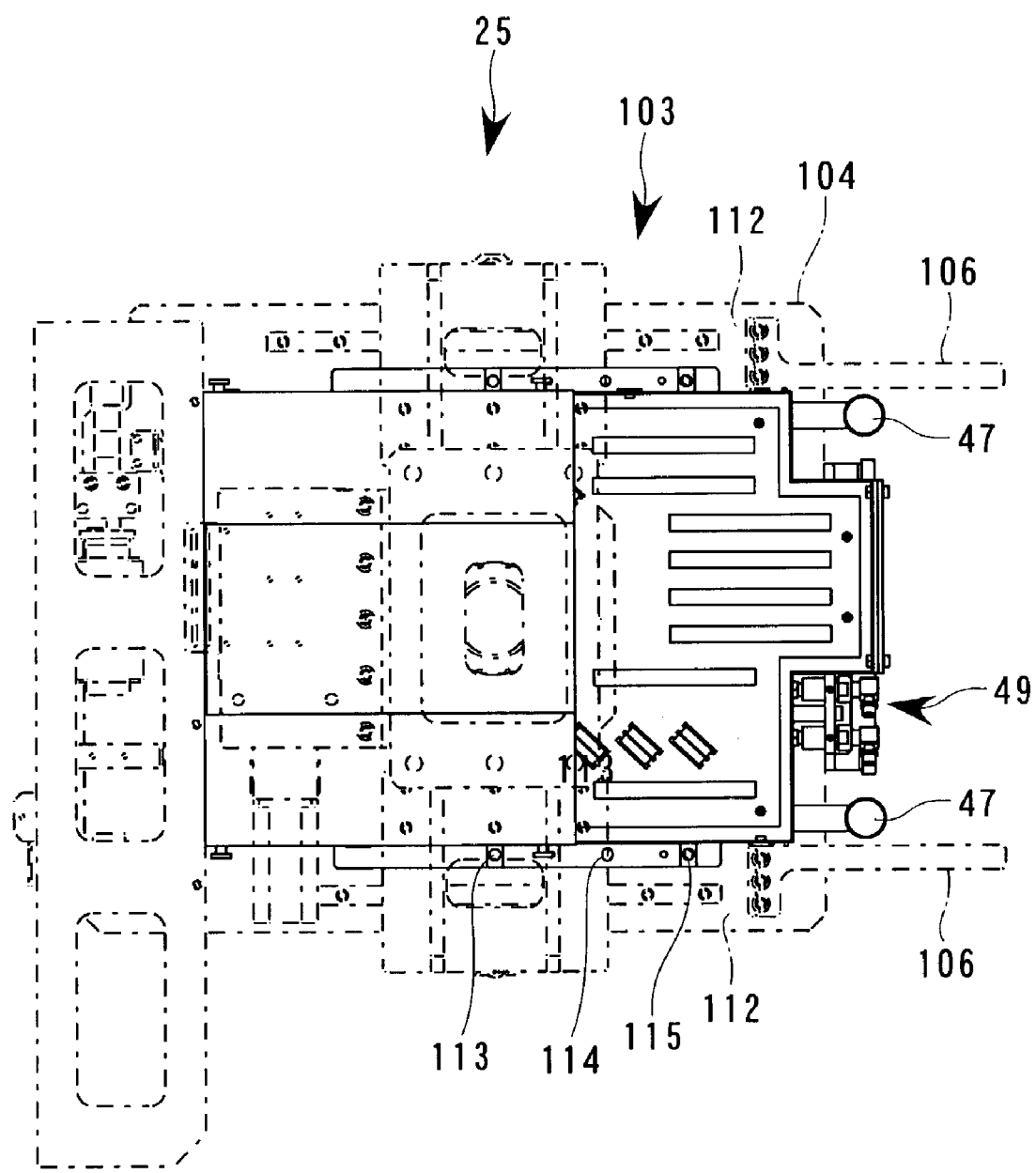
FIG. 38 is a plan view of the main carriage of the Y-axis table according to this invention.
Figure 39:
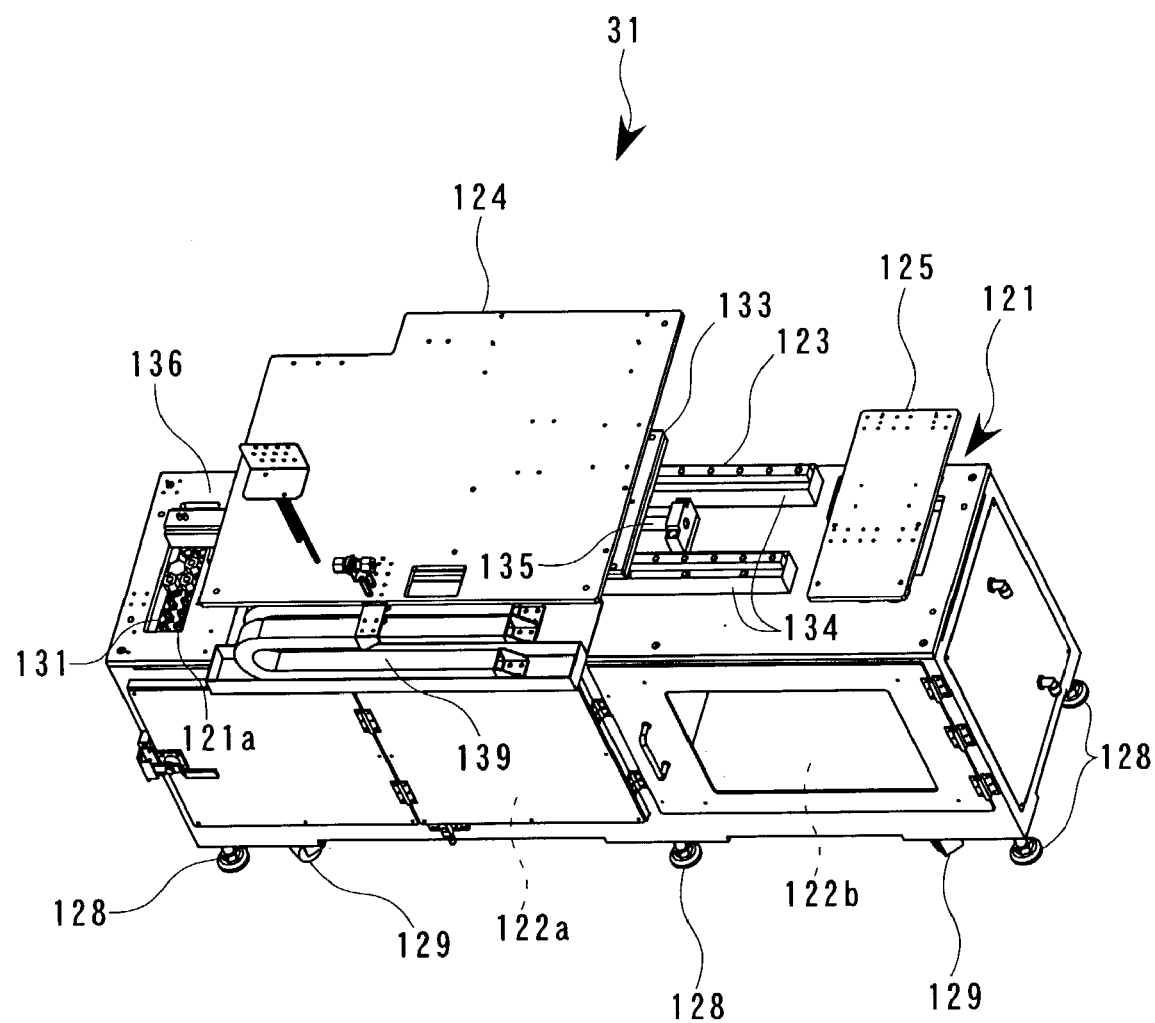
FIG. 39 is a perspective view of a common machine base of the ejection apparatus according to this invention.
Figure 40:
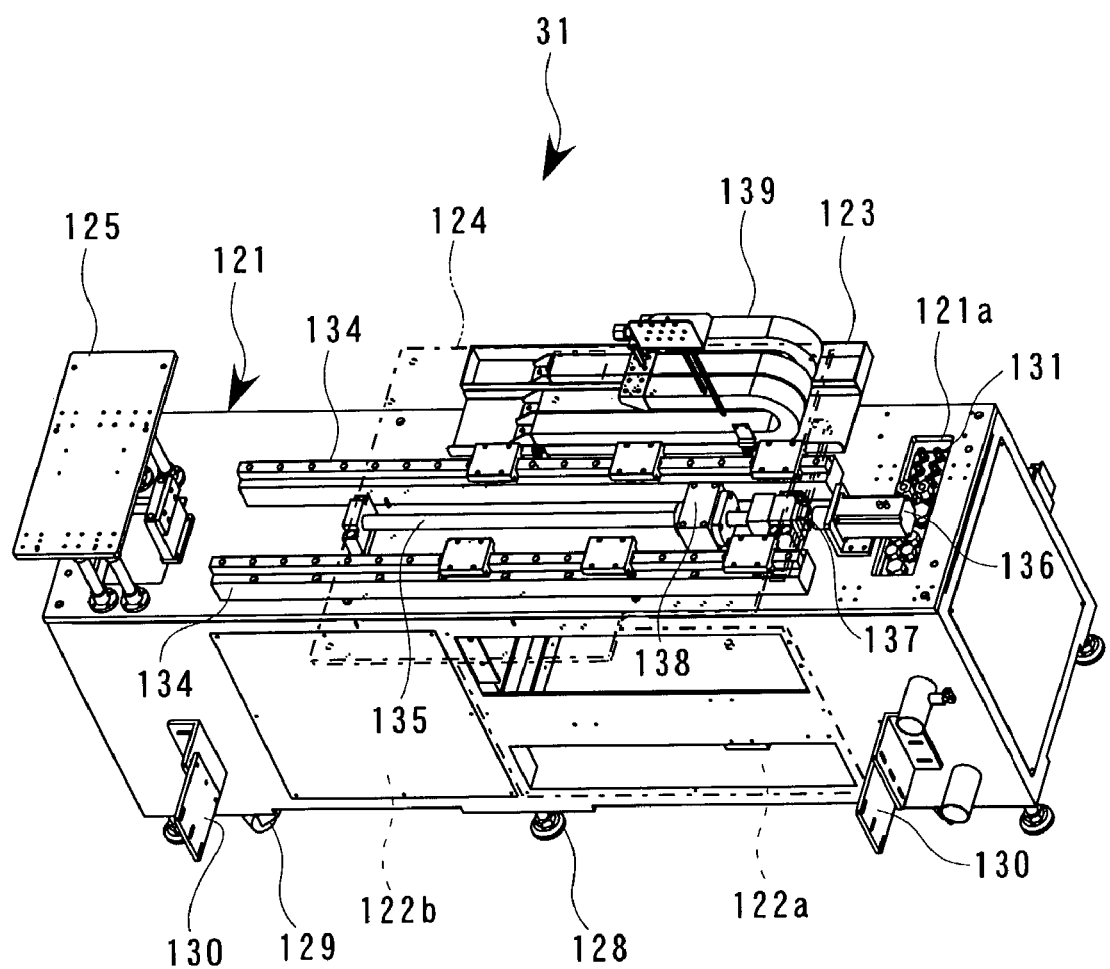
FIG. 40 is a perspective view of the common machine base of the ejection apparatus according to this invention in a state in which the common base has been removed.
Figure 41:
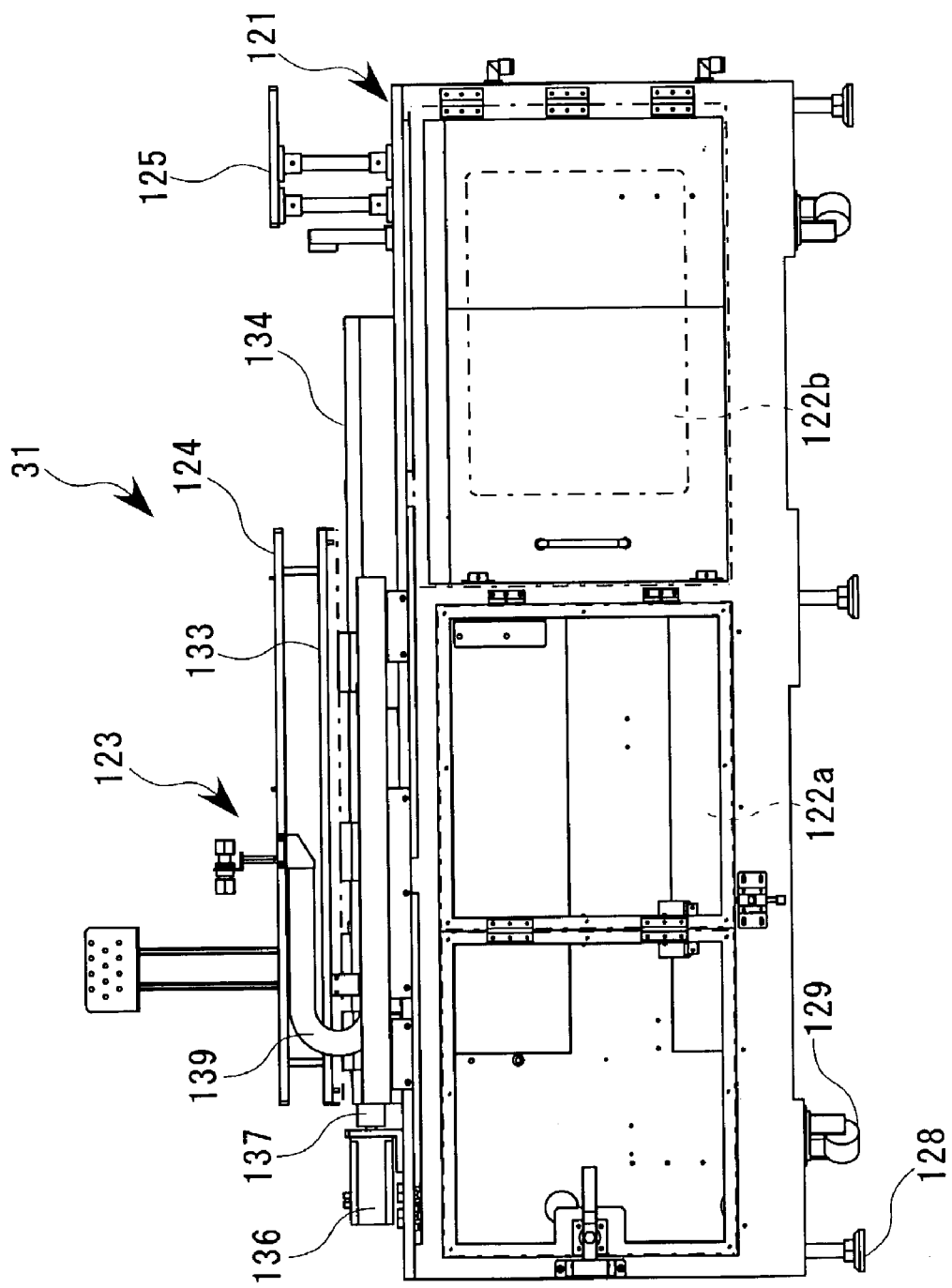
FIG. 41 is a side view of the common machine base of the ejection apparatus according to this invention.
Figure 42:
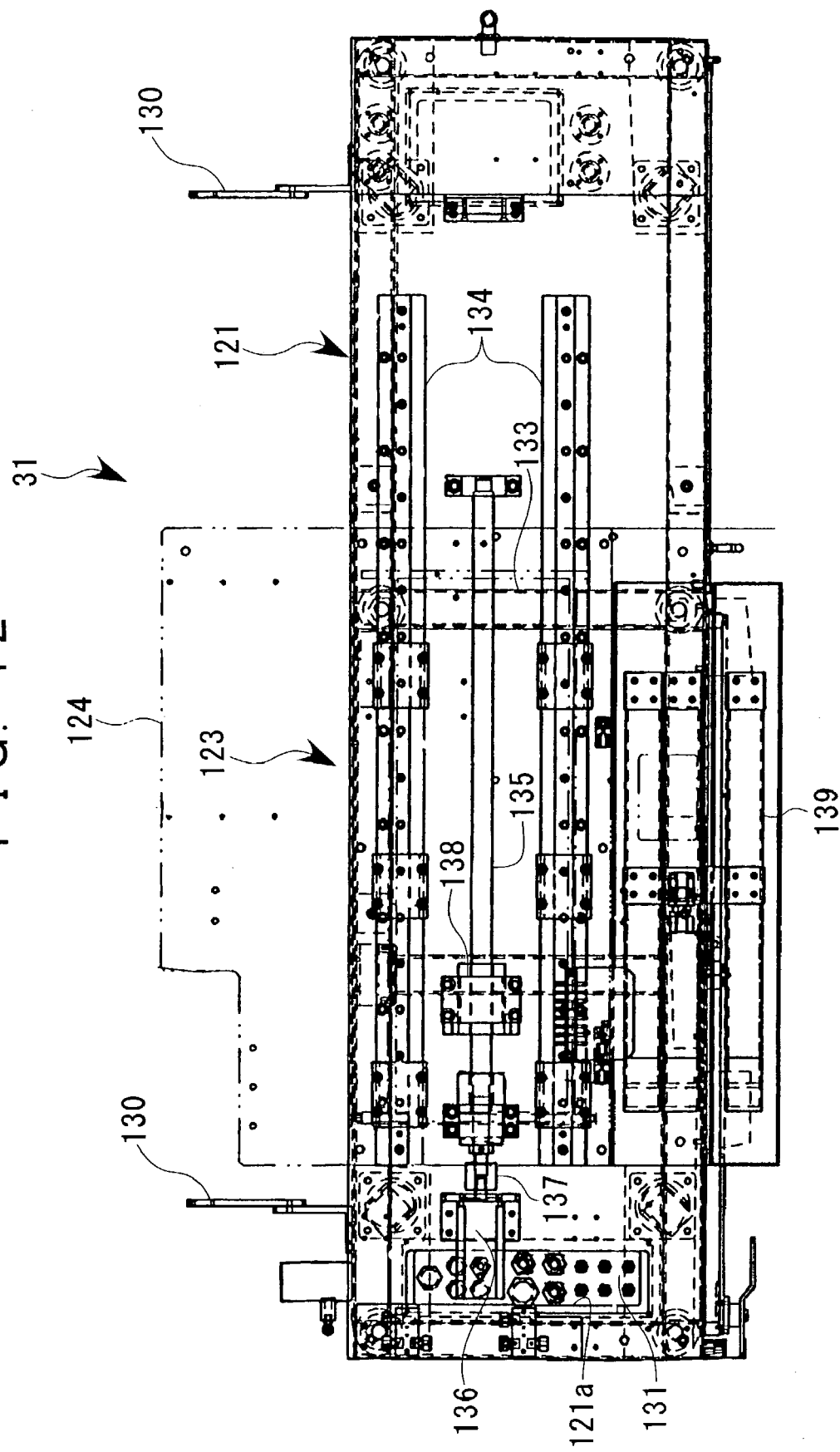
FIG. 42 is a plan view of the common machine base of the ejection apparatus according to this invention.

As shown in FIGS. 37 and 38, the main carriage 25 is made up of: a suspending member 101 which is fixed to the bridge plate 91 from the bottom side and which is of I-shape in external appearance; a Θ-axis table 102 which is attached to the lower surface of the suspending member 101; and a carriage main body 103 which is attached to the lower surface of the Θ-axis table 102 in a suspended manner. This suspending member 101 faces the rectangular opening 98a of the mounting-base plate 98.

The carriage main body 103 is made up of: a base plate 104 on which the head unit 26 is seated; an arch (portal) member 105 which supports the base plate 104 in a suspended manner; a pair of provisional placing L-shaped (angular) members 106, 106 which are provided so as to protrude from one end of the base plate 104; and a stopper plate 107 which is provided at the other end of the base plate 104. On an outside of the stopper plate 107 there are disposed a pair of the above-described subsidiary substrate recognition cameras 108 which recognize the substrate W.

The base plate 104 has formed therein a rectangular opening 111 into which the main body plate 44 of the head unit 26 is loosely fitted. Each left and right opening edge portion 112 of the base plate 104, which forms the rectangular opening 111, is provided with bolt holes 113, 113, two penetrating holes 114, 114, and positioning pins 115 which are used for positioning and fixing the head unit 26.

Into the main carriage 25 which is constituted as described above, the head unit 26 is transported and set in position by holding it with both the handles 47, 47. Namely, the transported head unit 26 is once placed on both the provisional placing L-shaped members 106, 106 (provisional placing). Then, the pipes which are in communication with the functional liquid supply and recovery apparatus 13 which is disposed on the bridge plate 91 are connected to the pipe connection assembly 49 of the head unit 26, and is also the cables of the control system are connected to the cable connection assembly 50. Then, by holding both the handles 47, 47 again, the head unit 26 is pushed forward with both the provisional placing L-shaped members 106, 106 serving as guides. The head unit 26 is thus set in position into the left and right opening edges 112, 112 of the base plate 104.

A description will now be made about the common machine base 31. As shown in FIGS. 39 through 42, the common machine base 31 is made up of: a machine base main body 121 in which two containing rooms, i.e., a large containing room 122a and a small containing room 122b, are formed with a partition wall therebetween; a movable table 123 which is provided on the machine base main body 121; a common base 124 which is fixed to the movable table 123; and a tank base 125 which is provided in an end position away from the movable table 123 on the machine base main body 121. The common base 124 has mounted thereon the cleaning unit 34 and the wiping unit 35. The tank base 125 has mounted thereon a liquid supply tank 126 for the function liquid supply and recovery apparatus 13 which is described in detail hereinafter.

On a lower surface of the machine base main body 121 there are provided six supporting legs 128 with adjusting bolts, as well as four casters 129. On that side of the machine base main body 121 which lies on the liquid droplet ejection apparatus 10, there are provided a pair of connection brackets 130, 130 for connection to the supporting rack 21 of the liquid droplet ejection head 10. According to this arrangement, the liquid droplet ejection apparatus 10 and the auxiliary apparatus 11 (common machine base 31) can be integrated, and the auxiliary apparatus 11 can be separated and moved depending on necessity.

The small containing room 122b of the machine base main body 121 contains therein the main portions of the air supply apparatus 14 and the vacuum suction apparatus 15, and the large containing room 122a contains therein the tanks, or the like, of the function liquid supply and recovery apparatus 13. The coupling groups 131 for connection to these tank groups face the rectangular opening 121a which is formed in the upper surface of the end portion of the machine base main body 121 (see left end in FIG. 42). A waste liquid pump 152 (to be described in detail hereinafter) is provided in a position near the rectangular opening 121a.

The movable table 123 extends along the longitudinal direction of the machine base main body 121 and is made up of: a rectangular table 133 which supports the common base 124; a pair of movable sliders 134, 134 which slidably support the rectangular table 133; a ball screw 135 which is disposed between the pair of the movable sliders 134, 134; and a moving motor 136 for rotating the ball screw 135 in one direction and in the opposite direction of rotation. The moving motor 136 is connected to an end of the ball screw 135 through a coupling 137, and the rectangular table 133 is engaged with the ball screw 135 in a screwed manner through a female spool 138. According to this arrangement, when the moving motor 136 is rotated in one direction and in the opposite direction of rotation, the rectangular table 133 and the common base 124 move back and forth in the X-axis direction through the ball screw 135.

The moving table 123 moves the cleaning unit 34 and the wiping unit 35 which are disposed on the common base 124. When the moving table 123 is driven, the head unit 26 is in a position right above the cleaning unit 34 by means of the Y-axis table 24. Once the cleaning unit 34 has sucked the function liquid in close contact with the plurality of function liquid droplet ejection heads 7 of the head unit 26, the nozzle forming surface 67 of each of the function liquid droplet ejection heads 7 gets contaminated or stained. Therefore, the wiping unit 35 comes close to the plurality of function liquid droplet ejection heads 7 by means of the moving table 123 and operates to wipe out the contamination on the nozzle forming surface 67 (details of this operation will be described hereinafter).

On a side of the moving table 123 there is disposed a flexible cable bundler 139. This flexible cable bundler 139 is fixed to the upper surface of the common machine base 31 and the front end thereof is fixed to the common base 124; it contains therein the cables, air pipes, cleaning pipes, pipes for the waste liquid (to be reused), or the like (not illustrated; cleaning is described in detail hereinafter).

With reference to FIGS. 43 through 46, a description will now be made about the function liquid supply and recovery apparatus 13. As shown in the piping diagram in FIG. 43, the function liquid supply and recovery apparatus 13 is made up of: a function liquid supply system 141 which supplies each of the function liquid droplet ejection heads 7 of the head unit 26 with the function liquid; a function liquid recovery system 142 which recovers the function liquid that has been sucked by the cleaning unit 34; a cleaning liquid supply system 143 which supplies the solvent of the function liquid for the purpose of cleaning; and a waste liquid recovery system 144 which recovers the waste liquid of the function liquid from the flushing unit 33.

Figure 44:
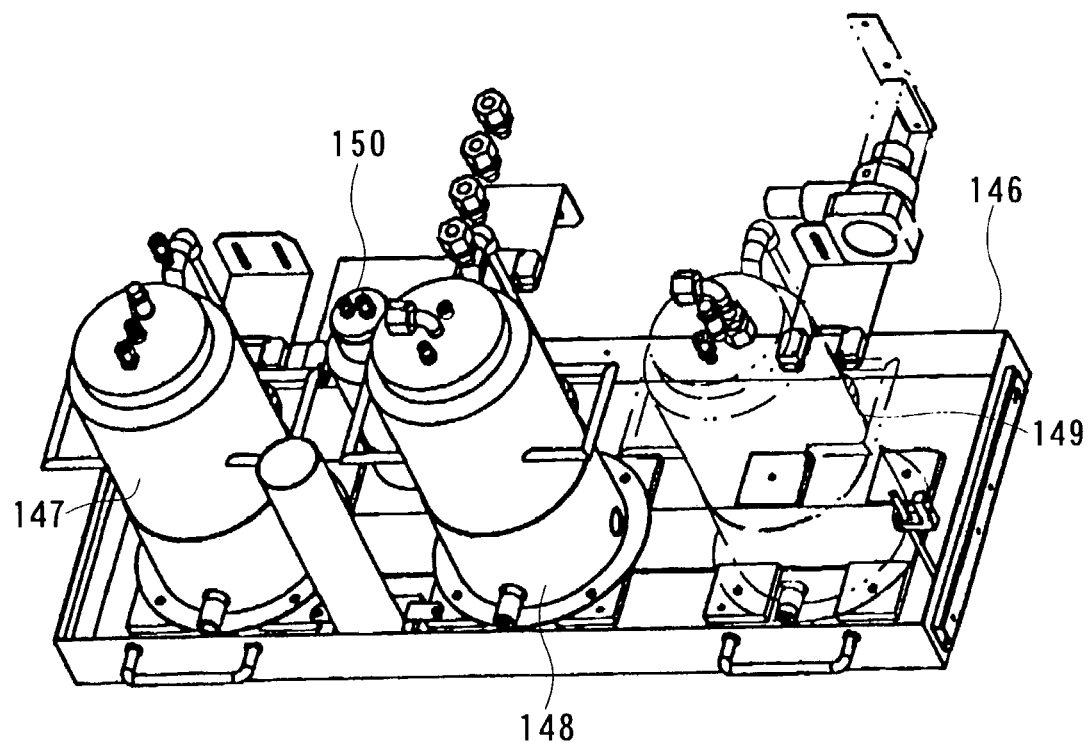
FIG. 44 is a perspective view around pumps of the liquid supply and recovery apparatus according to this invention.
Figure 45:
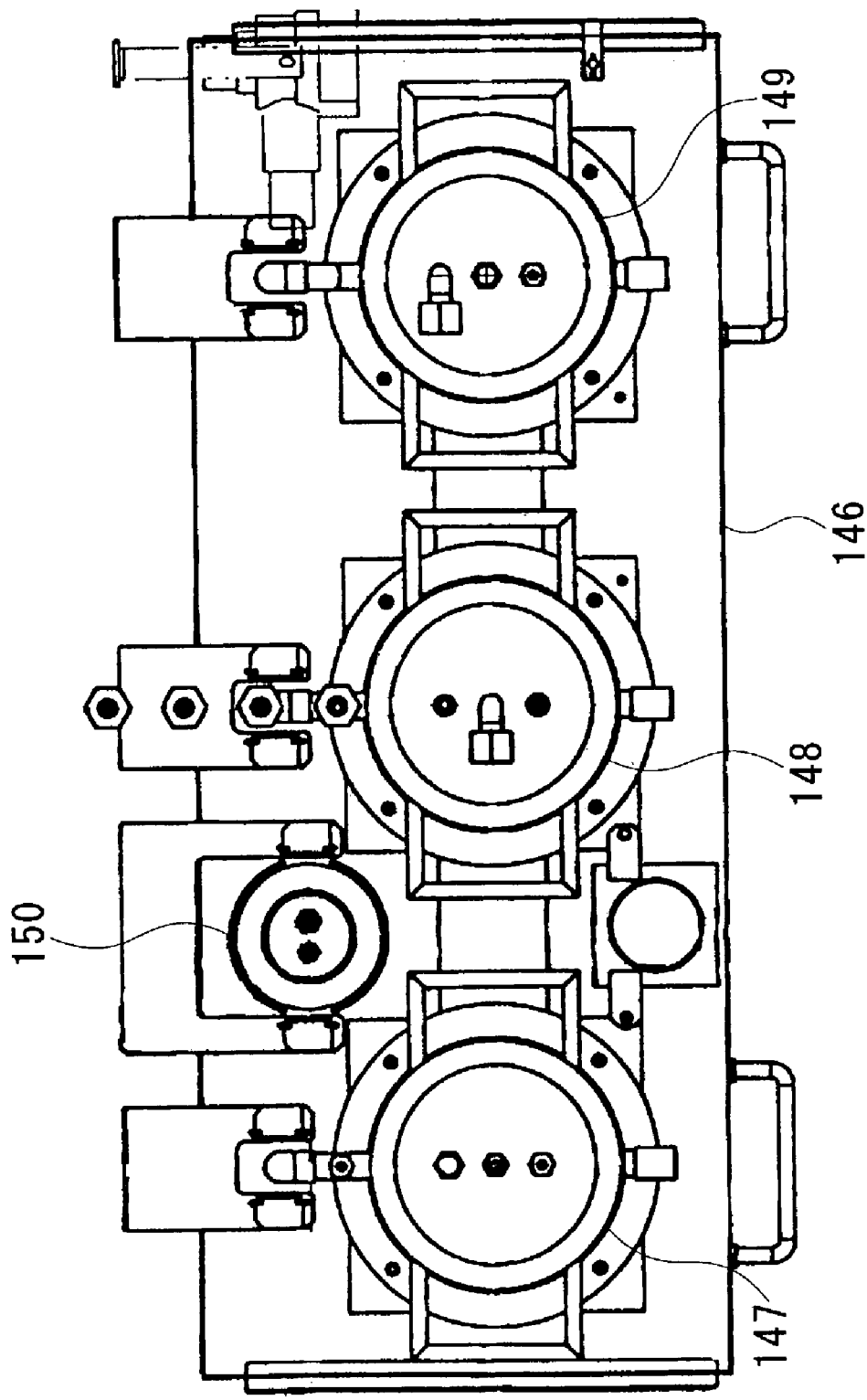
FIG. 45 is a plan view around the pumps of the liquid supply and recovery apparatus according to this invention.

FIGS. 44 and 45 show the tank groups which are contained inside the large containing room 122a in the common machine base 31. A plurality of tank groups are mounted on a liquid-proof pan 146 of a drawer type. On the liquid-proof pan 146 there are laterally disposed, as seen from the left in the figure, a cleaning tank 147 for the cleaning liquid supply system 143, a reusing tank 148 for the function liquid recovery system 142, and a pressurizing tank 149 for the function liquid supply system 141, which constitute the tank groups. A waste liquid tank 150, which is formed into a small size, for the waste liquid recovery system 144 is disposed near the cleaning tank 147 and the reusing tank 148.

Figure 43:
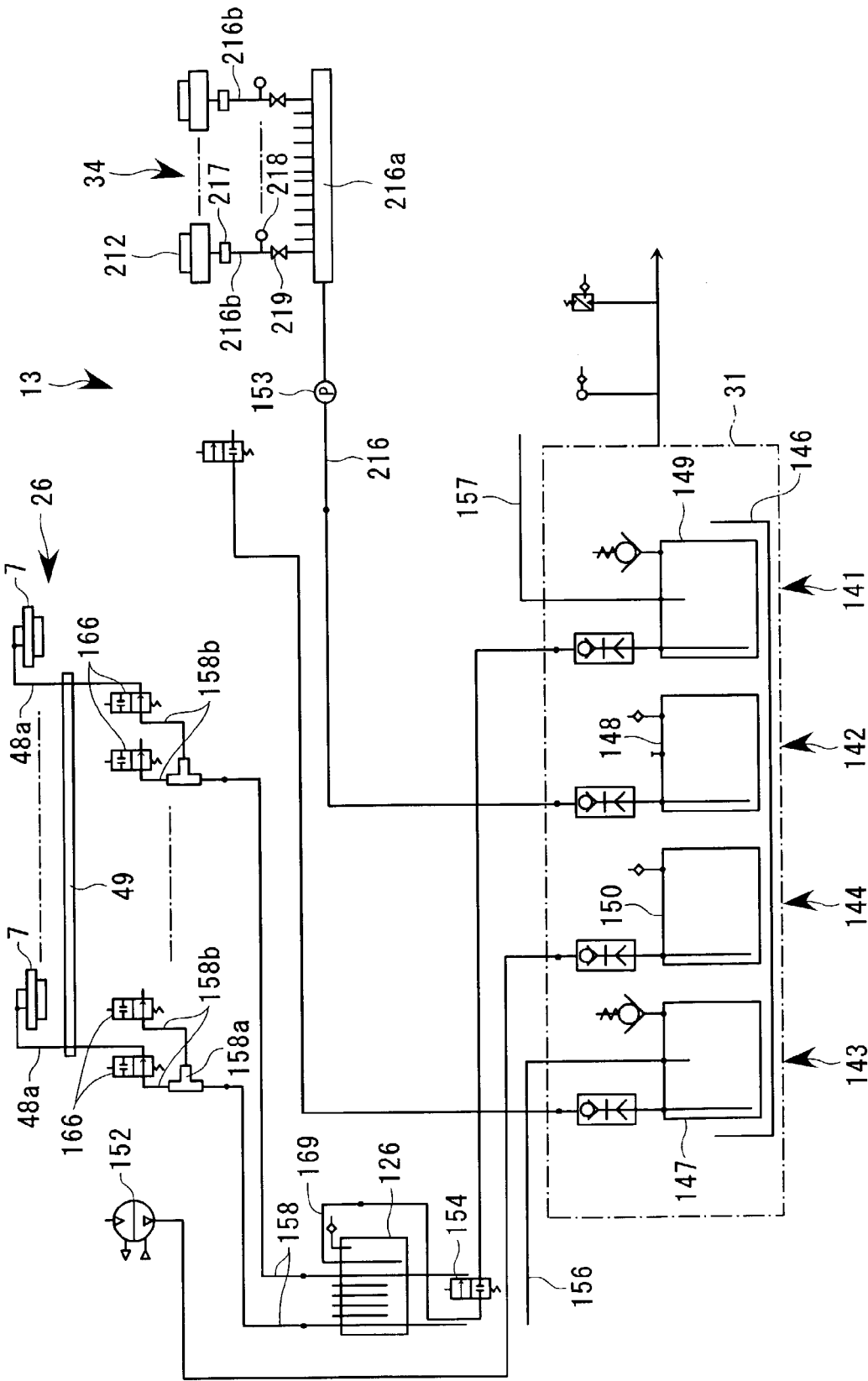
FIG. 43 is a piping diagram of a function liquid supply and recovery apparatus of the ejection apparatus according to this invention.
Figure 46:
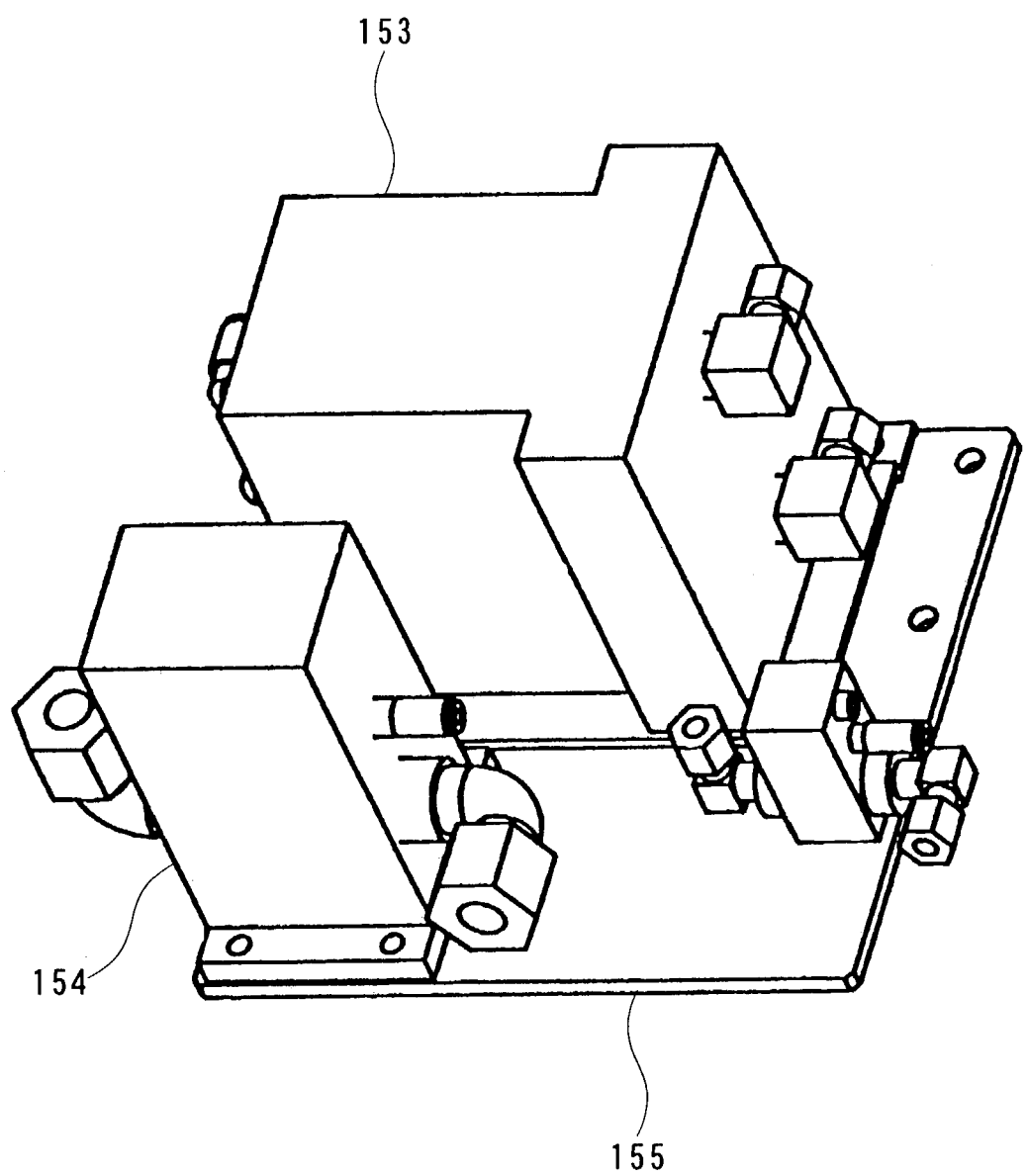
FIG. 46 is a perspective view around a waste liquid pump of the liquid supply and recovery apparatus according to this invention.

As shown in FIG. 43, the waste liquid tank 150 is connected to the flushing unit 33 through the waste liquid pump 152 and recovers back to the waste tank 150 the function liquid ejected by each of the function liquid droplet ejection heads 7 to the flushing unit 33. The reusing tank 148 is connected to the suction pump 153 of the cleaning unit 34 and recovers the function liquid as sucked by the suction pump 153 from each of the function liquid droplet ejection heads 7. As shown in FIG. 46, the waste liquid pump 152 and a gate valve 154 on an upstream side of the liquid supply tank 126, which is described in detail hereinafter, are fixed to the supporting plate 155 and are mounted, as described hereinabove, on the upper surface of the end portion of the machine base main body 121 (see FIG. 16).

As shown in FIG. 43, the cleaning tank 147 is connected at its suction side to the air supply apparatus 14 and is connected at its delivery or discharge side to atomizing nozzles (to be described in detail hereinafter) 195 of the cleaning liquid atomizing head of the wiping unit 35. Namely, the cleaning tank 147 supplies the cleaning liquid inside thereof to the cleaning liquid atomizing head 195 under pressure by the compressed air to be introduced from the air supply apparatus 14. Although the details are described hereinafter, the cleaning liquid ejected out of the cleaning liquid atomizing head 195 is impregnated into a wiping sheet 182 which is to wipe out the function liquid droplet ejection heads 7.

The pressurizing tank 149 has connected thereto a pressurizing pipe 157 which is communicated with the air supply apparatus 14. The delivery side of the pressurizing tank 149 is connected to the liquid supply tank 126 of the function liquid supply system 141. In other words, the pressurizing tank 149 is a main tank for the liquid material. The liquid material inside the pressurizing tank 149 is send under pressure to the liquid supply tank 126 by the pressurized air to be introduced from the air supply apparatus 14.

Figure 47:
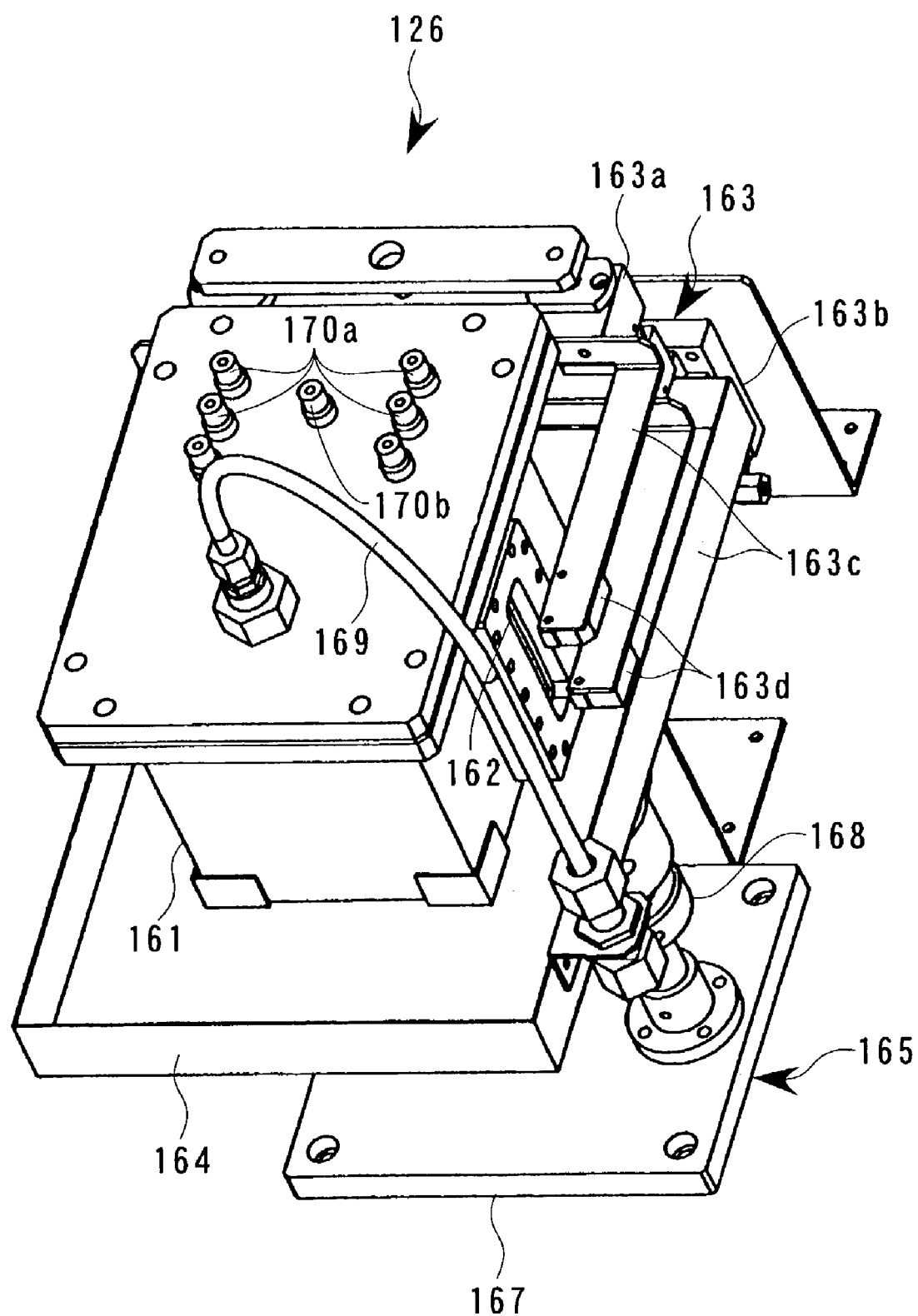
FIG. 47 is a perspective view of a liquid supply tank of the liquid supply and recovery apparatus according to this invention.
Figure 49:
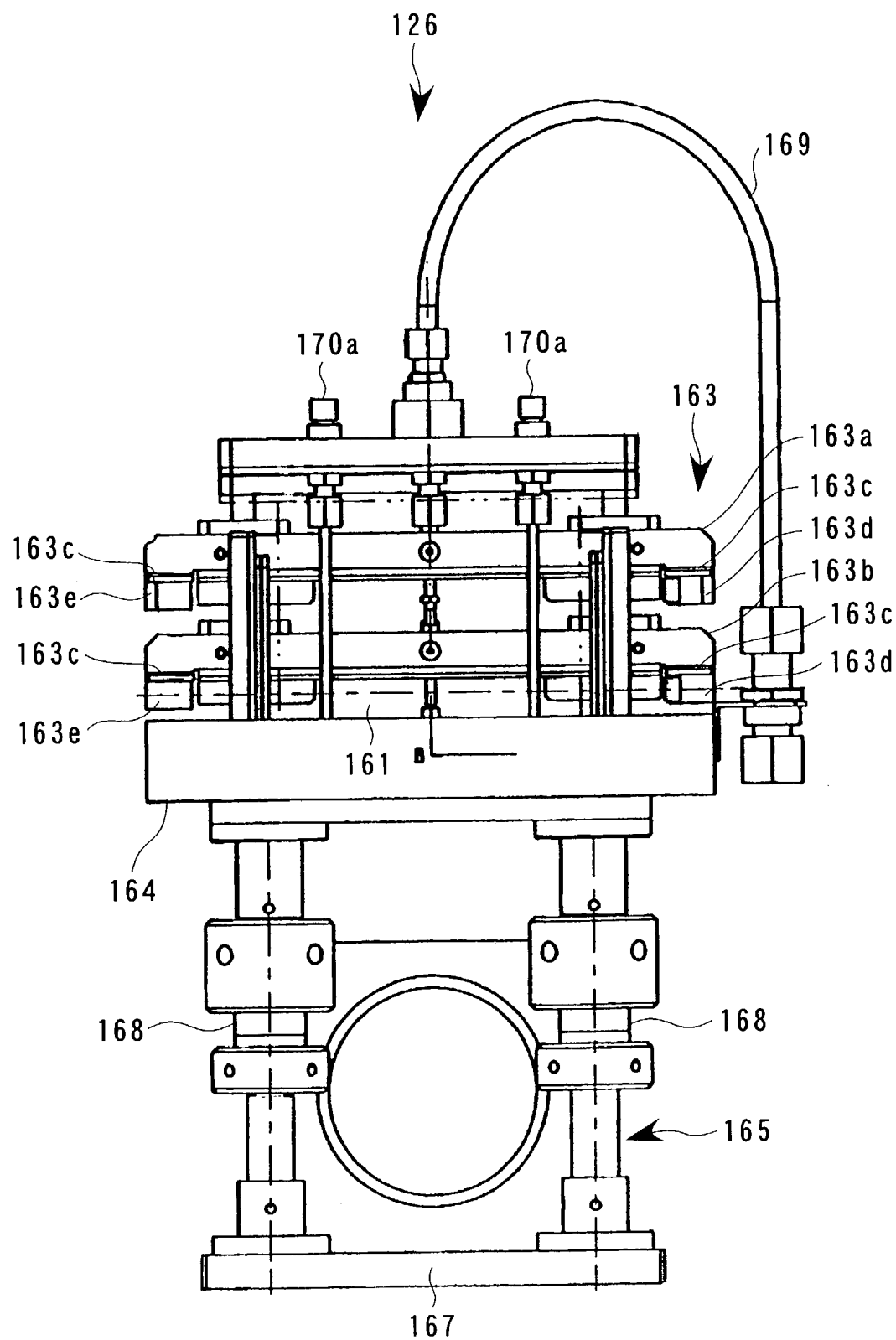
FIG. 49 is a front view of the liquid supply tank of the liquid supply and recovery apparatus according to this invention.

FIGS. 47 through 49 show the liquid supply tank 126. The liquid supply tank 126 is fixed to the tank base 125 and is made up of: a rectangular tank main body 161 which is provided with a liquid level peep hole 162 on each side and is closed by a flange; a liquid level detector 163 which faces both the liquid level peep holes 162, 162 for detecting the liquid level of the function liquid; a pan 164 on which the tank main body 161 is placed; and a tank stand 165 which supports the tank main body 161 through the pan 164.

The tank stand 165 is made up of an attaching plate 167 and two supporting column-like members 168, 168 which are vertically provided on the attaching plate 167. It is thus so arranged that the height and the level of the tank main body 161 can be finely adjusted by the two supporting column-like members 168. The (lid of the) upper surface of the tank main body 161 has connected thereto a supply pipe 169 which is communicated with the pressurizing tank 149. There are also provided six connectors 170a for the pipes or passages (reference numeral 158 in FIG. 43) which are communicated with the head unit 26, and a connector 170b for opening to the open air (outside air).

The liquid level detector 163 is made up of a high-liquid level detector 163a and a low-liquid level detector 163b which are disposed at a slight vertical distance from each other. The high-liquid level detector 163a and the low-liquid level detector 163b are mounted so as to be respectively adjustable in height at the base portion relative to the tank stand 165. The high-liquid level detector 163a and the low-liquid level detector 163b have a pair of plate-shaped arms 163c, 163c which extend toward the respective liquid level peep holes 162, 162 of the tank main body 161. The pair of the plate-shaped arms 163c, 163c have on one end thereof a light emitting element 163d which faces one of the liquid level peep holes 162 and on the other end thereof a light receiving element 163e which faces the other of the liquid level peep holes 162. In other words, a transmission type of liquid level sensor is constituted by the light emitting element 163d and the light receiving element 163e.

On an upstream side of the supply pipe 169 which is connected to the liquid supply tank 126, there is interposed a gate valve 154 (see FIGS. 43 and 46). The gate valve 154 is controlled to be opened and closed by an upper limit level detector 163a and a lower limit level detector 163b and is adjusted so that the liquid level in the liquid supply tank 126 always lies between the upper limit level and the lower limit level. The liquid supply tank 126 is freed from the pressure on the side of the pressurizing tank 149 by the venting to the atmosphere. Therefore, the liquid material is supplied to the function liquid droplet ejection heads 7 by a slight head pressure (e.g., 25 mm±0.5 mm) to be controlled by the adjustment in the above-described liquid level. According to this arrangement, the liquid droplet can be ejected at a high accuracy by the pumping operation of the function liquid droplet ejection heads 7, i.e., by the pumping drive of a piezoelectric element inside the pimp part 64. The running of the liquid from the ejection nozzles 68 of the function liquid droplet ejection heads 7 can thus be prevented.

As shown in FIG. 43, six liquid supply passages 158 from the liquid supply tank 126 are branched respectively into two, i.e., a total of twelve, branch passages 158b through respective T-shaped couplings 158a. Each of these branch passages 158b is connected as the apparatus-side piping material to each of the twelve sockets 492 for the piping joints 49 provided in the head unit 26. In addition, a gate valve 166 is interposed in each of the branch passages 158b. It is so arranged that the gate valves 166 can be temporarily closed as described hereinafter at the liquid filling step.

A description will now be made about the maintenance apparatus 16, in the order of the wiping unit 35, the cleaning unit 34, and the flushing unit 33.

As sown in FIGS. 50 through 55, the wiping unit 35 is made up of a rolling unit 171 (see FIGS. 50 through 52) which is independently constituted, and a wipe-out unit 172 (see FIGS. 53 through 55), both of which are disposed on the common base 124 in an abutting positional relationship. The rolling unit 171 is disposed on this side of the common base 124 and the wipe-out unit 172 is disposed on the other (inner) side of the common base 124, i.e., on the side of the cleaning unit 34.

The wiping unit 35 of this embodiment has the following arrangement. Namely, while moving (traveling) a wiping sheet 182 (to be described hereinafter) relative to the head unit 26 which is held stationary right above the cleaning unit 34, i.e., in the cleaning position, the wiping unit 35 is moved by the moving table 123 in the X-axis direction, to thereby wipe out the function liquid droplet ejection heads 7. For this purpose, the wiping unit 35 is arranged to be rolled out of the rolling unit 171 to move around the wipe-out unit 172 for wiping operation and is rolled into the rolling unit 171.

Figure 50:
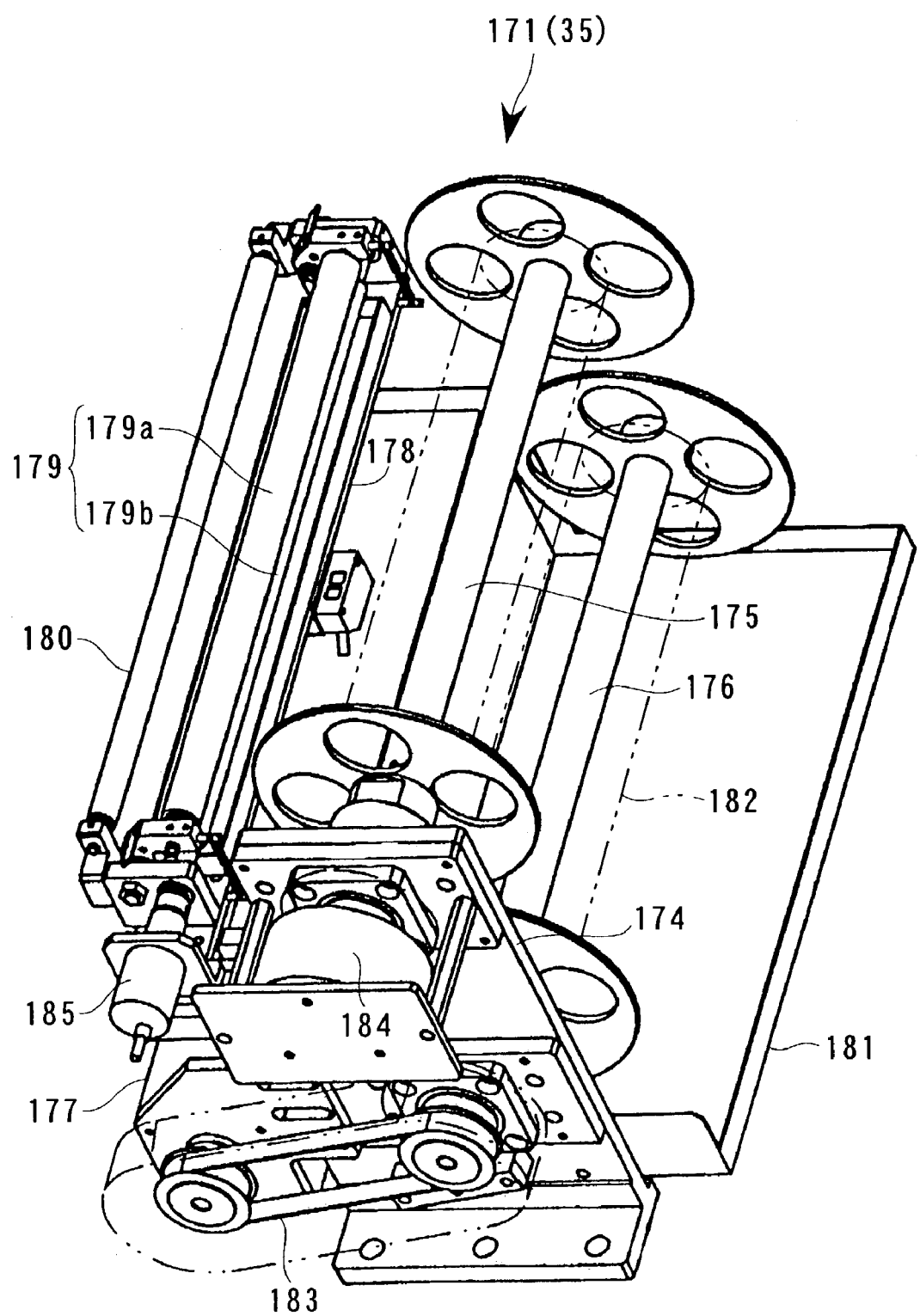
FIG. 50 is a perspective view of a rolling unit in a wiping unit according to this invention.
Figure 51:
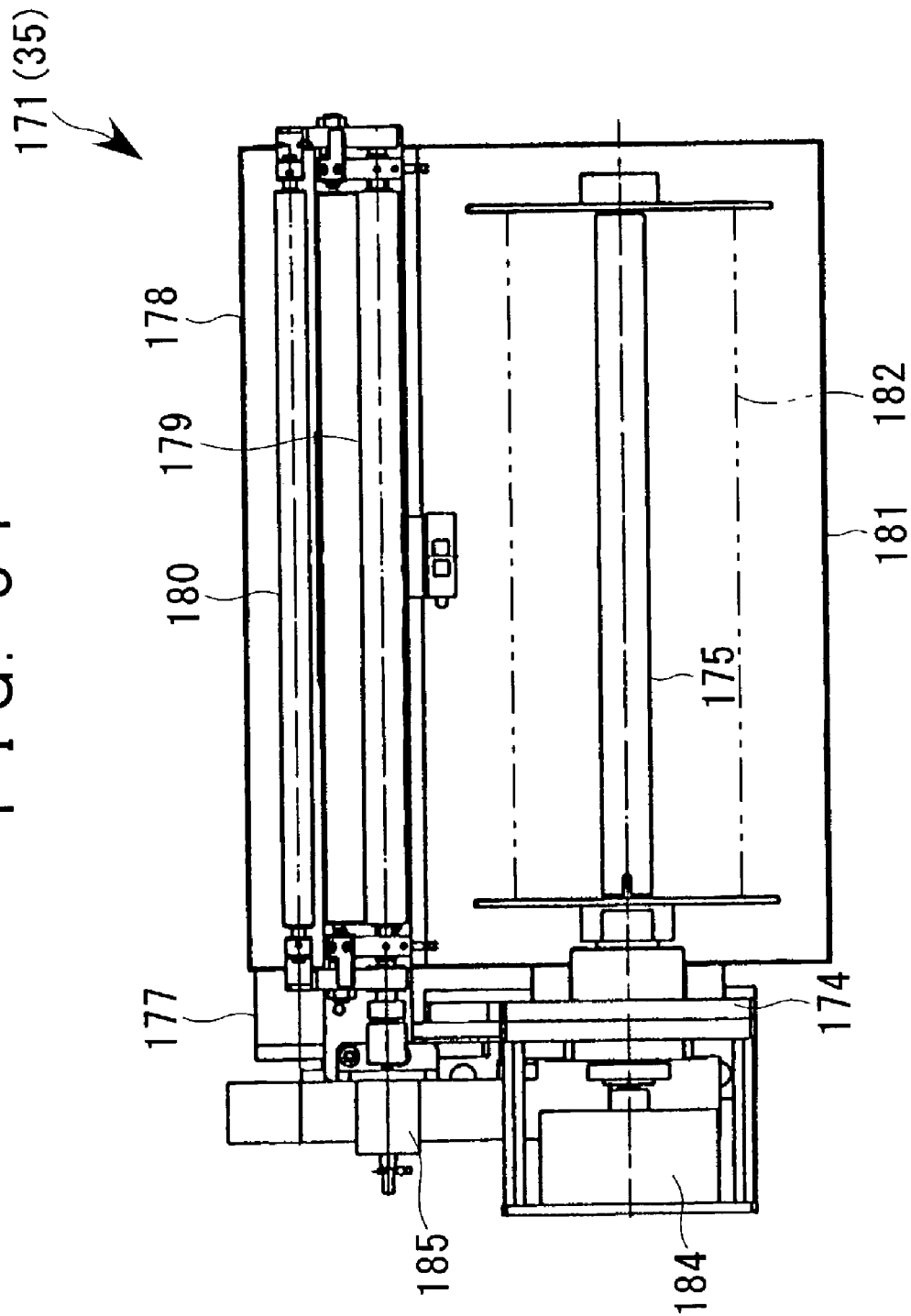
FIG. 51 is a plan view of the rolling unit in the wiping unit according to this invention.
Figure 52:
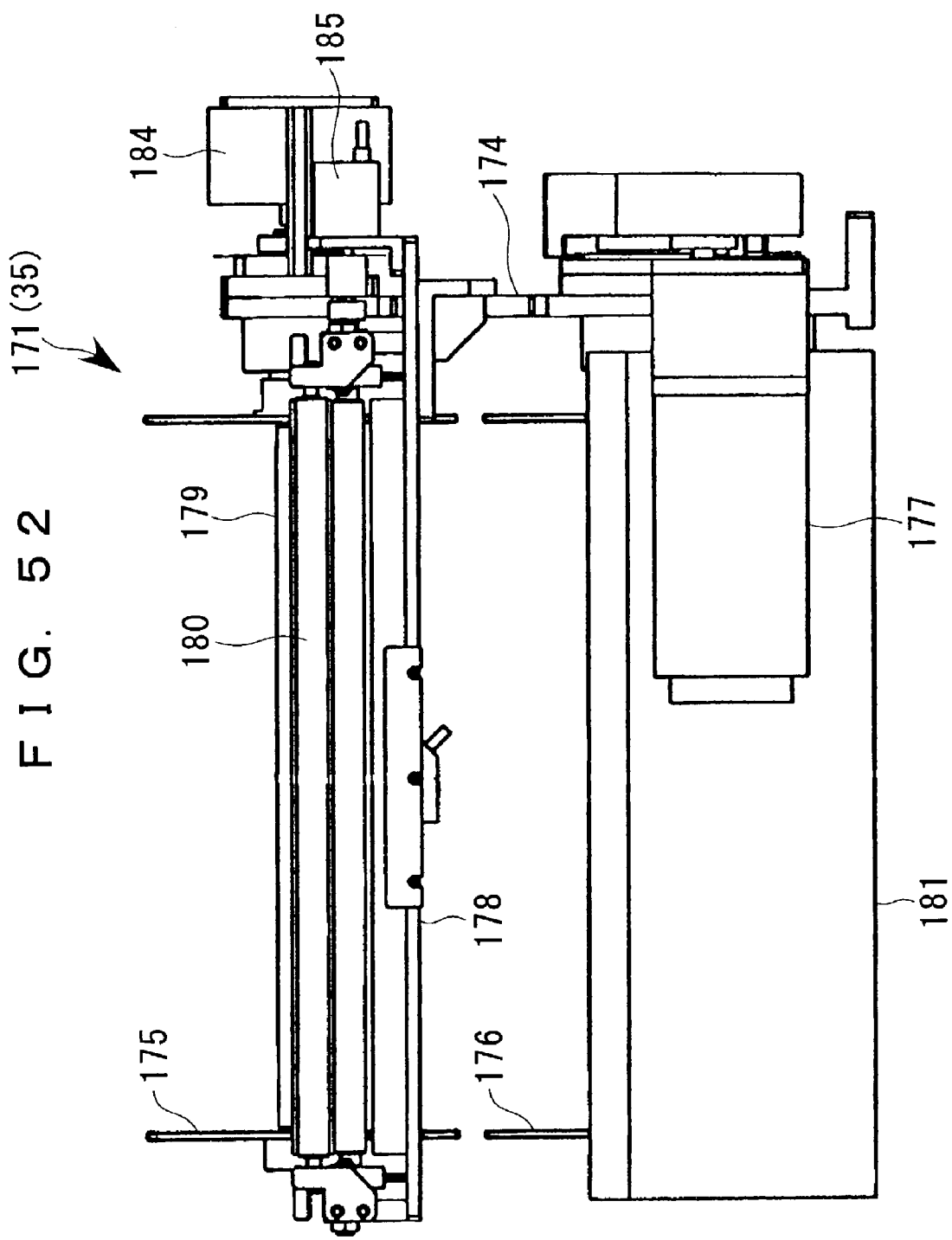
FIG. 52 is a front view of the rolling unit in the wiping unit according to this invention.

As shown in FIGS. 50 through 52, the rolling unit 171 is made up of: a frame 174 of a cantilever type; an upper feeding reel 175 which is rotatably supported on the frame 174; and a takeup motor 177 which rotates a takeup reel 176 for the purpose of taking up. The frame 174 has a sub-frame 178 which is fixed to an upper side portion thereof. This sub-frame 178 has supported thereon a speed detecting roller 179 and an intermediate roller 180 so as to be positioned on a front end of the feeding reel 175 in a manner supported on both sides. On a lower side of these constituent parts, there is disposed a cleaning liquid pan 181 for receiving therein the cleaning liquid.

The feeding reel 175 has inserted therethrough a wiping sheet 182 of a rolled shape. The wiping sheet 182 rolled (or fed) out of the feeding reel 175 is fed to the wiping unit 172 through a speed detecting roller 179 and an intermediate roller 180. Between the takeup reel 176 and the takeup motor, there is extended a timing belt 183. The takeup reel takes up the wiping sheet 182 by the rotation of the takeup motor 177.

Though details are given hereinafter, the wiping unit 172 is also provided with a motor (wiping motor 194) which feeds the wiping sheet 182. The feeding reel 175 is rotated while being braked so as to act against the wiping motor 194. The speed detecting roller 179 is a grip roller which is made up of an upper and a lower, i.e., two, freely rotatable rollers 179a, 179b and controls the takeup motor 177 by means of a speed detector 185 which is provided thereon. In other words, the feeding reel 175 feeds out the wiping sheet 182 in a state of being stretched, and the takeup reel 176 rolls up such that the wiping sheet 182 does not slacken.

Figure 53:
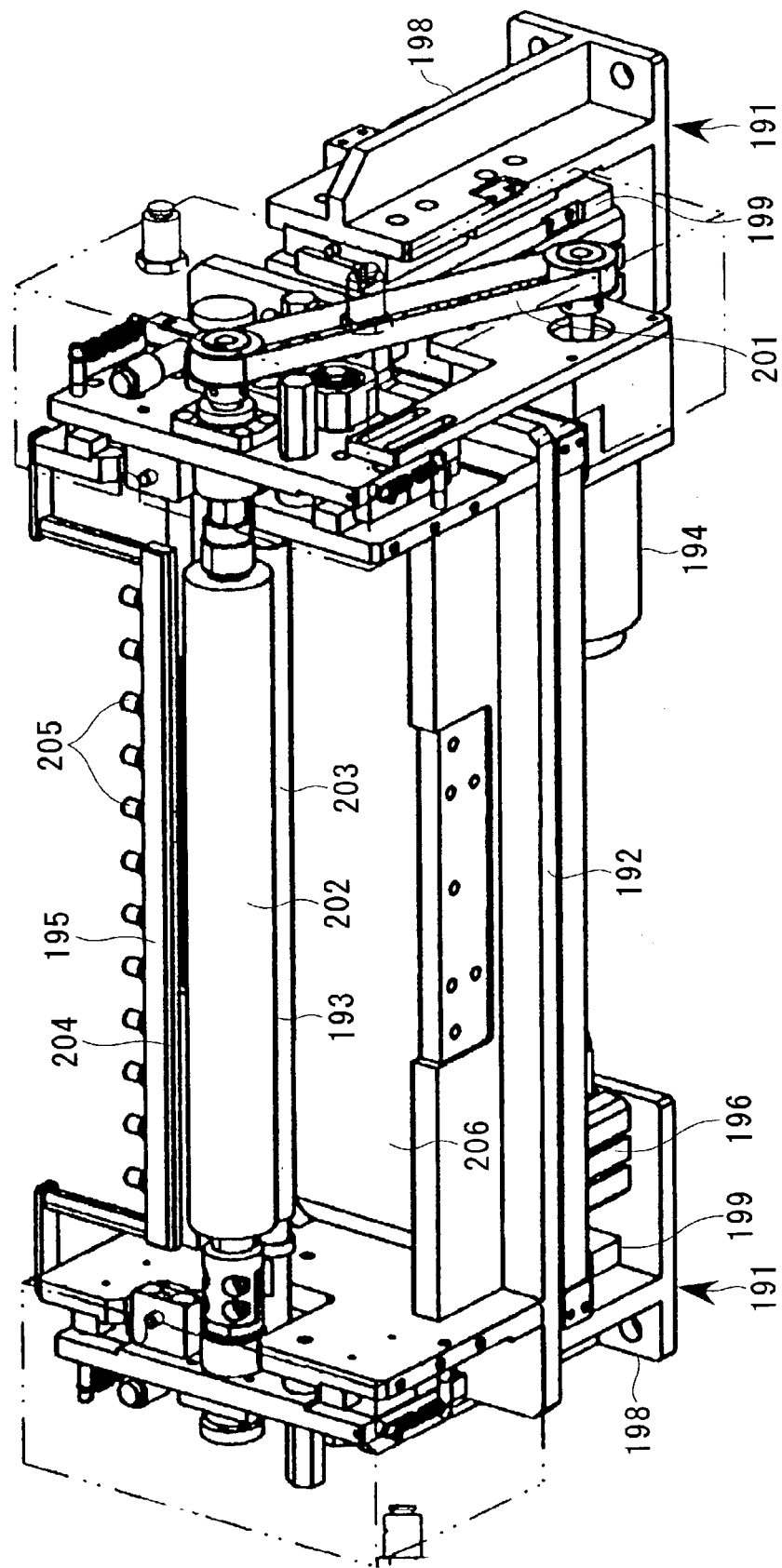
FIG. 53 is a perspective view of a wipe-out unit in the wiping unit according to this invention.
Figure 54:
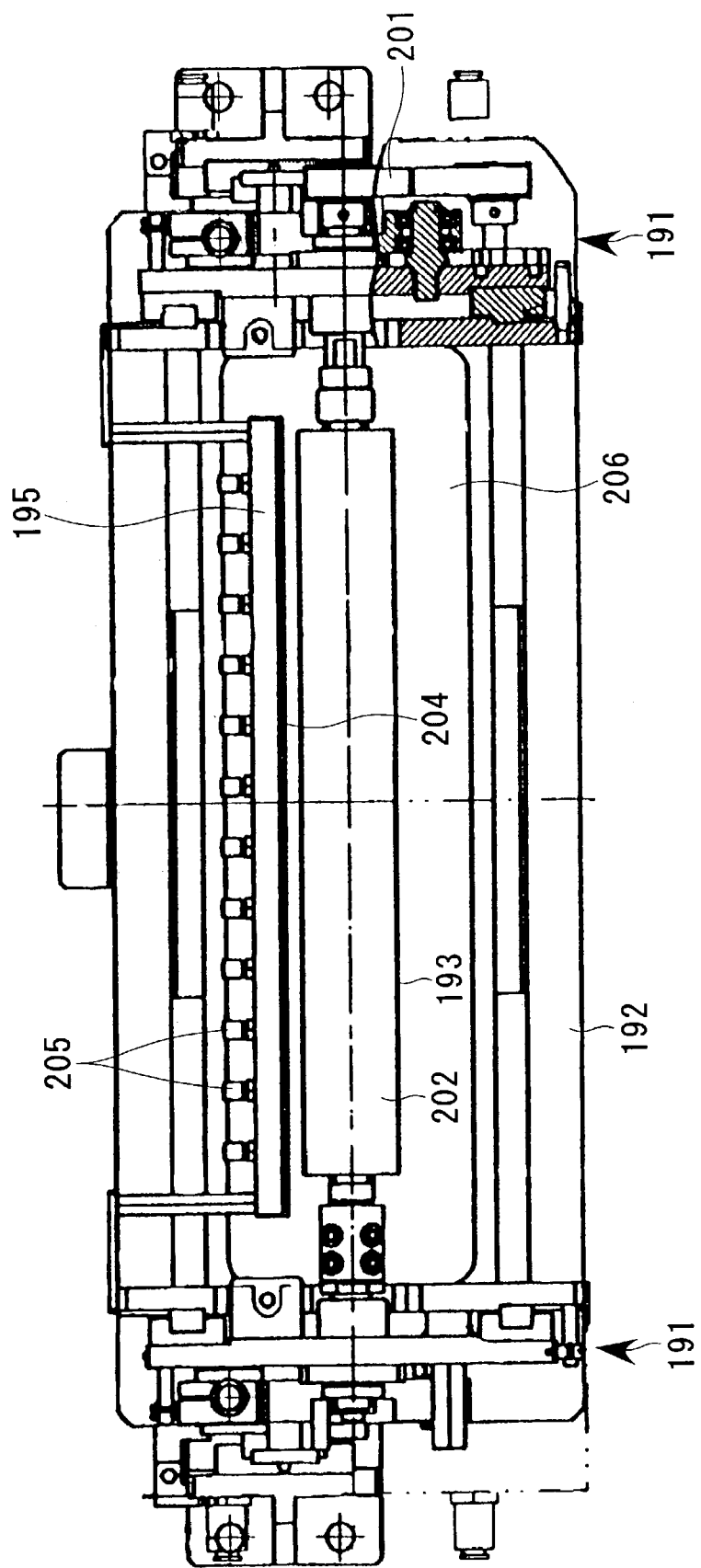
FIG. 54 is a plan view of the wipe-out unit in the wiping unit according to this invention.
Figure 55:
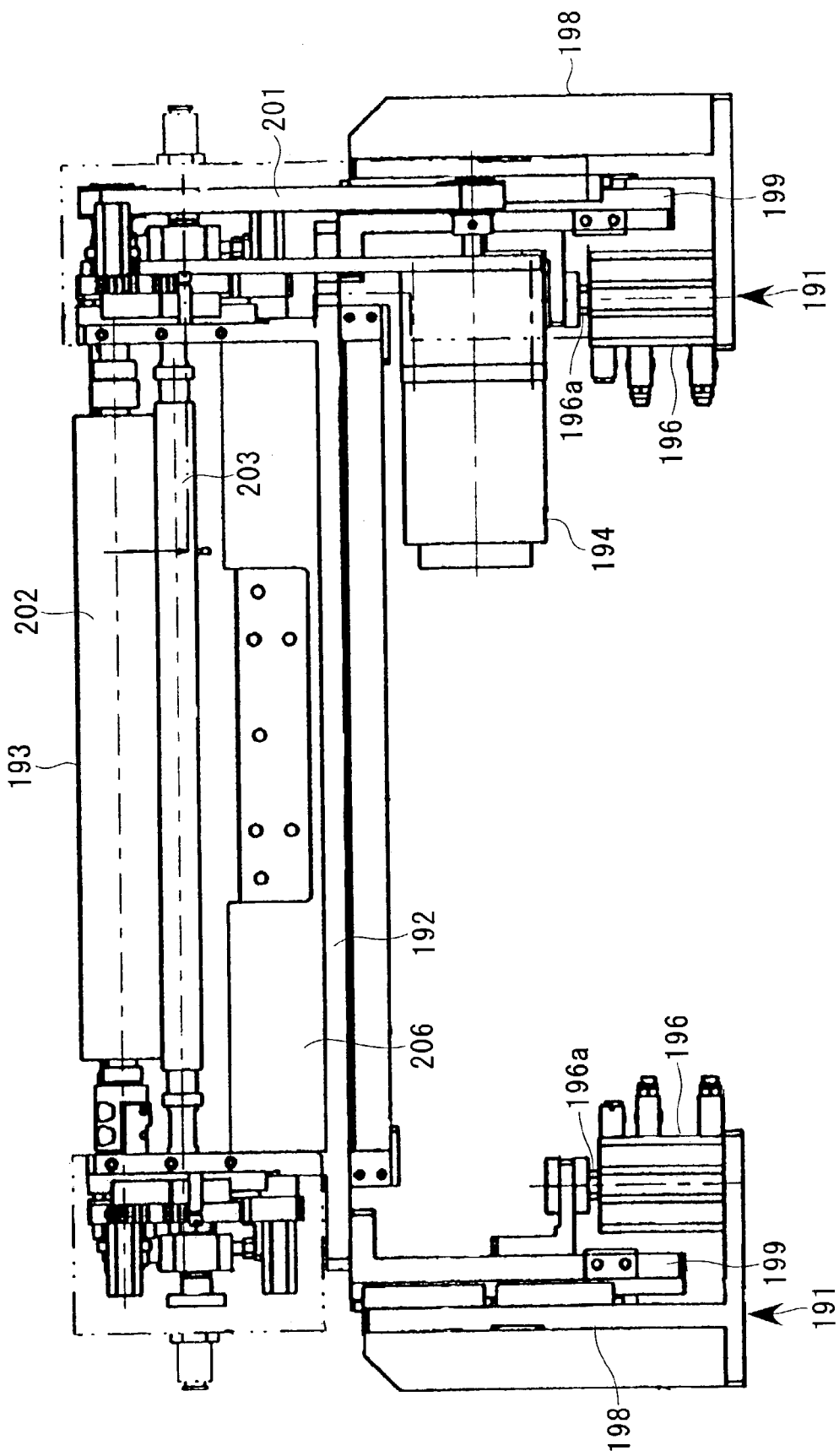
FIG. 55 is a front view of the wipe-out unit in the wiping unit according to this invention.

As shown in FIGS. 53 through 55, the wiping unit 172 is made up of: a pair of left and right stands 191, 191; a base frame 192 which is substantially U-shaped in cross section and is supported by the pair of stands 191, 191; a wiping roller 193 which is rotatably supported by the base frame 192 on both sides thereof; a wiping motor 194 which rotates the wiping roller 193; a cleaning liquid spaying head 195 which lies in parallel with the wiping roller 193; and a pair of double-acting type of air cylinders 196, 196 which move the base frame 192 up and down.

The pair of stands 191, 191 are made up of stationary stands which are positioned respectively outside, and movable stands 199 which are attached to the inside of the stationary stands 198 in a manner slidable up and down. At the base portion of each of the stationary stands 198, there are vertically disposed the above-described air cylinders 196. A plunger 196a of each of the air cylinders 196 is fixed to the movable stand 199. By means of the pair of air cylinders 196, 196 which are driven at the same time, the base frame 192 and the wiping roller 193, the wiping motor 194, or the like, that are supported on the base frame 192 are moved up and down.

The wiping roller 193 is constituted by a grip roller made up of a driving roller 202 which is coupled to the wiping motor 194 through a timing belt 201, and a driven roller 203 which comes into contact with the driving roller 202 with the wiping sheet 182 sandwiched therebetween. The driving roller 202 is constituted by a rubber roller around which is wound a rubber having resiliency or flexibility, e.g., at the core portion. The wiping sheet to be wound therearound is urged toward the nozzle forming surface 67 of the function liquid droplet ejection heads 7.

The cleaning liquid atomizing head 195 lies close to the wiping roller 193 (driving roller 202) and sprays the wiping sheet 182, to be fed from the intermediate roller 180, with the cleaning liquid which is constituted by a solvent, or the like, of the function liquid. For this purpose, the front surface of the cleaning liquid atomizing head 195, i.e., the side of the wiping roller 193, is laterally provided with a plurality of atomizing nozzles 204 to suit the width of the wiping sheet 182. The back surface of the cleaning liquid atomizing head 195 is provided with a plurality of connectors 205 for connection of the pipes which are in communication with the cleaning tank 147.

The wiping sheet 182 which has been sprayed with the cleaning liquid is impregnated with the cleaning liquid and is arranged to face the function liquid droplet ejection heads 7 to wipe them out. Below the wiping roller 193, a cleaning liquid pan is also provided in the base frame 192 so that, together with the cleaning liquid pan 181 of the rolling unit 171, the cleaning liquid to be dropping from the wiping sheet 182 is received therein.

Figure 56A:
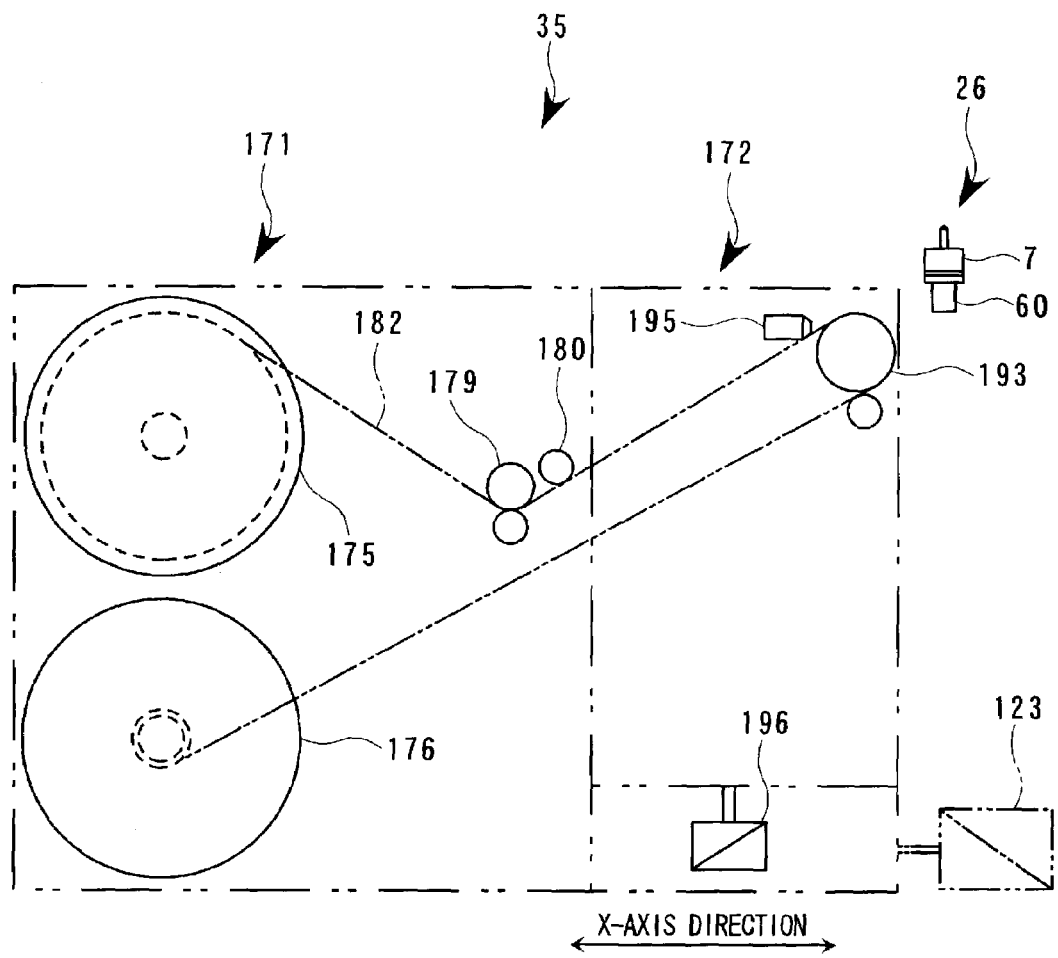
FIG. 56 is a schematic diagram showing the operation of the wiping unit according to this invention.
Figure 56B:
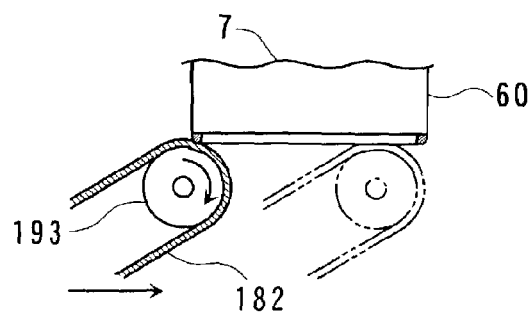
Figure 57:
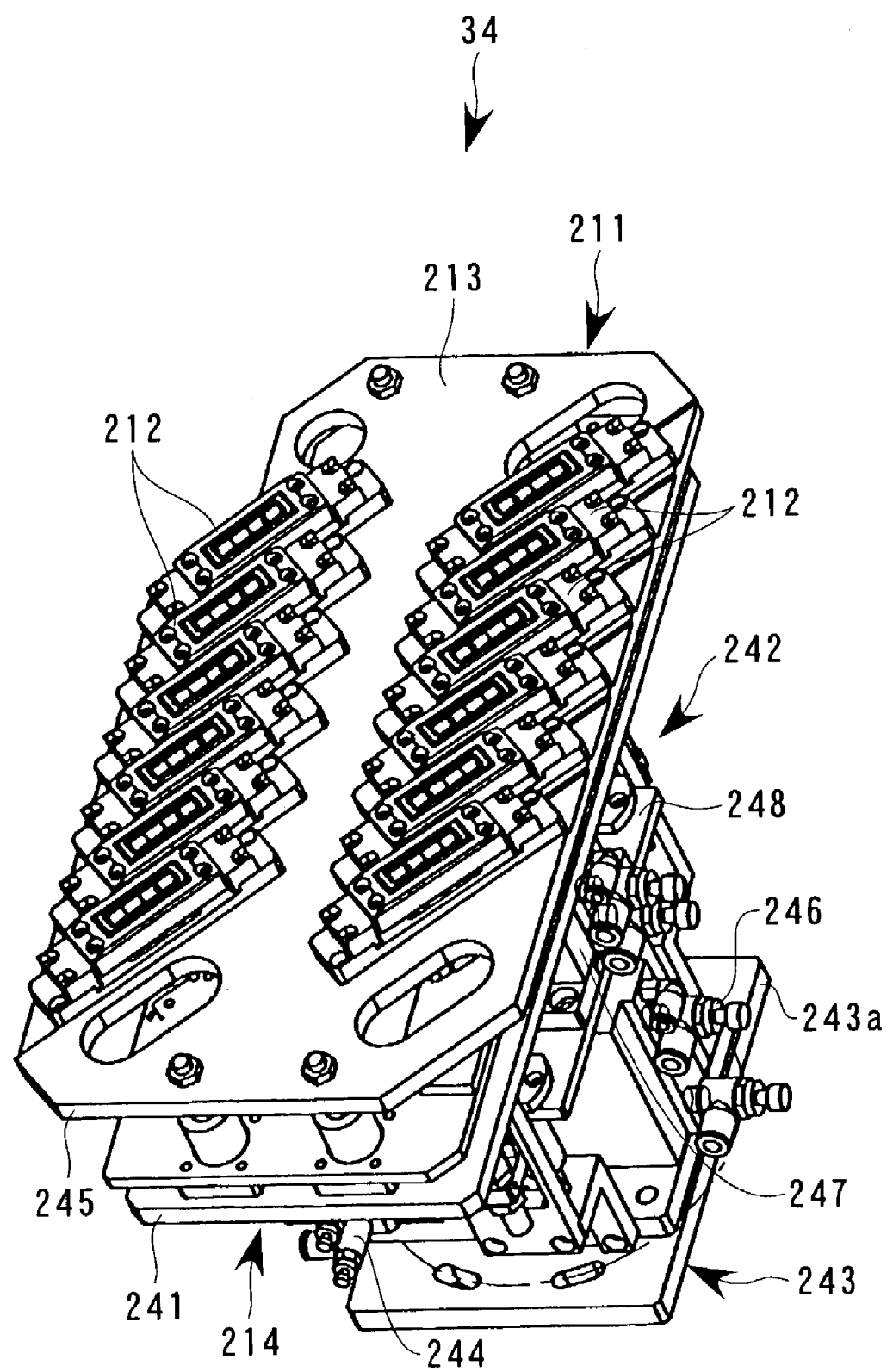
FIG. 57 is a outside perspective view of a cleaning unit according to this invention.
Figure 58:
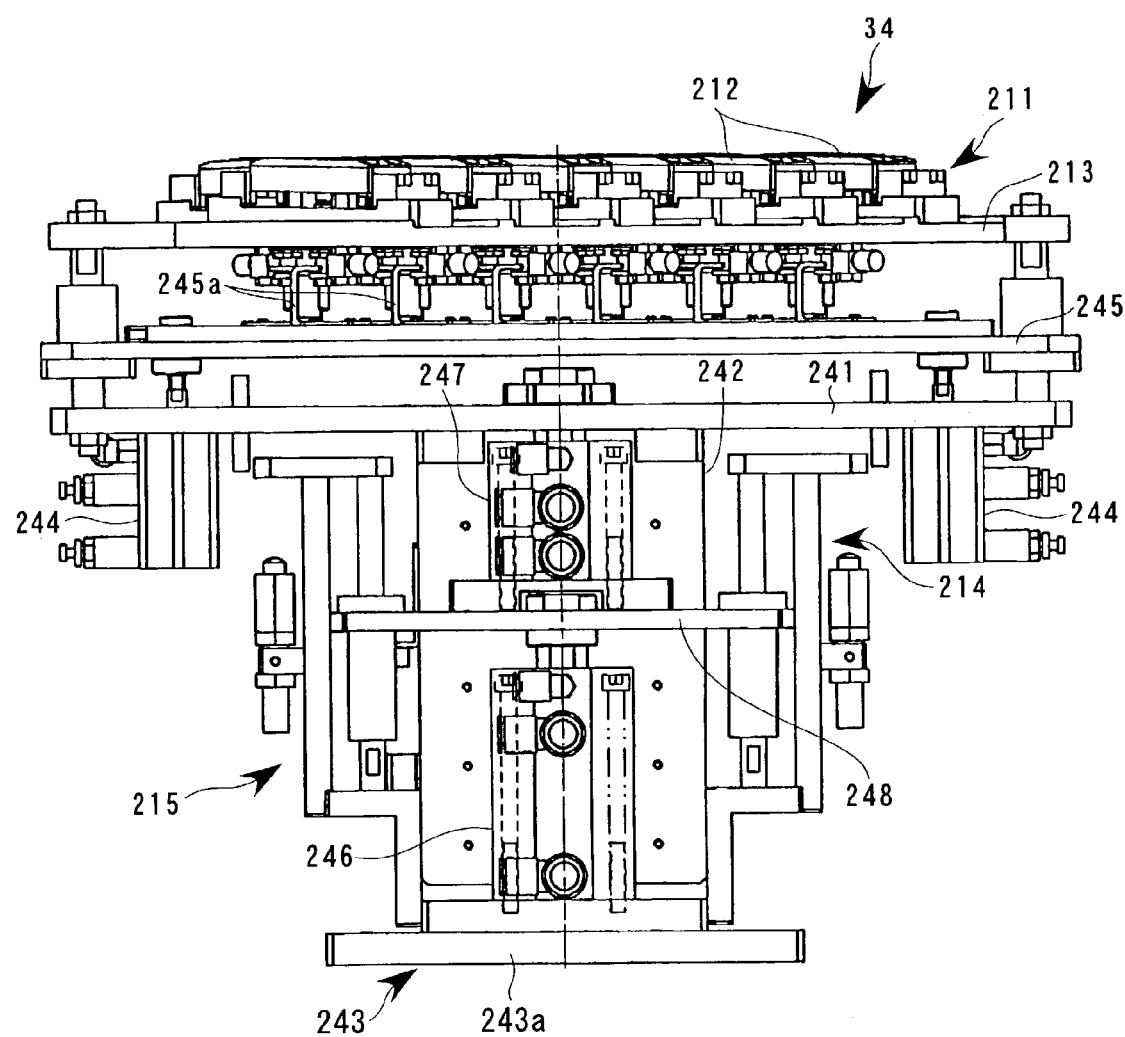
FIG. 58 is a front view of the cleaning unit according to this invention.
Figure 59:
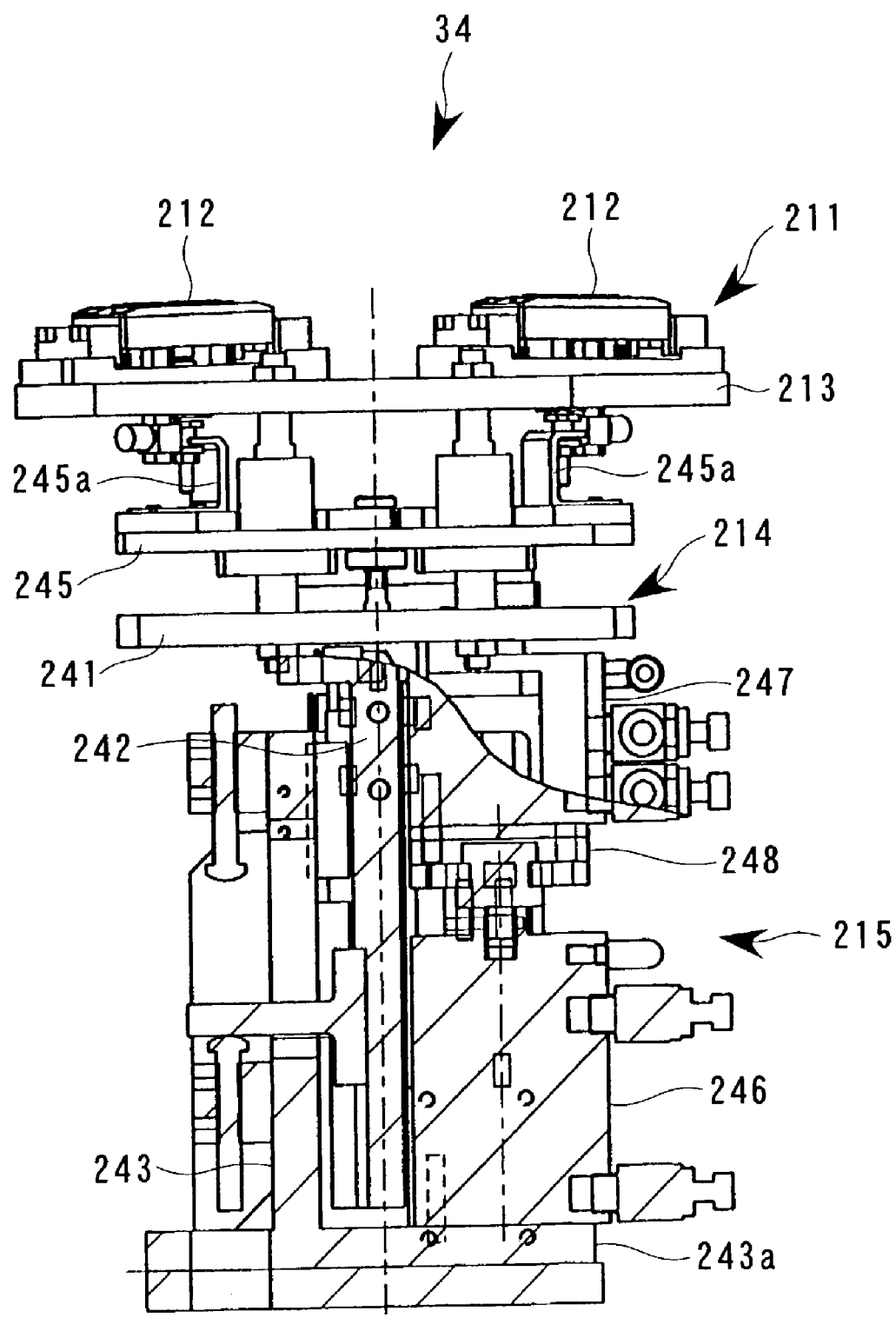
FIG. 59 is a side view of the cleaning unit according to this invention.
Figure 60:
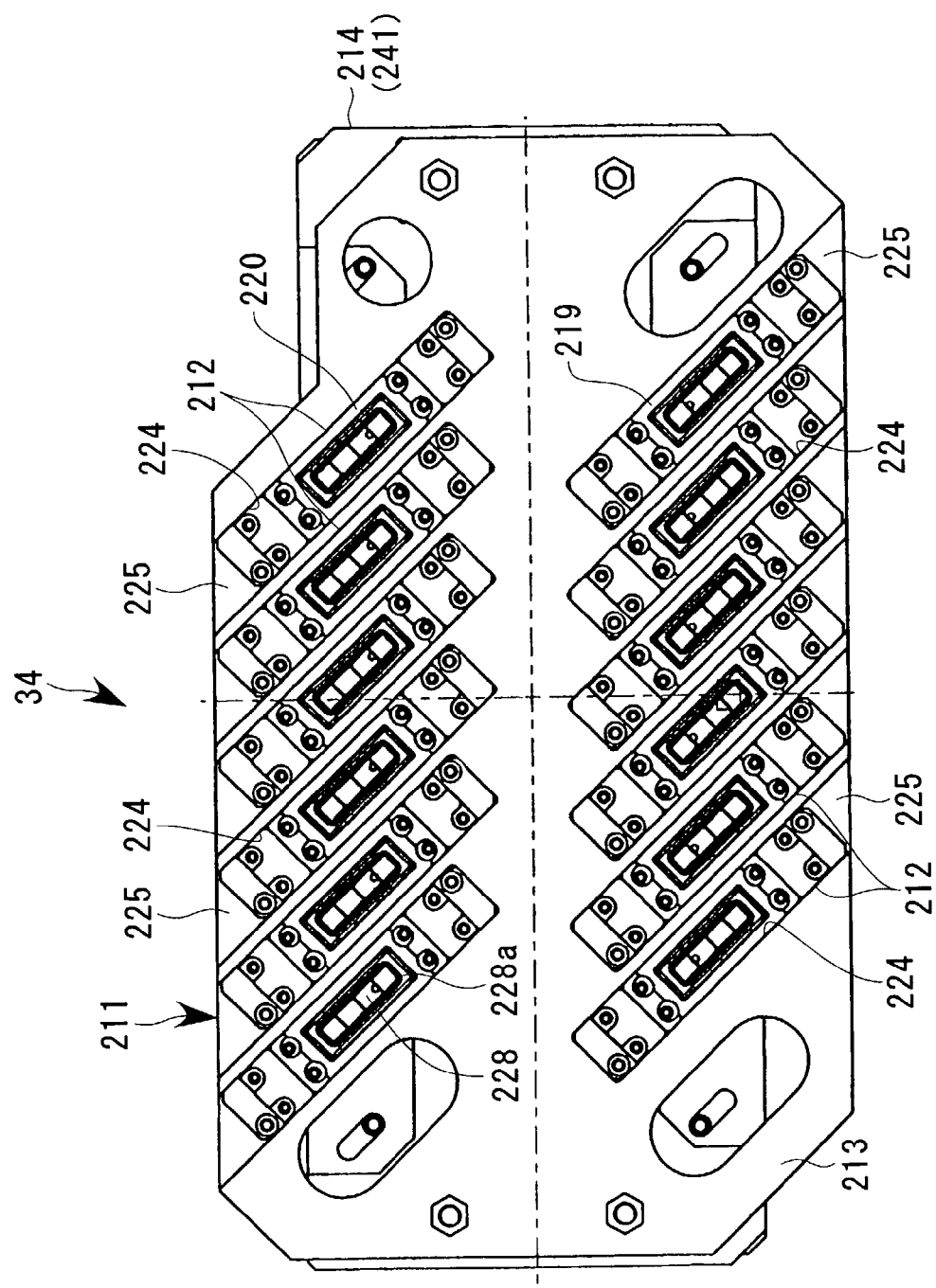
FIG. 60 is a plan view of the cleaning unit according to this invention.

With reference to the schematic diagram in FIG. 56, a brief description will now be made about a series of wiping operations. Once the cleaning of the head unit 26 has been finished, the moving table 123 is driven, and the wiping unit 35 is moved forward to thereby make it close enough to the head unit 26. Once the wiping roller 193 has moved to the neighborhood of the function liquid droplet ejection heads 7, the moving table 123 is stopped. The air cylinders 196, 196 are driven to move upward the wiping roller 193 so as to urge or bring it into contact with the function liquid droplet ejection heads 7.

Then, the takeup motor 177 and the wiping motor 194 are driven to thereby feed the wiping sheet 182 for wiping operation, and the atomizing of the cleaning liquid is started. At the same time, the moving table 123 is moved once again. While feeding the wiping sheet 182, the wiping roller 193 is advanced so that the lower surface of the plurality of the function liquid droplet ejection heads 7 can be wiped. Once the wiping operation has been finished, the feeding of the wiping sheet 182 is stopped and the wiping roller 193 is lowered, and the wiping unit 35 is returned to the original position by the moving table 123.

With reference to FIGS. 57 through 60, a description will now be made about the cleaning unit 34. The cleaning unit 34 is made up of: a cap unit 211 in which twelve caps 212 corresponding to the twelve function liquid droplet ejection heads 7 are disposed in a cap base 213; a supporting member 214 which supports the cap unit 211; and an elevating mechanism 215 which moves up and down the cap unit 211 through the supporting member 214.

As shown in FIG. 43, a suction passage (pipe) 216 which is communicated with the reusing tank 148 with a suction pump 153 interposed therein is branched into twelve branch passages 216b through a header pipe 216a and each of these branch passages 216b is connected to each of the caps 212. Each of the branch passages 216b is provided with a liquid sensor 217, a pressure sensor 218, and a gate valve 219 as seen from the side of the caps 212.

Figure 61:
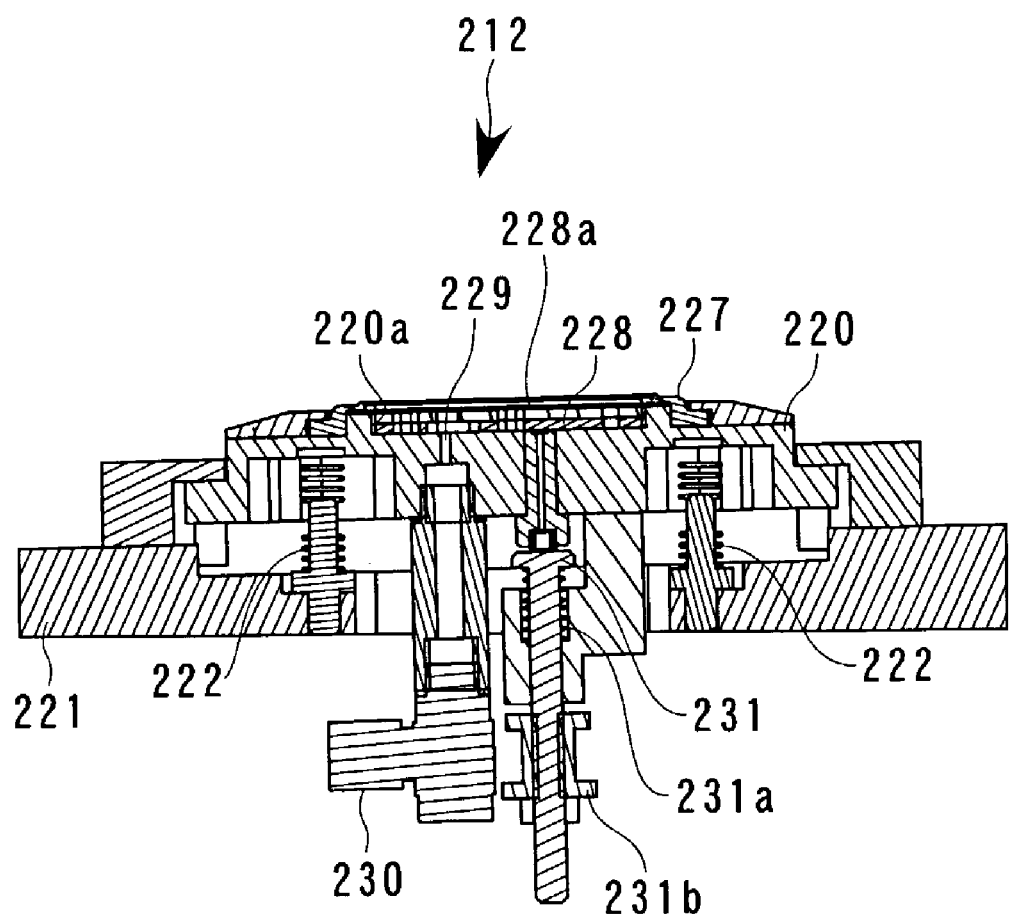
FIG. 61 is an enlarged sectional view of a cap of the cleaning unit according to this invention.

Twelve caps 212 are fixed to the cap base 213 in the same array and in the same inclination as those of the twelve function liquid droplet ejection heads 7. As shown in FIG. 61, each of the caps 212 is made up of a cap main body 220 and a cap holder 221. The cap main body 220 is held by the cap holder 220 in a state of being urged upward by two springs 222, 222 and is also slightly movable up and down. The cap base 213 has formed therein twelve mounting openings 224 corresponding to the twelve caps 212, and has formed therein twelve shallow grooves 225 in a manner to enclose the mounting openings 224. Each of the caps 212 is screwed to the portions of the shallow grooves 225 in a state in which the lower part thereof is inserted into the mounting opening 224 and in which the cap holder 221 is set in position in the shallow groove 225 (see FIG. 60).

On an upper surface of each of the cap main bodies 220, there is formed a recessed portion 220a which encloses the two rows of nozzle arrays of the liquid droplet ejection heads 7. Around the perimeter of the recessed portion 220a there is attached a sealing packing 227, and an absorbent member 228 is laid down on the bottom part by means of a stay frame 228a. On the bottom part of the recessed portion 220 there is formed a small hole 229. This small hole 229 is in communication with an L-shaped coupling 230 which is connected to each of the branch passages 216b. When the liquid material is sucked, the sealing packing 227 is urged against the nozzle forming surface 67 of the function liquid droplet ejection heads 7 to thereby seal the nozzle forming surface 67 in a manner to enclose the two rows of the ejection nozzle groups.

Each of the caps 212 is further provided with an open air vent valve 231 which opens the recessed portion 220a to the atmosphere on the bottom side thereof. The open air vent valve 231 is urged toward the upper closing side by means of a spring 231a. At the final stage of suction operation of the liquid, the open air vent valve 231 is pulled open, whereby the liquid material that has been impregnated into the absorbent member 228 can be sucked. In the figure, reference numeral 231b denotes an operating part of the open air vent valve 231.

The supporting member 214 is provided with a supporting member main body 242 which has a supporting plate 241 for supporting the cap unit 211 on an upper end thereof, and a stand 243 which supports the supporting member main body 242 in a manner movable up and down. To the lower surface on longitudinal both sides of the supporting plate 241, there are fixed a pair of air cylinders 244, 244. There is provided an operating plate 245 which is moved up and down by the pair of air cylinders 244, 244. On the operating plate 245 there is mounted a hook 245a which is engaged with the operating part 231b of the open air vent valve 231. In this manner, the open air vent valve 232 is opened or closed by the pair of air cylinders 244, 244 through the operating plate 245.

The lifting mechanism 215 is made up of a lower lifting cylinder 246 which is vertically provided on the base part 243a of the stand 243, and an upper lifting cylinder 247 which is vertically provided on the plate 248 to be moved up and down by the cylinder 246. The piston rod of the upper lifting cylinder 247 is connected to the supporting plate 241. The strokes of both the lifting cylinders 246, 247 are different from each other. As a result, by selecting one of the lifting cylinders 246, 147, the lifting position of the cap unit 211 can be switched between a relatively high first position and a relatively low second position.

The cap unit 211 has the following arrangement to prevent the function liquid droplet ejection heads 7 from coming into contact with the caps 212 when the head unit 26 is moved to a cleaning position which faces right above the cap unit 211. The arrangement is that the cap unit 211 is in a standby state at the lower end position which is set so as to keep a clearance of several millimeters (mm) between the sealing packing 227 of the caps 212 and the nozzle forming surface 67 of the function liquid droplet ejection heads 7. As a result of upward movement to the first position, the sealing packing 227 of the caps 212 is caused to be in intimate contact with the nozzle forming surface 67 of the function liquid droplet ejection heads 7. At the second position, a small clearance (e.g., about 0.5 mm) is secured between the sealing packing 227 of the caps 212 and the nozzle forming surface 67 of the function liquid droplet ejection heads 7. In this embodiment, an arrangement is made that the cap unit 211 is moved upward to the first position by the lower lifting cylinder 246 and to the second position by the upper lifting cylinder 247. It may, however, be so arranged that the upward movements to the first position and to the second position are carried out by the cylinders that are opposite to the above-described ones.

The cleaning unit 34 thus constituted is moved by the moving table 123 into a position in which it crosses the moving locus in the Y-axis direction of the head unit 26. The head unit 26, on the other hand, is moved by the Y-axis table 24 to a cleaning position which faces right above the cleaning unit 34 (cap unit 211). Then, by the operation of the lower lifting cylinder 246 of the lifting mechanism 215, the cap unit 211 moves upward to the first position so that the twelve caps 212 are urged from the lower side toward the twelve function liquid droplet ejection heads 7 of the head unit 26. In each of the caps 212 which has been urged toward each of the function liquid droplet ejection heads 7, the cap main body 220 slightly sinks against the two own springs 222, 222. As a result, the sealing packing 227 of the cap main body 220 is brought into intimate contact with the nozzle forming surface 67 of the function liquid droplet ejection heads 7.

Subsequently, the suction pump 153 is driven and the gate valve 219 which is interposed in each of the suction branch passages 216b is opened to thereby suck the liquid material from all of the nozzles 68 of each of the function liquid droplet ejection heads 7 through each of the caps 212. Then, the open air vent valve 231 is opened right before the completion of the suction operation, and the gate valve 219 is thereafter closed to complete the suction operation. Once the suction operation has been finished, the cap unit 211 is lowered to the lower end position. During the suction operation, monitoring is made to see whether the poor suction (or suction failure) has occurred or not to each of the caps 212 based on a signal from the pressure sensor 218 which is disposed in each of the suction branch passages 216b. During the safe keeping (or holding for stand by), or the like, of the heads while the apparatus operation is stopped, the cap unit 211 is lifted to the first position to thereby seal each of the caps 212 with each of the function liquid droplet ejection heads 7, whereby a safe keeping state is secured.

Figure 62:
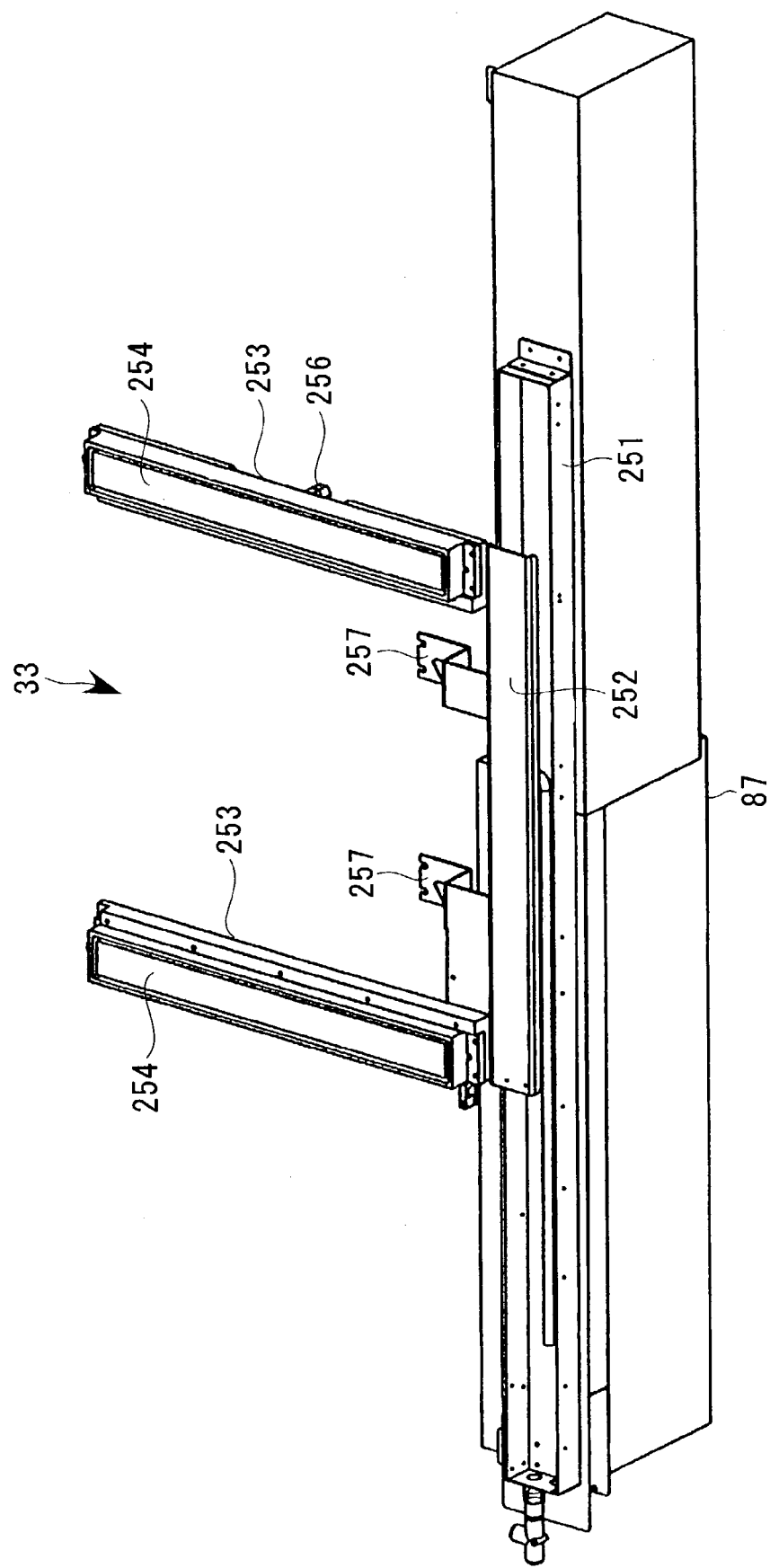
FIG. 62 is a perspective view of a flushing unit according to this invention.
Figure 63:
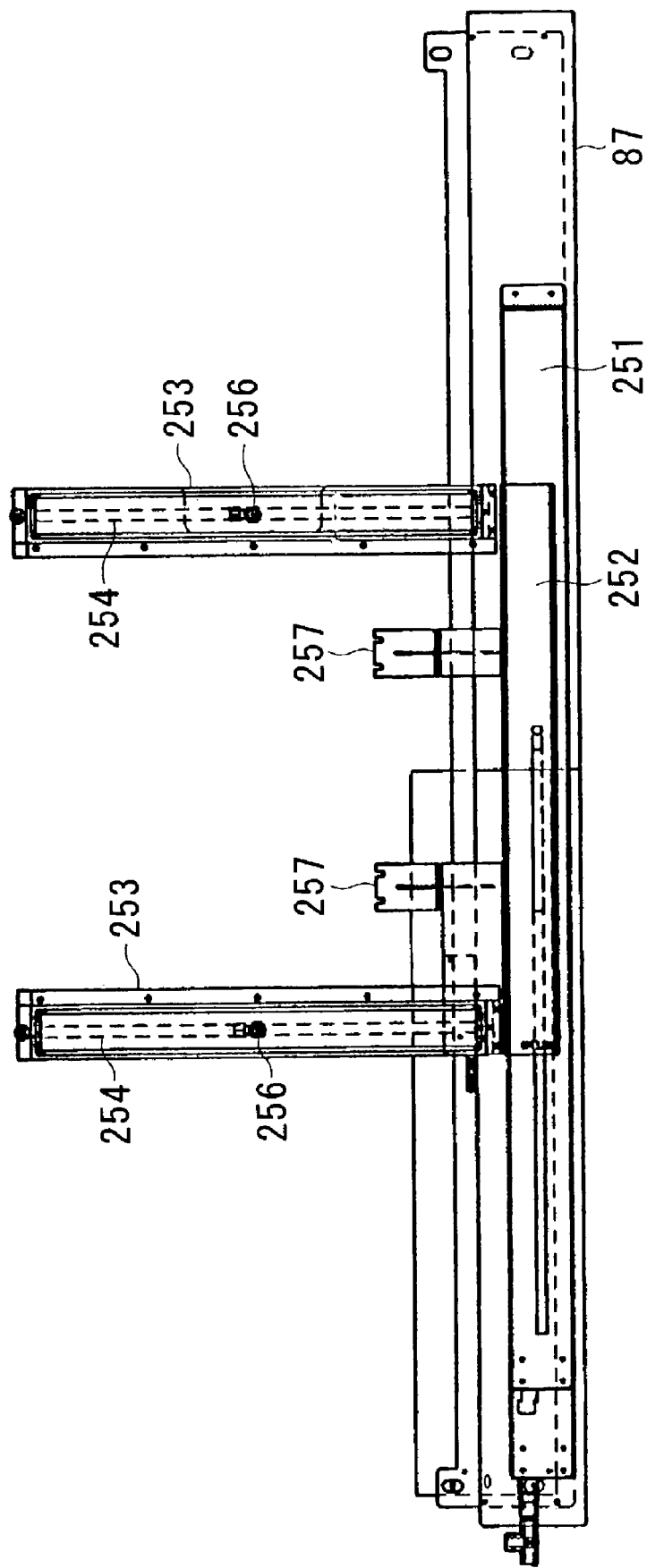
FIG. 63 is a plan view of the flushing unit according to this invention.

First, with reference to FIGS. 62 and 63, a description will be made about the flushing unit 33. This flushing unit 33 is disposed on the box 88 of the X-axis flexible cable bundler 87 (see FIG. 30). The flushing unit 33 is made up of: a slide base 251 which is fixed to the X-axis flexible cable bundler 87; a long plate-shaped slider 252 which is provided in a retractable manner on the slide base 251; a pair of flushing boxes 253, 253 which are fixed to both end portions of the slider 252; and a pair of function liquid absorbing materials 254, 254 which are laid out inside each of the flushing boxes 253.

The pair of the flushing boxes 253, 253 have widths corresponding to each of the function liquid droplet ejection head groups 7a of the head unit 26 and have lengths corresponding to the movable range in the direction of sub-scanning of each of the function liquid droplet ejection head groups 7a, thereby being formed in an elongated shape. These pair of flushing boxes 253, 253 extend at right angles from the slider 252 to the upper side of the X-axis table 23 and are disposed in a manner to sandwich the suction table 81. At the central bottom surface of each of the flushing boxes 253, 253 there is attached a drain coupling 256 which constitutes a drain port. The drain pipe (not illustrated) which is connected to this drain coupling 256 is connected to the waste liquid tank 150 through the X-axis flexible cable bundler 87.

The slider 252 has fixed thereto a pair of mounting pieces 257, 257 of the X-axis table 23. The mounting pieces 257, 257 are positioned between the pair of flushing boxes 253, 253 and extend toward the Θ-axis table 82. The front end portions of these pair of mounting pieces 257, 257 are fixed to the base portion of the Θ-axis table 82. In other words, the pair of the flushing boxes 253, 253 are arranged to be movable together with the Θ-axis table 82 through the slide base 251.

In the flushing unit 33 as constructed above, when the flushing unit 33 moves forward together with the Θ-axis table 82 as shown in FIG. 30, the right side flushing box 253 as shown therein passes first under the head unit 26. At this time, the plurality of (twelve) function liquid droplet ejection heads 7 carry out flushing operation in sequence, and the head unit 26 transfers to the ordinary liquid droplet ejection operation. Similarly, when the flushing unit 33 moves forward, the left side flushing box 253 first passes right under the head. At this time, the plurality of function liquid droplet ejection heads 7 carry out flushing operation, and the head unit 26 transfers to the ordinary liquid droplet ejection operation. In this manner, the flushing operation is appropriately carried out while the head unit 26 moves back and forth for the main scanning. Therefore, the head unit 26, or the like, does not move exclusively for the purpose of the flushing operation, and the flushing thus does not influence the tact time.

When the ejection of the droplet is suspended for a certain period of time, e.g., when the substrate W is carried into, or taken out of, the ejection apparatus 1, the flushing must be carried out. Therefore, when the ejection is held in abeyance for a certain period of time, the head unit 26 is moved to the cleaning position which faces right above the cap unit 211 to thereby carry out the flushing from each of the function liquid droplet ejection heads 7 to each of the caps 212. In this case, when the cap unit 211 is present in the lower end position, part of the ejected liquid from the function liquid droplet ejection heads 7 will be spread outside in a misty state through the clearance between the function liquid droplet ejection heads 7 and the caps 212. As a solution, the cap unit 211 is moved upward to the second position by the upper lifting cylinder 247, whereby the flushing is carried out in this state.

According to this arrangement, the clearance between the function liquid droplet ejection heads 7 and the caps 21 becomes slight (or small), whereby the outward running or splashing of the liquid ejected from the function liquid droplet ejection heads 7 can be prevented. In this case, if the suction force from the suction pump 153 is kept to be operated on the caps 212, the outward slashing of the ejected liquid can be more effectively prevented. It is considered to carry out the flushing operation while the caps 212 are kept in close contact with the nozzle forming surface 67 of the function liquid droplet ejection heads 7. However, if the caps 212 are brought into intimate contact with the nozzle forming surface 67, the nozzle forming surface 67 gets stained. This idea is, however, not practical because it becomes necessary to carry out the wiping of the nozzle forming surface 67 after the flushing work.

When a new head unit 26 has been introduced into the ejection unit 1, the flow passages inside the heads of the function liquid droplet ejection heads 7 are empty. Therefore, it is necessary, before starting the ejection work of the liquid droplet, to fill the flow passages inside the heads with the liquid material. In this case, since the supply of the liquid material from the liquid supply tank 126 is carried out only by the slight or small head pressure, suction becomes necessary to fill the flow passages inside the heads with the liquid material. Therefore, in filling the liquid droplet, the following operations are carried out. Namely, the head unit 26 is moved to the cleaning position. The cap unit 211 is lifted to the first position to thereby bring each of the caps 212 into intimate contact with the nozzle forming surface 67 of each of the function liquid droplet ejection heads 7. The liquid material inside the liquid supply tank 126 is then caused to be filled into the flow passage inside the head of each of the function liquid droplet ejection heads 7 by means of that suction force from the suction pump 153 which is operated through each of the caps 212. However, even if the suction operation is carried out by the caps 212, the flow speed of the liquid in the flow passages inside the heads lowers and, consequently, the air bubbles cannot successfully be removed out of the flow passages inside the heads. This will cause poor ejection, or failure in ejection, of the liquid droplet from the flow passages inside the heads. Particularly, the air bubbles are likely to stay in the filter 62$a$ which is disposed at the bottom of the connection needles 62 of the function liquid droplet ejection heads 7.

As a solution, in this embodiment, the gate valve 166 is interposed in each of the branch passages 158$b$ for liquid supply, and the liquid sensor 217 is disposed in each of the branch passages 216$b$ for suction as described hereinabove. After starting the liquid filling (or charging), the liquid material is sucked up to the caps 212 and, once this state has been detected by the liquid sensor 217, the gate valves 166 are temporarily closed while continuing the suction by the caps 212. According to this operation, the pressure in the flow passages inside the heads is reduced during the closing of the gate valves 166. With the subsequent opening of the gate valves 166, the liquid material flows suddenly so that the flow speed of the liquid material in the flow passages inside the heads increases, with the result that the air bubbles are efficiently discharged out of the flow passages inside the heads. According to experiments, the flow speed of about 100 mm/sec. before closing the gate valves has sharply increased to 200–2000 mm/sec. when the gate valves 166 are opened after temporarily closing them.

The higher the rate of filling the liquid into the flow passages inside the heads is before closing the gate valves 166, the more efficiently the pressure inside the flow passages inside the heads can be reduced. When the liquid material has reached the liquid sensor 217, the flow passages inside the heads are substantially completely filled with the liquid material. By using the liquid sensors 217, the timing of closing the gate valves 166 can adequately be automatically controlled. In addition, by providing each of the branch passages 158$b$, 216$b$ for liquid supply and for liquid suction, respectively, with the gate valve 166 and the liquid sensor 217, the gate valves 166 can be separately or independently closed at a suitable timing for each of the liquid function droplet ejection heads 7 even if fluctuations occur in the initial ratio of liquid filling into the respective function liquid droplet ejection heads 7.

Figure 64:
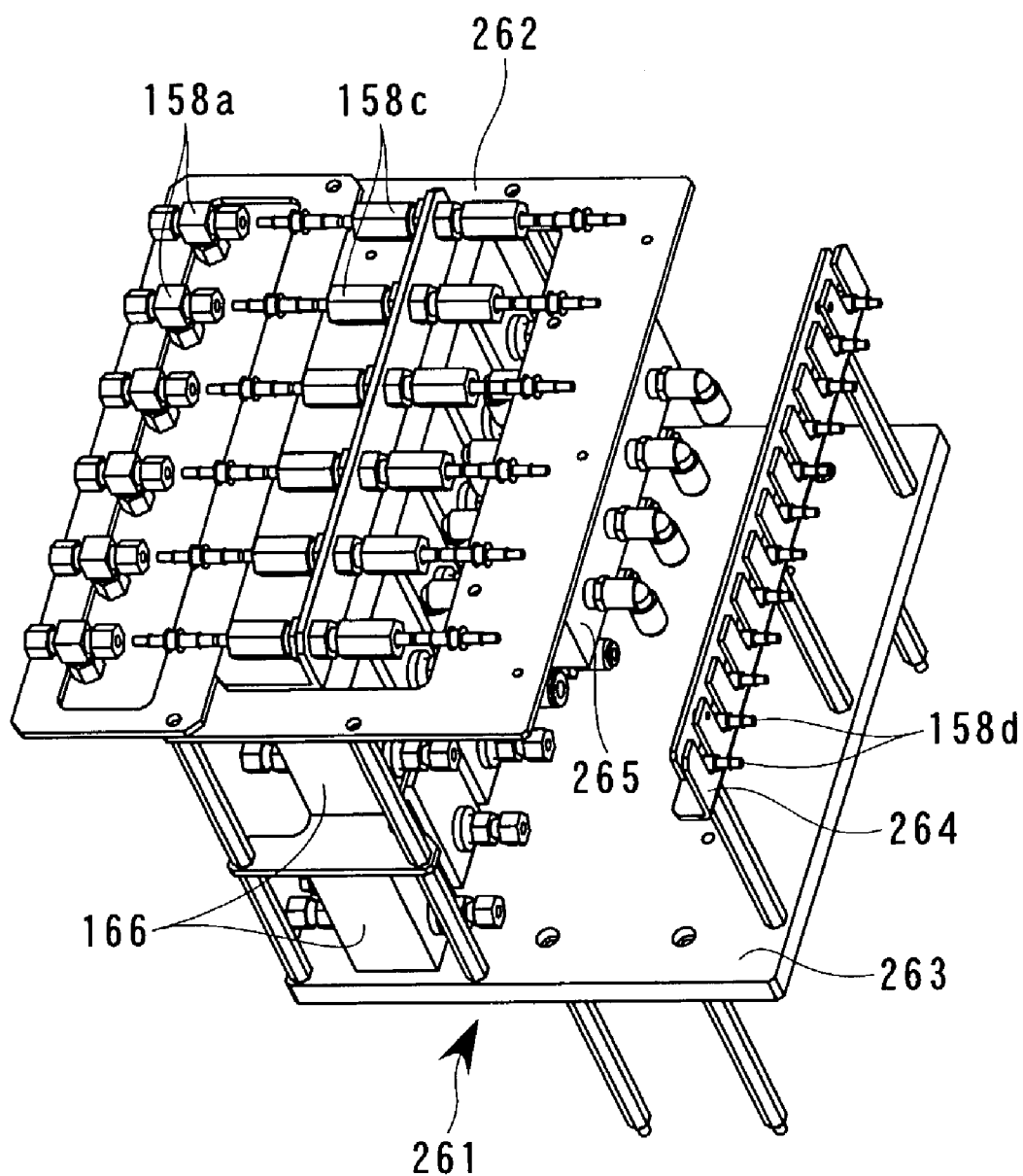
FIG. 64 is a perspective view of a portion disposing gate valves in liquid supply passages according to this invention.
Figure 65:
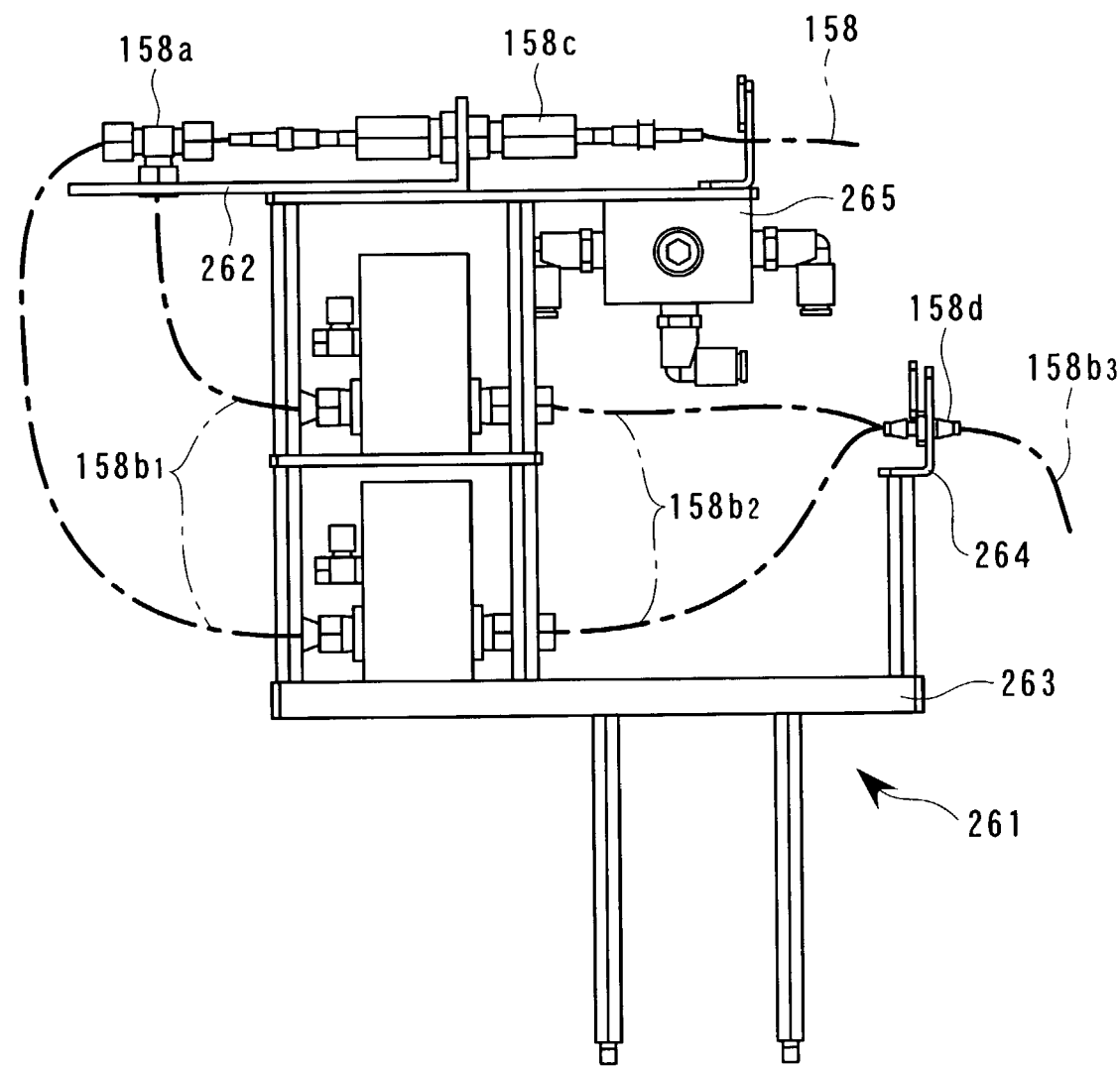
FIG. 65 is a side view of the portion disposing the gate valves in liquid supply passages according to this invention

The smaller the length of the flow passages between the gate valves 166 and the function liquid droplet ejection heads 7, the higher the efficiency of pressure reduction after the valve closing, and the smaller the amount of liquid consumption at the time of filling. Here, if the gate valves 166 are mounted on a portion which moves integrally with the main carriage 25, there is no need of securing slacking for the purpose of following the movement of the head unit 26 to be held on the main carriage 25, the slacking being provided in the passage portion between the gate valves 166 and the function liquid droplet ejection heads 7. This shortens the length of the flow passages. Therefore, in this embodiment, the gate valves 166 are mounted on the bridge plate 91 which suspends the main carriage 25. Details are shown in FIGS. 64 and 65. Twelve gate valves 166 are mounted, six each, on two stages of the upper stage and the lower stage on a stand 261 which is fixed to the bridge plate 91.

Six T-shaped couplings 158$a$ and six grounding couplings 158$c$ are disposed on an upper plate 262 of the stand 261 which covers the place of mounting the gate valves 166. Six liquid supply passages (tubes) 158 which are in communication with the liquid supply tank 126 are connected to the inwardly faced connecting ports of the T-shaped couplings 158$a$ respectively through the grounding couplings 158$c$. Upstream portions 158$b_1$ of these six branch passages 158$b$ which are connected to the downwardly faced connecting ports of the T-shaped couplings 158$a$ are connected to inlet ports 166$a$ of the upper-stage six gate valves 166. Upstream portions 158$b_1$ of the remaining six branch passages 158$b$ which are connected to the outwardly faced connecting ports of the T-shaped couplings 158$a$ are connected to inlet ports of the lower-stage six gate valves 166.

Twelve pipe couplings 158$d$ are disposed on a lower plate 263 of the stand 261 through brackets 264. Intermediate portions 158$b_2$ of the twelve branch passages 158$b$ which are connected to the discharge ports of the total of twelve upper-stage and lower-stage gate valves are respectively connected to one end of the pipe couplings 158$d$. Downstream portions 158$b_3$ of the branch passages 158$b$ which are the apparatus-side piping material to be connected to the sockets 492 of the piping joint 49 in the head unit 26 are connected to the other end of the piping joints 158$d$. The stand 261 is provided with a manifold 265 for supplying the head unit 26 with the liquid without passing through the gate valve 166.

A description has so far been made about the apparatus for manufacturing an organic EL device. This invention can also be applied to the ejection apparatus which is used for manufacturing other products such as color filters for the liquid crystal display device, or the like, to be manufactured by a liquid droplet ejection method.

For example, in the method of manufacturing a color filter for a liquid crystal display device, filter materials of red color (R), green color (G) and blue color (B) are introduced into a plurality of function liquid droplet ejection heads 7, a plurality of function liquid droplet ejection heads 7 are operated for the main scanning and subsidiary scanning, and the filter materials are selectively ejected, to thereby form a multiplicity of filter elements on a substrate. In addition, an overcoat layer may be formed in a manner similar to the above in order to coat the multiplicity of filter elements.

Similarly, the function liquid droplet ejection apparatus 10 of this embodiment may also be applied to the method of manufacturing an electron emission device, the method of manufacturing a PDP device, the method of manufacturing an electrophoretic display device, or the like.

In the method of manufacturing an electron emission device, fluorescent materials of red color (R), green color (G) and blue color (B) are introduced into a plurality of function liquid droplet ejection heads 7, a plurality of function liquid droplet ejection heads 7 are operated for the main scanning and subsidiary scanning, and the fluorescent materials are selectively ejected, to thereby form a multiplicity of fluorescent members on an electrode. The electron emission device is a generic term to include the idea of field emission display (FED) device.

In the method of manufacturing a PDP device, fluorescent materials of red color (R), green color (G) and blue color (B) are introduced into a plurality of function liquid droplet ejection heads 7, a plurality of function liquid droplet ejection heads 7 are operated for the main scanning and subsidiary scanning, and the fluorescent materials are selectively ejected, to thereby form fluorescent members in a multiplicity of recessed portions on a substrate.

In the method of manufacturing an electrophoretic display device, materials for electrophoretic members of respective colors are introduced into a plurality of function liquid droplet ejection heads 7, a plurality of function liquid droplet ejection heads 7 are operated for the main scanning and subsidiary scanning, and the ink materials are selectively ejected, to thereby form electrophoretic members in a multiplicity of recessed portions on an electrode. The electrophoretic members which are made of electrically charged particles and pigments are preferably enclosed in microcapsules.

The function liquid droplet ejection apparatus 10 of this embodiment, on the other hand, can be applied to the method of forming a spacer, the method of forming a metallic wiring, the method of forming a lens, a method of forming a resist and a method of forming a light diffusion member, or the like.

In the method of forming a spacer, a multiplicity of particulate spacers are formed to constitute a minute cell gap between two substrates. Materials which are made by dispersing the particulate materials to constitute the spacers in a liquid and are formulated into a liquid state are introduced into a plurality of function liquid droplet ejection heads 7, the function liquid droplet ejection heads 7 are operated for main scanning and subsidiary scanning, and the particulate materials are selectively ejected to thereby form spacers on at least one of the substrates. This method is also useful in constituting cell gaps between two substrates in the above-described liquid crystal display device and electrophoretic display device. It can also be applied to the method of manufacturing a semiconductor which requires this kind of minute gaps.

In the method of forming metallic wiring, a liquid metallic material is introduced into a plurality of function liquid droplet ejection heads 7, the plurality of function liquid droplet ejection heads 7 are operated for main scanning and subsidiary scanning, and the liquid metallic wiring material is selectively ejected onto the substrate. For example, this method can be applied, e.g., to the metallic wiring to connect a driver and each of the electrodes in the above-described liquid crystal display device, and to the metallic wiring to connect thin film transistors (TFT) and each of the electrodes in the above-described organic EL device. It can also be applied to the art of manufacturing ordinary semiconductors aside from this kind of flat display devices, or the like.

In the method of forming a lens, a lens material is introduced into a plurality of function liquid droplet ejection head 7, the plurality of function liquid droplet ejection heads 7 are operated for main scanning and subsidiary scanning, and the lens material is selectively ejected to thereby form a multiplicity of microlenses on a transparent substrate. For example, it can be applied as a device for beam focusing in the above-described FED device. In addition, it can also be applicable to various kinds of optical devices.

In the method of forming a resist, a resist material is introduced into a plurality of function liquid droplet ejection heads 7, the plurality of function liquid droplet ejection heads 7 are operated for main scanning and subsidiary scanning, and the resist material is selectively ejected to thereby form a resist of an arbitrary shape on a substrate. For example, the method can be widely applied to the forming of banks in the above-described various display devices, as well as to the coating of photoresist in the photolithography which constitutes the main part of the semiconductor manufacturing art.

In the method of forming an light diffusion member, a multiplicity of light diffusion members are formed on a substrate, in which a light diffusion material is introduced into a plurality of function liquid droplet ejection heads 7, the plurality of function liquid droplet ejection heads 7 are operated for main scanning and subsidiary scanning, and the light diffusion material is selectively ejected to thereby form a multiplicity of light diffusion members. This method is also applicable to various kinds of optical devices.

As described hereinabove, according to the method of filling the liquid into the function liquid droplet ejection head and the ejection apparatus, the flow speed of the liquid at the time of filling (or charging) the liquid into the function liquid droplet ejection head can be increased. As a result, the air bubbles can be efficiently removed out of the fluid passage inside the function liquid droplet ejection head and the number of suction at the time of filling the liquid can be minimized. The work efficiency can thus be improved and the workability can be improved.

On the other hand, according to the various kinds of manufacturing methods according to this invention such as the method of manufacturing the LCD device, the method of manufacturing the organic EL device, or the like, the initial charging or filling of the function liquid into the function liquid droplet ejection head can be quickly and smoothly carried out, thereby improving the reliability of the manufacturing methods.

What is claimed is:

1. A method of filling a liquid into a flow passage inside a function liquid droplet ejection head having an ejection nozzle formed in a nozzle forming surface of a head main body, comprising:
   bringing a cap connected to a suction pump into intimate contact with said nozzle forming surface; and
   filling a liquid of a liquid supply tank connected to said function liquid ejection head into said flow passage inside said function liquid droplet ejection head, wherein a liquid supply passage between said function liquid droplet ejection head and said liquid supply tank is temporarily closed in a course of filling the liquid into said flow passage inside said function liquid droplet ejection head while maintaining suction by said cap, wherein the liquid inside said liquid supply tank is sucked at least up to said cap, then said liquid supply passage is closed.

2. An ejection apparatus having:
   a carriage which moves relative to a workpiece;
   a function liquid droplet ejection head which is held by said carriage and which is provided with an ejection nozzle formed in a nozzle forming surface of a head main body, said function liquid droplet ejection head ejecting droplets from said ejection nozzle to the workpiece while carrying out a relative movement between said carriage and the workpiece;
   a liquid supply tank which is connected to said function liquid droplet ejection head;
   a cap unit which is disposed in a position away from the workpiece and which is provided, in a position corresponding to said function liquid droplet ejection head, with a cap which is connected to a suction pump and is brought into intimate contact with the nozzle forming surface of said function liquid droplet ejection head, in a state in which said carriage is moved to a position facing said cap unit, so that the liquid of said liquid supply tank is filled into a flow passage inside said function liquid droplet ejection head by a suction force to be operated upon through said cap, said apparatus comprising:
- a gate valve interposed in said liquid supply passage between said function liquid droplet ejection head and said liquid supply tank, wherein said gate valve is temporarily closed in a course of filling the liquid into said flow passage inside said function liquid droplet ejection head while maintaining suction by said cap,
- wherein the liquid inside said liquid supply tank is sucked at least up to said cap, then said liquid supply passage is closed.

3. The apparatus according to claim 2, further comprising a liquid sensor interposed in a suction passage between said cap and said suction pump, wherein the temporary closing of said gate valve is carried out when, after starting the liquid filling into said flow passage inside said function liquid droplet ejection head, the liquid has been detected by said liquid sensor.

4. The apparatus according to claim 3, wherein said carriage further comprises a head unit which is made up of a sub-carriage and a plurality of function liquid droplet ejection heads mounted on said sub-carriage, and wherein said cap is provided in a plurality of numbers to correspond to said plurality of function liquid droplet ejection heads,
- wherein said gate valve is interposed in each of branch passages of said liquid supply passage, each of said branch passages being connected by branching to each of said function liquid droplet ejection heads,
- wherein said liquid sensor is provided in each of said branch passages of said suction passages, each of said suction passages being connected to each of said caps, and
- wherein each of said gate valves is closed when the liquid is detected by each of said liquid sensors.

5. The apparatus according to claim 2, wherein said gate valve is mounted on a portion which moves integrally with said carriage.

* * * * *